US010777613B2

(12) United States Patent
Tsukamoto et al.

(10) Patent No.: US 10,777,613 B2
(45) Date of Patent: Sep. 15, 2020

(54) DISPLAY DEVICE AND MANUFACTURING METHOD THEREFOR

(71) Applicant: Sharp Kabushiki Kaisha, Sakai, Osaka (JP)

(72) Inventors: Yuto Tsukamoto, Sakai (JP); Seiichi Mitsui, Sakai (JP); Shinichi Kawato, Sakai (JP); Satoshi Inoue, Sakai (JP); Yuhki Kobayashi, Sakai (JP); Takashi Ochi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 71 days.

(21) Appl. No.: 16/090,302

(22) PCT Filed: Apr. 7, 2017

(86) PCT No.: PCT/JP2017/014566
§ 371 (c)(1),
(2) Date: Oct. 1, 2018

(87) PCT Pub. No.: WO2017/179514
PCT Pub. Date: Oct. 19, 2017

(65) Prior Publication Data
US 2019/0115398 A1 Apr. 18, 2019

(30) Foreign Application Priority Data
Apr. 14, 2016 (JP) .................. 2016-081434

(51) Int. Cl.
H01L 27/32 (2006.01)
H01L 51/50 (2006.01)
H01L 27/15 (2006.01)
H01L 51/52 (2006.01)

(52) U.S. Cl.
CPC ........ H01L 27/3211 (2013.01); H01L 27/156 (2013.01); H01L 27/322 (2013.01); H01L 27/3213 (2013.01); H01L 27/3246 (2013.01); H01L 27/3276 (2013.01); H01L 51/5012 (2013.01); H01L 51/5044 (2013.01); H01L 51/5056 (2013.01); H01L 51/5265 (2013.01); H01L 2251/558 (2013.01)

(58) Field of Classification Search
CPC .................. H01L 27/156; H01L 27/3213; H01L 27/3246
USPC .......................................... 257/89
See application file for complete search history.

(56) References Cited

U.S. PATENT DOCUMENTS

2015/0311250 A1  10/2015  Seo et al.
2016/0056214 A1  2/2016   Pyo et al.
2017/0005145 A1* 1/2017   Seo .................... H01L 51/5012

FOREIGN PATENT DOCUMENTS

CN  105390521 A  3/2016
JP  2015-216113 A  12/2015

* cited by examiner

Primary Examiner — Long K Tran
(74) Attorney, Agent, or Firm — Keating & Bennett, LLP

(57) ABSTRACT

A blue fluorescent light-emitting layer is provided in common for a subpixel and a subpixel, a green fluorescent light-emitting layer is provided in common for the subpixel and a subpixel, and a red light-emitting layer is provided in common for the subpixel and a subpixel. An opposing surface distance is less than or equal to a Förster radius, and in the subpixel, the green fluorescent light-emitting layer and the red light-emitting layer are layered with a separation layer interposed therebetween.

20 Claims, 28 Drawing Sheets

FIG. 14A  FORSTER TRANSFER
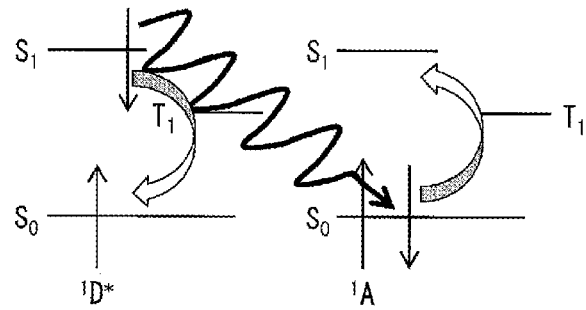
FIG. 14B  DEXTER TRANSFER
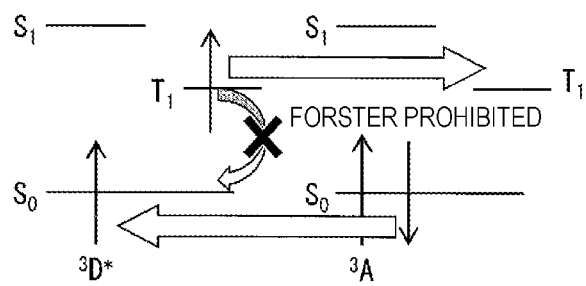
FIG. 14C  REVERSE INTERSYSTEM CROSSING
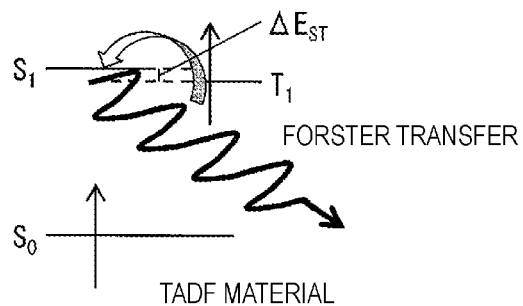

DISPLAY DEVICE AND MANUFACTURING METHOD THEREFOR

TECHNICAL FIELD

The disclosure relates to a display device and to a manufacturing method therefor.

BACKGROUND ART

In recent years, a self-luminous display device using a light emitting element (EL element) employing an electroluminescence (hereinafter referred to as "EL") phenomenon has been developed as a display device instead of a liquid crystal display device.

A display device including an EL element can emit light at low voltages. The EL element is a self-luminous element, and therefore has a wide viewing angle and high viewability. Further, the EL element is a thin film-form completely solid element, and is thus garnering attention from the viewpoint of saving space, portability, and the like.

The EL element has a configuration in which a light-emitting layer containing a luminescent material is interposed between a cathode electrode and an anode electrode. The EL element emits light by using the release of light during the deactivation of excitons that are generated by injecting electrons and holes into the light-emitting layer and causing recombination.

The light-emitting layer of an EL element is mainly formed using vapor deposition techniques, such as vacuum vapor deposition. Techniques for forming a full-color organic EL display device using such vapor deposition can be broadly divided into a white CF (color filter) technique and a separate-patterning technique.

The white CF technique is a technique in which a white light-emitting EL element and a CF layer are combined, and a luminescent color is selected at the subpixel level.

The separate-patterning technique is a technique where separately patterning vapor deposition is carried out for each luminescent color using vapor deposition masks. Generally, subpixels constituted by red (R), green (G), and blue (B) EL elements, arranged on a substrate, are selectively caused to emit light at desired brightnesses using TFTs, and an image is displayed as a result. Banks (partitions) defining light emitting regions in the subpixels are provided between EL elements, and the light-emitting layers of the EL elements are formed in openings of the banks using a vapor deposition mask.

CITATION LIST

Patent Literature

PTL 1: JP 2015-216113 A (published Dec. 3, 2015)

SUMMARY

Technical Problem

The white CF technique has an advantage in that a high-resolution display device can be achieved without requiring a high-resolution vapor deposition mask.

However, with the white CF technique, using a color filter results in energy loss, which is problematic in that a drive voltage is used and more power is consumed. Additionally, this kind of white light-emitting EL element has many layers and requires a color filter, which is a disadvantage in that manufacturing costs are extremely high.

On the other hand, while the separate-patterning technique does provide good light emission efficiency, low voltage driving, and the like, such high-precision patterning is difficult. For example, there is a problem in that colors may bleed to neighboring pixels depending on the precision of the openings in the vapor deposition mask and the distance relationship between the vapor deposition source and the film formed substrate. Furthermore, shadow, where the vapor deposition film ends up thinner than the intended film thickness, can arise depending on the thickness of the vapor deposition mask, the vapor deposition angle, and the like. Thus, with a display device using the separate-patterning technique, there is a problem in that the display quality drops due to color bleeding, shadow, and the like caused by deposited materials infiltrating from the direction of neighboring pixels. Particularly, when another color of dopant is deposited on a neighboring pixel, even if only an extremely small amount of the other color of dopant is deposited, that dopant will, depending on the device structure, have a major influence on the EL light-emission spectrum. This can cause the colors to change.

Thus, to achieve a high-resolution display device using the separate-patterning technique, it is necessary to distance the vapor deposition source from the film formed substrate to achieve an acute vapor deposition angle, which means it is necessary to raise the height of the vacuum chamber to accommodate this distancing.

However, manufacturing a vacuum chamber having a raised height is very expensive, and also has a poor material utilization efficiency, which leads to an increase in material costs as well.

In recent years, the practical use of pixel arrangements aside from the RGB stripe arrangement are seen, such as the S-Stripe arrangement and the PenTile arrangement, for the purpose of improving the perceived resolution.

However, regardless of the pixel arrangement, it has been necessary in the related art to secure a bank width of at least approximately several tens of μm between subpixels, and the resolution of known display devices using the separate-patterning technique effectively peaks at 500 pixels per inch.

With the aim of providing a light-emitting apparatus having productivity and reduced power consumption, PTL 1 discloses a light-emitting apparatus including at least an R subpixel, which includes a light-emitting element that emits red light and an optical element that transmits the red light, a G subpixel, which includes a light-emitting element that emits green light and an optical element that transmits the green light, and a B subpixel, which includes a light-emitting element that emits blue light and an optical element that transmits the blue light. In each light emitting element, a first light-emitting layer containing a first luminescent material having a spectral peak in a wavelength range from 540 nm to 580 nm, or a second light-emitting layer containing a second luminescent material having a light-emission peak in a wavelength range from 420 nm to 480 nm, is used in common.

The light-emitting apparatus may further include a Y subpixel which includes a light-emitting element that emits yellow (Y) light and an optical element that transmits the yellow light. The first light-emitting layer is a light-emitting layer constituted by a luminescent material that emits yellow-green, yellow, or orange light, and the second light-emitting layer is a light-emitting layer constituted by a luminescent material that emits purple, blue, or blue-green light.

In PTL 1, the light-emitting elements are used along with optical elements such as color filters, band-pass filters, multilayer film filters, and the like. The resulting optical interference effect and cutting of mixed color light by the optical elements improves the color purity.

However, in PTL 1, a common layer having a luminance peak at an intermediate color in the spectrum between two subpixels is provided as a common layer for the two subpixels. For example, a light-emitting layer having a luminescent color of yellow or orange is provided as the common layer for the G subpixel and the R subpixel. Accordingly, attempting to enhance a desired color using the optical interference effect can nevertheless result in color shifts and lead to a drop in efficiency, and it is difficult to improve the color reproduction of single colors.

In PTL 1, improving the color using an optical element provided on a counter substrate (a sealing substrate) can be considered. However, there is a tradeoff between color and light emitting efficiency. Therefore, like the white CF technique, there is a problem in that both high color purity and low power consumption cannot be achieved at the same time.

Furthermore, there is a gap between the light emitting element and the optical element, which can produce color mixing in light emitted in oblique directions. The light-emitting apparatus of PTL 1 therefore has a problem in terms of light distribution properties as well.

Having been conceived in light of the above-described problems with the related art, an object of the disclosure is to provide a display device, and a manufacturing method therefor, that can reduce a vapor deposition margin for preventing color mixing by making color mixing less likely than in display devices using the known separate-patterning technique, thereby achieving higher resolutions more easily, and that can achieve both high color levels and low power consumption.

Solution to Problem

To solve the above-described problems, a display device according to an aspect of the disclosure includes: a plurality of pixels, each pixel including a first subpixel, a second subpixel, a third subpixel, and a fourth subpixel, wherein a first light-emitting layer containing a first fluorescent luminescent material is provided in common for the first subpixel and the second subpixel, a second light-emitting layer containing a second fluorescent luminescent material is provided in common for the second subpixel and the third subpixel, and a third light-emitting layer containing a third luminescent material is provided in common for the third subpixel and the fourth subpixel; an energy level of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer is less than or equal to a Förster radius; the third subpixel includes an intermediate layer, the intermediate layer constituted by at least one function layer aside from the light-emitting layers and having a thickness exceeding the Förster radius, and in the third subpixel, the second light-emitting layer and the third light-emitting layer are layered with the intermediate layer interposed therebetween; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength higher than the first peak wavelength; and the third luminescent material emits light having a third peak wavelength higher than the second peak wavelength.

To solve the above-described problems, a manufacturing method for a display device according to an aspect of the disclosure is a manufacturing method for a display device, the display device including: a plurality of pixels, each pixel including a first subpixel, a second subpixel, a third subpixel, and a fourth subpixel, wherein in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength higher than the first peak wavelength; and the third luminescent material emits light having a third peak wavelength higher than the second peak wavelength, the method including: a function layer formation step of forming a plurality of function layers in each of the pixels, wherein the function layer formation step includes: a first light-emitting layer formation step of forming a first light-emitting layer containing the first fluorescent luminescent material in common for the first subpixel and the second subpixel; a second light-emitting layer formation step of forming a second light-emitting layer containing the second fluorescent luminescent material in common for the second subpixel and the third subpixel; a third light-emitting layer formation step of forming a third light-emitting layer containing the third luminescent material in common for the third subpixel and the fourth subpixel; and an intermediate layer formation step of forming an intermediate layer in the third subpixel, such that in the third subpixel, the second light-emitting layer and the third light-emitting layer are layered with the intermediate layer, constituted by at least one function layer aside from the light-emitting layers and having a thickness exceeding the Förster radius, being interposed therebetween, and in the function layer formation step: the first light-emitting layer and the second light-emitting layer are formed such that in the second subpixel, a distance between opposing surfaces of the first light-emitting layer and the second light-emitting layer is less than or equal to the Förster radius; and a fluorescent luminescent material having an energy level in a minimum excited singlet state that is lower than an energy level of the first fluorescent luminescent material in a minimum excited singlet state and higher than an energy level of the third luminescent material in a minimum excited singlet state is used for the second fluorescent luminescent material.

Advantageous Effects of Disclosure

According to the above-described aspects of the disclosure, the first light-emitting layer is provided in common for the first subpixel and the second subpixel, the second light-emitting layer is provided in common for the second subpixel and the third subpixel, and the third light-emitting layer is provided in common for the third subpixel and the fourth subpixel. Accordingly, the first light-emitting layer, the second light-emitting layer, and the third light-emitting layer can each be linearly deposited.

Additionally, according to the above-described aspects of the disclosure, in the second subpixel, the first light-emitting layer and the second light-emitting layer are layered. The second fluorescent luminescent material, which is the luminescent material of the second light-emitting layer, has a lower energy level in the minimum excited singlet state than the first fluorescent luminescent material, which is the luminescent material of the first light-emitting layer. Additionally, the distance between opposing surfaces of the first light-emitting layer and the second light-emitting layer is less than or equal to the Förster radius. Accordingly, even in a case where, for example, holes and electrons have recombined in the first light-emitting layer, Förster-type energy transfer enables the second fluorescent luminescent material to emit light at substantially 100% while suppressing color mixing.

In the third subpixel, the second light-emitting layer and the third light-emitting layer are layered, but layering the second light-emitting layer and the third light-emitting layer with the intermediate layer interposed therebetween inhibits energy transfer from the third light-emitting layer to the second light-emitting layer, which makes it possible to suppress color mixing.

Additionally, according to the above-described aspects of the disclosure, the first light-emitting layer, the second light-emitting layer, and the third light-emitting layer can each be linearly deposited, and because color mixing does not occur easily despite employing the layered structure for the light-emitting layers as described above, a vapor deposition margin for preventing color mixing can be made lower than in display devices using a known separate-patterning technique. This makes it possible to realize a higher resolution more easily than in display devices using a known separate-patterning technique.

Additionally, according to the above-described aspects of the disclosure, the display device does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus, according to the above-described aspects of the disclosure, it is possible to provide a display device that can reduce the vapor deposition margin for preventing color mixing by making color mixing less likely than in display devices using a known separate-patterning technique, thereby achieving higher resolutions more easily, and that can achieve both high color levels and low power consumption.

BRIEF DESCRIPTION OF DRAWINGS

FIG. 14A is a diagram illustrating Förster transfer, FIG. 14B is a diagram illustrating Dexter transfer, and FIG. 14C is a diagram illustrating a TADF material.

DESCRIPTION OF EMBODIMENTS

Hereinafter, embodiments of the disclosure will be described in detail.

First Embodiment

A description follows regarding one aspect of the disclosure, on the basis of FIGS. 1 to 10.

The following describes an organic EL display device as an example of a display device according to the present embodiment.

Overall Configuration of Organic EL Display Device

Figure 1:
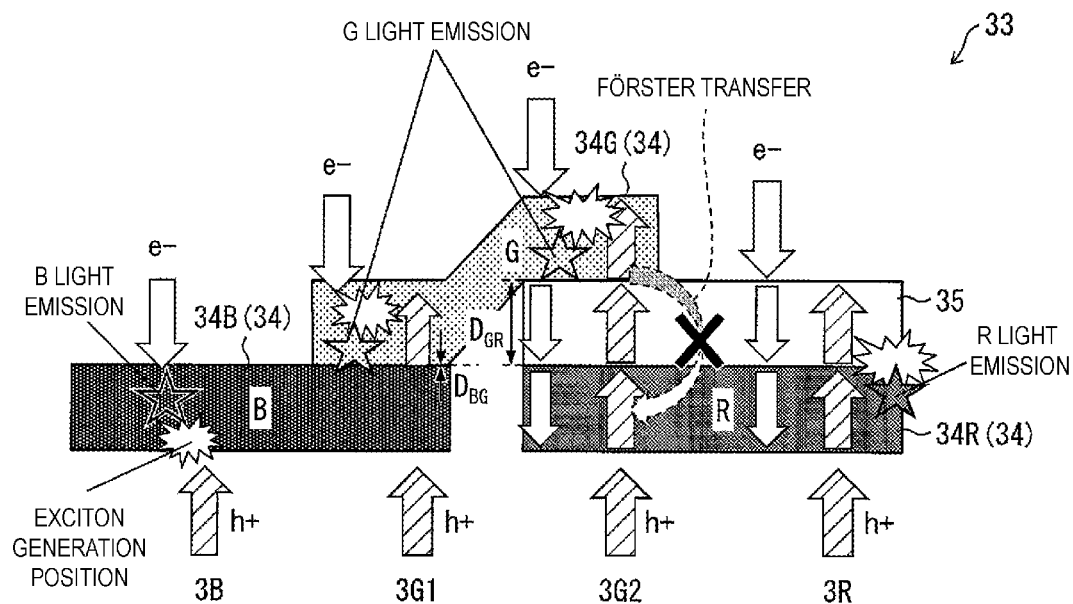
FIG. 1 is a diagram schematically illustrating the principle of light emission by a light-emitting layer unit of an organic EL display device according to a first embodiment of the disclosure.
Figure 2:
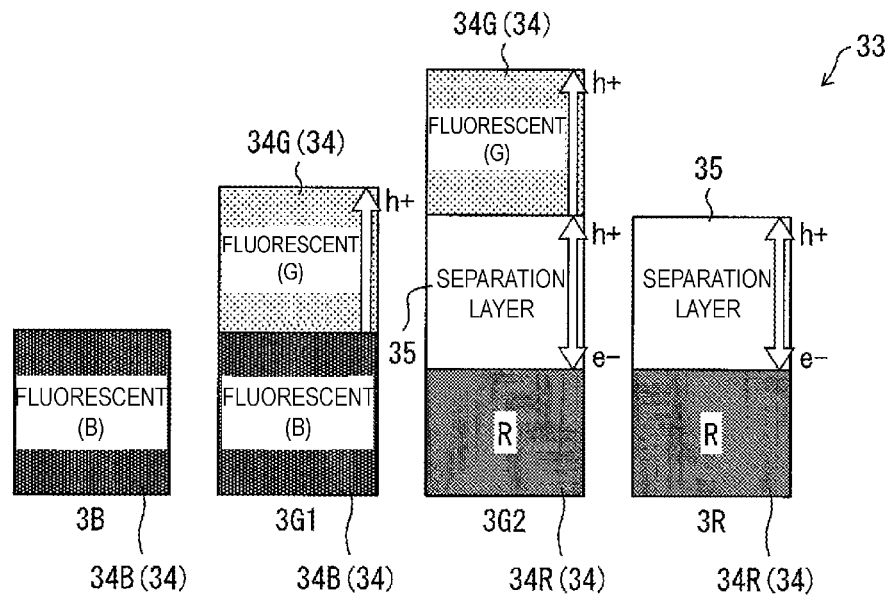
FIG. 2 is a diagram schematically illustrating a layered structure in the light-emitting layer unit of the organic EL display device according to the first embodiment of the disclosure.
Figure 3:
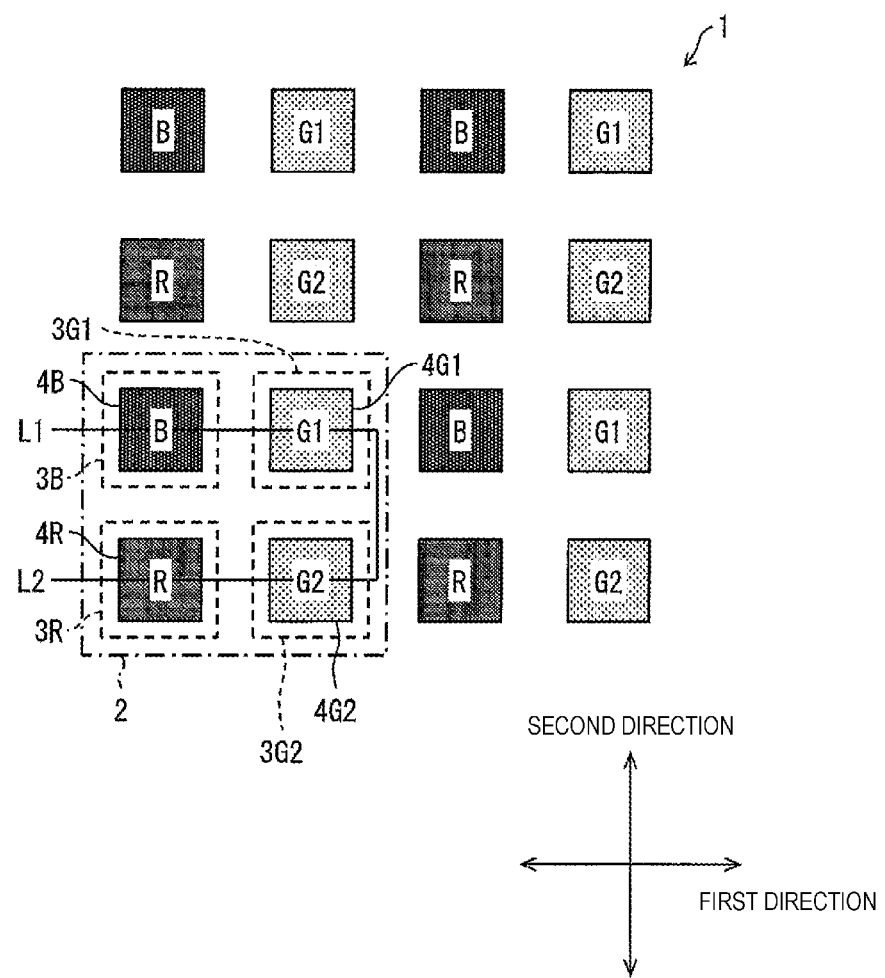
FIG. 3 is a diagram schematically illustrating a pixel arrangement in the organic EL display device according to the first embodiment of the disclosure.
Figures 4, 5:
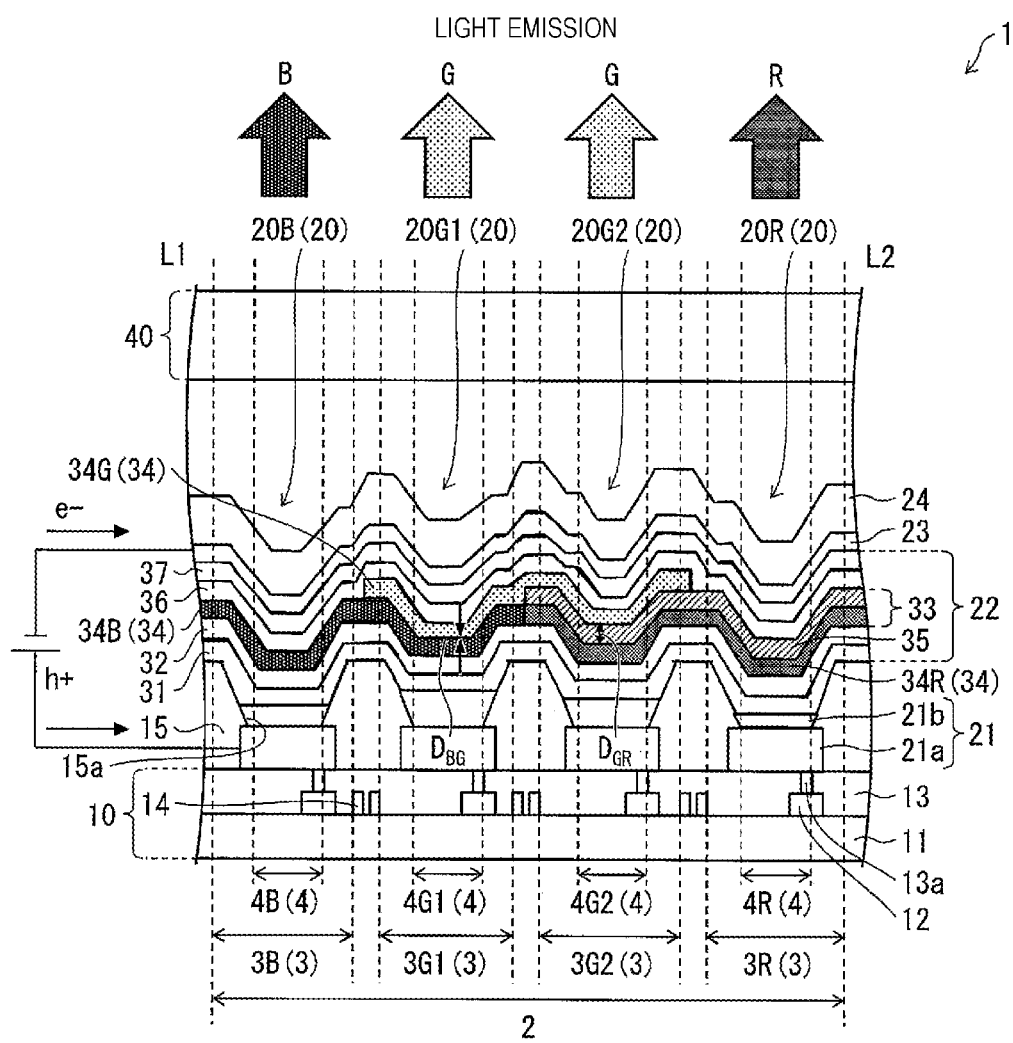
FIG. 4 is a cross-sectional view illustrating an example of the overall configuration of the organic EL display device according to the first embodiment of the disclosure.
FIG. 5 is a diagram illustrating a relationship between energy levels of a blue fluorescent luminescent material, a green fluorescent luminescent material, and a red luminescent material, in minimum excited singlet states.

FIG. 1 is a diagram schematically illustrating the principle of light emission by a light-emitting layer unit 33 of an organic EL display device 1 according to the present embodiment. FIG. 2 is a diagram schematically illustrating the layered structure of the light-emitting layer unit 33 of the organic EL display device 1 according to the present embodiment. FIG. 3 is a diagram schematically illustrating a pixel arrangement in the organic EL display device 1 according to the present embodiment. FIG. 4 is a cross-sectional view illustrating an example of the overall configuration of the organic EL display device 1 according to the present embodiment. Note that FIG. 4 illustrates an example of the overall configuration of a single pixel area, enclosed within the single dot-single dash line in FIG. 3, and corresponds to a cross-section of the organic EL display device 1 taken along the line L1-L2 indicated in FIG. 3.

As illustrated in FIG. 4, the organic EL display device 1 has a configuration in which, for example, a Thin Film Transistor (TFT) substrate 10 and a sealing substrate 40 are affixed to each other by a sealing member (not illustrated). A plurality of organic EL elements 20 that emit different colors of light are provided on the TFT substrate 10. Accordingly, the organic EL elements 20 are sealed between the pair of substrates, i.e., the TFT substrate 10 and the sealing substrate 40. A filler layer (not illustrated), for example, is provided between the TFT substrate 10, on which the organic EL elements 20 are layered, and the sealing substrate 40. The following describes an example in which the TFT substrate 10 is rectangular in shape.

The organic EL display device 1 according to the present embodiment is a top-emitting display device that emits light from the sealing substrate 40 side. This will be described in more detail below.

Configuration of TFT Substrate 10

The TFT substrate 10 is a circuit substrate in which a TFT circuit, which includes TFTs 12, wiring lines 14, and the like, is formed. The TFT substrate 10 includes an insulating substrate 11 (not illustrated) as a support substrate.

The insulating substrate 11 is not particularly limited as long as it has insulating properties. For example, various types of known insulating substrates, including an inorganic substrate such as a glass substrate or a silica substrate, a plastic substrate formed from polyethylene terephthalate or polyimide resin, or the like, can be used as the insulating substrate 11.

The present embodiment will later describe, as an example, a case where a transparent glass substrate (a transparent substrate) is used as the insulating substrate 11. However, the insulating substrate 11 need not be transparent for the top-emitting organic EL elements 20. Therefore, when the organic EL display device 1 is a top-emitting organic EL display device as in the present embodiment, an insulating substrate that is not transparent (a non-transparent substrate) and including a semiconductor substrate such as a silicon wafer, a substrate in which a surface of a metal substrate formed from aluminum (Al) or iron (Fe) is coated with an insulating material such as silicon oxide or an organic insulating material, a substrate in which a surface of a metal substrate formed from Al is subjected to an insulation treatment through an anode oxidation method, or the like, may be used as the insulating substrate 11.

A plurality of the wiring lines 14 are provided on the insulating substrate 11, the wiring lines 14 being constituted by a plurality of gate lines extending in the horizontal direction and a plurality of signal lines extending in the vertical direction and intersecting with the gate lines. The wiring lines 14 and the TFTs 12 are covered by an interlayer insulating film 13. A gate line drive circuit (not illustrated), which drives the gate lines, is connected to the gate lines, and a signal line drive circuit (not illustrated), which drives the signal lines, is connected to the signal lines.

Light emitting regions 4 of the organic EL elements 20, which emit red (R), green (G), and blue (B) light, respectively, are provided on the TFT substrate 10, in regions surrounded by the wiring lines 14.

In other words, the region surrounded by the wiring lines 14 is a single subpixel 3 (a dot), and R, G, and B light emitting regions 4 are defined for each subpixel 3.

As illustrated in FIGS. 3 and 4, each of pixels 2 (i.e., each pixel) is constituted by four subpixels, namely subpixels 3B, 3G1, 3G2, and 3R. Organic EL elements 20B, 20G1, 20G2, and 20R, which have corresponding luminescent colors, are provided as the organic EL elements 20 for the subpixels 3B, 3G1, 3G2, and 3R, respectively.

The subpixel 3B (a first subpixel; a blue subpixel), which displays blue serving as a first color, is constituted by the organic EL element 20B, which has a luminescent color of blue, and transmits blue light. The subpixel 3G1 (a second subpixel; a first green subpixel), which displays green serving as a second color, is constituted by the organic EL element 20G1, which has a luminescent color of green, and transmits green light. Likewise, the subpixel 3G2 (a third subpixel; a second green subpixel), which displays green serving as the second color, is constituted by the organic EL element 20G2, which has a luminescent color of green, and transmits green light. The subpixel 3R (a fourth subpixel; a red subpixel), which displays red serving as a third color, is constituted by the organic EL element 20R, which has a luminescent color of red, and transmits red light.

In the present embodiment, the subpixels 3B, 3G1, 3G2, and 3R will be collectively referred to simply as "subpixels 3" where there is no need to distinguish between the subpixels 3B, 3G1, 3G2, and 3R. Likewise, in the present embodiment, the organic EL elements 20B, 20G1, 20G2, and 20R will be collectively referred to simply as "organic EL elements 20" where there is no need to distinguish between the organic EL elements 20B, 20G1, 20G2, and 20R. Furthermore, light emitting regions 4B, 4G1, 4G2, and 4R will be collectively referred to simply as "light emitting regions 4" where there is no need to distinguish between the light emitting regions 4B, 4G1, 4G2, and 4R. Numbers indicating the members collectively referred to in this manner are added as parentheticals in FIG. 4 and the like, e.g., "3B(3)".

A plurality of the TFTs 12, including a TFT serving as a drive transistor supplying drive current to the organic EL element 20, are provided for each of the subpixels 3. The light emission intensity of each subpixel 3 is determined by scanning and selection by the wiring line 14 and the TFT 12. As described above, the organic EL display device 1 selectively causes each organic EL element 20 to emit light at the desired luminance using the TFT 12, thereby displaying an image.

Configuration of Organic EL Element 20

As illustrated in FIG. 4, each organic EL element 20 includes a first electrode 21, an organic EL layer 22, and a second electrode 23. The organic EL layer 22 is interposed between the first electrode 21 and the second electrode 23. In the present embodiment, the layers provided between the first electrode 21 and the second electrode 23 are collectively referred to as the organic EL layer 22. The organic EL layer 22 is an organic layer constituted by at least one function layer, and includes the light-emitting layer unit 33, which in turn includes at least one light-emitting layer 34.

The first electrode 21, the organic EL layer 22, and the second electrode 23 are layered in that order from the TFT substrate 10 side.

The first electrode 21 is formed in an island-like pattern for each subpixel 3, and an end portion of the first electrode 21 is covered by a bank 15 (a partition; an edge cover). The first electrode 21 is connected to the TFT 12 via a contact hole 13a provided in the interlayer insulating film 13.

The bank 15 is an insulating layer, and is constituted by a photosensitive resin, for example. The bank 15 prevents short-circuiting with the second electrode 23 due to increased electrode density, the organic EL layer 22 being thinner, or the like at the end portion of the first electrode 21. The bank 15 also functions as a pixel separation film to prevent current from leaking to adjacent subpixels 3.

An opening 15a is provided in the bank 15, for each subpixel 3. As illustrated in FIG. 4, parts of the first electrode 21 and the organic EL layer 22 exposed by the opening 15a correspond to the light emitting region 4 of each subpixel 3, and the other regions are non-emissive regions.

On the other hand, the second electrode 23 is a common electrode provided in common for the subpixels 3 in all of the pixels 2. However, the present embodiment is not limited thereto, and the second electrode 23 may be provided for each subpixel 3 individually.

A protection layer 24 is provided on the second electrode 23 to cover the second electrode 23. The protection layer 24 protects the second electrode 23, which serves as an upper electrode, and prevents outside oxygen and moisture from infiltrating into each organic EL element 20. Note that the protection layer 24 may be provided in common for all of the organic EL elements 20 so as to cover the second electrode 23 in all of the organic EL elements 20. In the present embodiment, the first electrode 21, the organic EL layer 22, and the second electrode 23, which are formed for each subpixel 3, as well as the protection layer 24 formed as necessary, are collectively referred to as the organic EL element 20.

First Electrode 21 and Second Electrode 23

The first electrode 21 and the second electrode 23 serve as a pair of electrodes, with one functioning as an anode electrode and the other functioning as a cathode electrode.

The anode electrode may function as an electrode for injecting holes (h+) into the light-emitting layer unit 33. The cathode electrode may function as an electrode for injecting electrons (e⁻) into the light-emitting layer unit 33.

The shape, structure, size, or the like of the anode electrode and the cathode electrode are not particularly limited and can be appropriately selected according to the application and purpose of the organic EL element 20.

The present embodiment will describe an example in which the first electrode 21 is the anode electrode and the second electrode 23 is the cathode electrode, as illustrated in FIG. 4. However, the present embodiment is not limited thereto, and the first electrode 21 may be a cathode electrode and the second electrode 23 may be an anode electrode. The order in which the function layers constituting the light-emitting layer unit 33 are layered, or the carrier transport properties (hole transport properties and electron transport properties), are inverted depending on whether the first electrode 21 is an anode electrode and the second electrode 23 is a cathode electrode, or the first electrode 21 is a cathode electrode and the second electrode 23 is an anode electrode. Likewise, the materials constituting the first electrode 21 and the second electrode 23 are inverted as well.

Electrode materials that can be used as the anode electrode and the cathode electrode are not particularly limited. For example, known electrode materials can be used.

As the anode electrode, for example, metals such as gold (Au), platinum (Pt), and nickel (Ni), transparent electrode materials such as indium tin oxide (ITO), tin oxide ($SnO_2$), indium zinc oxide (IZO), and gallium-added zinc oxide (GZO), or the like can be used.

On the other hand, it is preferable that a material having a small work function be used for the cathode electrode to inject electrons into the light-emitting layer 34. As the cathode electrode, for example, metals such as lithium (Li), calcium (Ca), cerium (Ce), barium (Ba), and aluminum (Al), or alloys such as Ag (silver)-Mg (magnesium) alloy and Al—Li alloy containing these metals, can be used.

The thicknesses of the anode electrode and cathode electrode are not particularly limited, and can be set to the same thicknesses as employed in the related art.

Light emitted by the light-emitting layer unit 33 is light emitted from the side on which one of the electrodes, out of the first electrode 21 and the second electrode 23, is located. Preferably, a transparent or semitransparent light-transmissive electrode (a transparent electrode, a semitransparent electrode) employing a light-transmissive electrode material is used as the electrode on the side where light is emitted, and a reflective electrode employing a reflective electrode material, or an electrode having a reflective layer which serves as a reflective electrode, is used as the electrode on the side where light is not emitted.

In other words, a variety of conductive materials can be used for the first electrode 21 and the second electrode 23. However, when the organic EL display device 1 is a top-emitting organic EL display device as described above, it is preferable that the first electrode 21 on the side of the TFT substrate 10, which serves as a support body supporting the organic EL elements 20, be formed from a reflective electrode material, and that the second electrode 23, which is located on the side opposite from the first electrode 21 with the organic EL elements 20 interposed therebetween, be formed from a transparent or semitransparent light-transmissive electrode material.

The first electrode 21 and the second electrode 23 may each have a single layer structure formed from one electrode material, or may each have a layered structure formed from a plurality of electrode materials.

Accordingly, when the organic EL elements 20 are top-emitting organic EL elements as described above, the first electrode 21 may have a layered structure including a reflective electrode 21a (a reflective layer) and a light-transmissive electrode 21b, as illustrated in FIG. 2. In the present embodiment, the first electrode 21 has a configuration in which the reflective electrode 21a and the light-transmissive electrode 21b are layered in that order from the TFT substrate 10 side.

Examples of reflective electrode materials include a black electrode material such as tantalum (Ta) or carbon (C), and a reflective metal electrode material such as Al, Ag, gold (Au), Al—Li alloy, Al-neodymium (Nd) alloy, or Al-silicon (Si) alloy.

A transparent electrode material such as those described above, or a semitransparent electrode material such as a thin film of Ag, may be used as the light-transmissive electrode material, for example.

Organic EL Layer 22

As illustrated in FIG. 4, the organic EL layer 22 according to the present embodiment has a configuration in which a hole injection layer 31, a hole transport layer 32, the light-emitting layer unit 33 including the light-emitting layer 34, an electron transport layer 36, and an electron injection layer 37, serving as function layers, are layered in that order from the first electrode 21 side. The hole injection layer 31, the hole transport layer 32, the electron transport layer 36, and the electron injection layer 37 are provided in common for the subpixels 3 in all of the pixels 2.

However, the function layers aside from the light-emitting layer unit 33 are not layers necessary for the organic EL layer 22, and may be formed as appropriate according to required properties of the organic EL element 20. Each of the above-described function layers will be described next.

Light-Emitting Layer Unit 33

As described above, the organic EL layer 22 in each organic EL element 20 is an organic layer constituted by at least one function layer. The light-emitting layer unit 33 in each organic EL element 20 includes at least one light-emitting layer 34, as illustrated in FIGS. 1, 2, and 4.

Of the organic EL elements 20, the organic EL element 20B includes, as the light-emitting layer 34, a blue fluorescent light-emitting layer 34B containing a blue fluorescent luminescent material that emits blue light. The organic EL element 20R includes, as the light-emitting layer 34, a red light-emitting layer 34R containing a red luminescent material that emits red light. The organic EL element 20G1 includes, as the light-emitting layer 34, a green fluorescent light-emitting layer 34G containing a green fluorescent luminescent material that emits green light, as well as the blue fluorescent light-emitting layer 34B. The organic EL element 20G2 includes, as the light-emitting layer 34, the green fluorescent light-emitting layer 34G, as well as the red light-emitting layer 34R.

The blue fluorescent light-emitting layer 34B is provided in common for the subpixel 3B and the subpixel 3G1. The green fluorescent light-emitting layer 34G is provided in common for the subpixel 3G1 and the subpixel 3G2. The red light-emitting layer 34R is provided in common for the subpixel 3G2 and the subpixel 3R.

As such, in each pixel 2, a plurality of function layers including at least the blue fluorescent light-emitting layer 34B, the green fluorescent light-emitting layer 34G, and the red light-emitting layer 34R are formed between the first electrode 21 and the second electrode, as illustrated in FIG. 4. In each subpixel 3, at least one function layer including at least one of the light-emitting layers 34 among the blue fluorescent light-emitting layer 34B, the green fluorescent light-emitting layer 34G, and the red light-emitting layer 34R, is provided between the first electrode 21 and the second electrode.

In the present embodiment, the blue fluorescent light-emitting layer 34B and the green fluorescent light-emitting layer 34G in the subpixel 3B are provided adjacent to each other. On the other hand, a separation layer 35 that inhibits Förster-type energy transfer (Förster transfer) is provided between the green fluorescent light-emitting layer 34G and the red light-emitting layer 34R in the subpixel 3G1.

The separation layer 35 does not contain a luminescent material, is constituted by at least one function layer aside from the light-emitting layer, and has a thickness exceeding the Förster radius. Preferably, the separation layer 35 is at least 15 nm thick.

"Förster radius" refers to the distance between adjacent light-emitting layers 34 at which Förster transfer can arise (specifically, the distance between opposing surfaces of adjacent light-emitting layers 34 that are closest to each other). The Förster radius is higher when there is a large amount of overlap between the photoluminescence (PL) emission spectrum of the luminescent material contained in one of the adjacent light-emitting layers 34 and the absorption spectrum of the luminescent material contained in the other of the light-emitting layers 34, and the Förster radius is lower when there is a small amount of such overlap.

The Förster radius is said to typically be approximately from 1 to 10 nm. As such, Förster transfer will not arise as long as the distance between the opposing surfaces of light-emitting layers 34 adjacent to each other is kept greater than 10 nm.

However, making the distance between adjacent light-emitting layers 34 at least 15 nm ensures that Förster transfer will not arise between the adjacent light-emitting layers 34 even in a case where the photoluminescence (PL) emission spectrum and the absorption spectrum of the luminescent materials in the adjacent light-emitting layers 34 overlap completely. It is therefore preferable that the distance between opposing surfaces of the green fluorescent light-emitting layer 34G and the red light-emitting layer 34R (an opposing surface distance $D_{GR}$), i.e., a distance between the surface of the green fluorescent light-emitting layer 34G located furthest on the red light-emitting layer 34R side (a lower surface of the green fluorescent light-emitting layer 34G, in the present embodiment) and the surface of the red light-emitting layer 34R located furthest on the green fluorescent light-emitting layer 34G side (an upper surface of the red light-emitting layer 34R, in the present embodiment), be greater than or equal to 15 nm. For this reason, preferably, the separation layer 35 is at least 15 nm thick.

Like the red light-emitting layer 34R, the separation layer 35 is provided in common for the subpixel 3G2 and the subpixel 3R. Note that the thickness of the separation layer 35 may be set to any thickness capable of inhibiting Förster transfer, and is not limited to a thickness exceeding the Förster radius. An increase in the thickness of the separation layer 35 will result in a corresponding increase in the thickness of the organic EL display device 1, and thus from the standpoint of keeping the organic EL display device 1 small, achieving low voltages for the elements, and the like, a thickness of less than or equal to 50 nm is preferable, and a thickness of less than or equal to 30 nm is more preferable.

As such, part of the separation layer 35 is interposed between the green fluorescent light-emitting layer 34G and the red light-emitting layer 34R in the subpixel 3G2, and another part is layered adjacent to the red light-emitting layer 34R in the subpixel 3R.

In each embodiment, a layered body constituted by the light-emitting layer 34 and an intermediate layer including function layers, aside from the light-emitting layer 34, that are at least partially interposed between a plurality of light-emitting layers 34, is referred to as the light-emitting layer unit 33. Note that the intermediate layer is the separation layer 35 in the organic EL display device 1 according to the present embodiment.

In the organic EL display device 1 according to the present embodiment, the light-emitting layers 34 and the separation layer 35 constituting the light-emitting layer unit 33 in the pixel 2 are layered in the following order, from the first electrode 21 side, as illustrated in FIGS. 1, 2, and 4: the blue fluorescent light-emitting layer 34B and the red light-emitting layer 34R, the intermediate layer, and the green fluorescent light-emitting layer 34G.

The light-emitting layer unit 33 is constituted by the blue fluorescent light-emitting layer 34B in the subpixel 3B, and in the subpixel 3G1, has a layered structure in which the blue fluorescent light-emitting layer 34B and the green fluorescent light-emitting layer 34G are layered in that order from the first electrode 21 side. In the subpixel 3G2, the light-emitting layer unit 33 has a layered structure in which the red light-emitting layer 34R, the separation layer 35, and the green fluorescent light-emitting layer 34G are layered in that order from the first electrode 21 side. In the subpixel 3R, the light-emitting layer unit 33 has a layered structure in which the red light-emitting layer 34R and the separation layer 35 are layered in that order from the first electrode 21 side.

FIG. 5 is a diagram illustrating a relationship between energy levels of the blue fluorescent luminescent material, the green fluorescent luminescent material, and the red luminescent material, in minimum excited singlet states (denoted as "$S_1$ levels" hereinafter). In FIG. 5, $S_1(1)$ indicates the $S_1$ level of the blue fluorescent luminescent material, which is a first fluorescent luminescent material; $S_1(2)$ indicates the $S_1$ level of the green fluorescent luminescent material, which is a second fluorescent luminescent material; and $S_1(3)$ indicates the $S_1$ level of the red luminescent material, which is a third luminescent material. Note that $S_0$ indicates a ground state in FIG. 5.

As illustrated in FIG. 5, the energy level of the green fluorescent luminescent material in the minimum excited singlet state ($S_1(2)$) is lower than the $S_1$ level of the blue fluorescent luminescent material ($S_1(1)$) and is higher than the $S_1$ level of the red luminescent material ($S_1(3)$).

Figure 6:
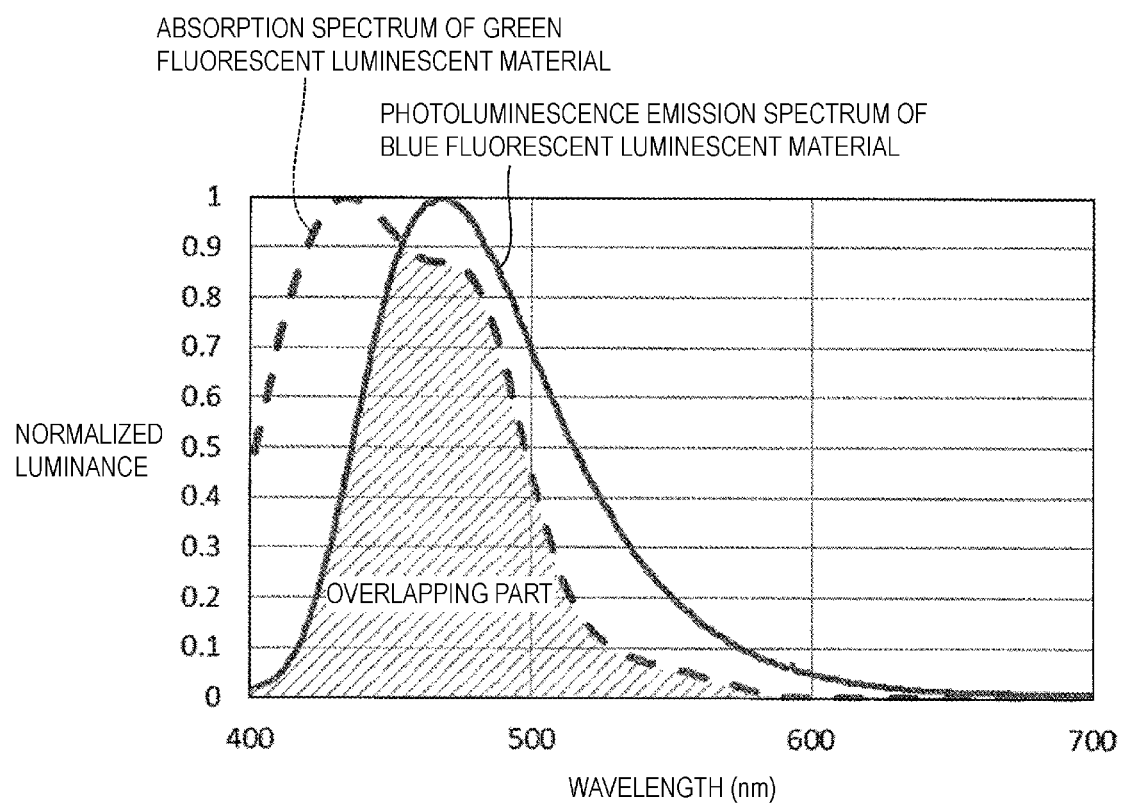
FIG. 6 is a graph illustrating an example of a photoluminescence emission spectrum of the blue fluorescent luminescent material, and an absorption spectrum of the green fluorescent luminescent material, used in the first embodiment of the disclosure.

FIG. 6 is a graph illustrating an example of the photoluminescence (PL) emission spectrum of the blue fluorescent luminescent material and the absorption spectrum of the green fluorescent luminescent material used in the present embodiment.

Note that FIG. 6 indicates the PL emission spectrum of 2,5,8,11-tetra-tert-butylperylene (TBPe), used in Example 1 (described later), as the PL emission spectrum of the blue fluorescent luminescent material, and indicates the absorption spectrum of 2,3-(2-benzothiazolyl)-7-(diethylamino) coumarin (coumarin 6), used in Example 1 (described later), as the absorption spectrum of the green fluorescent luminescent material.

Figure 7:
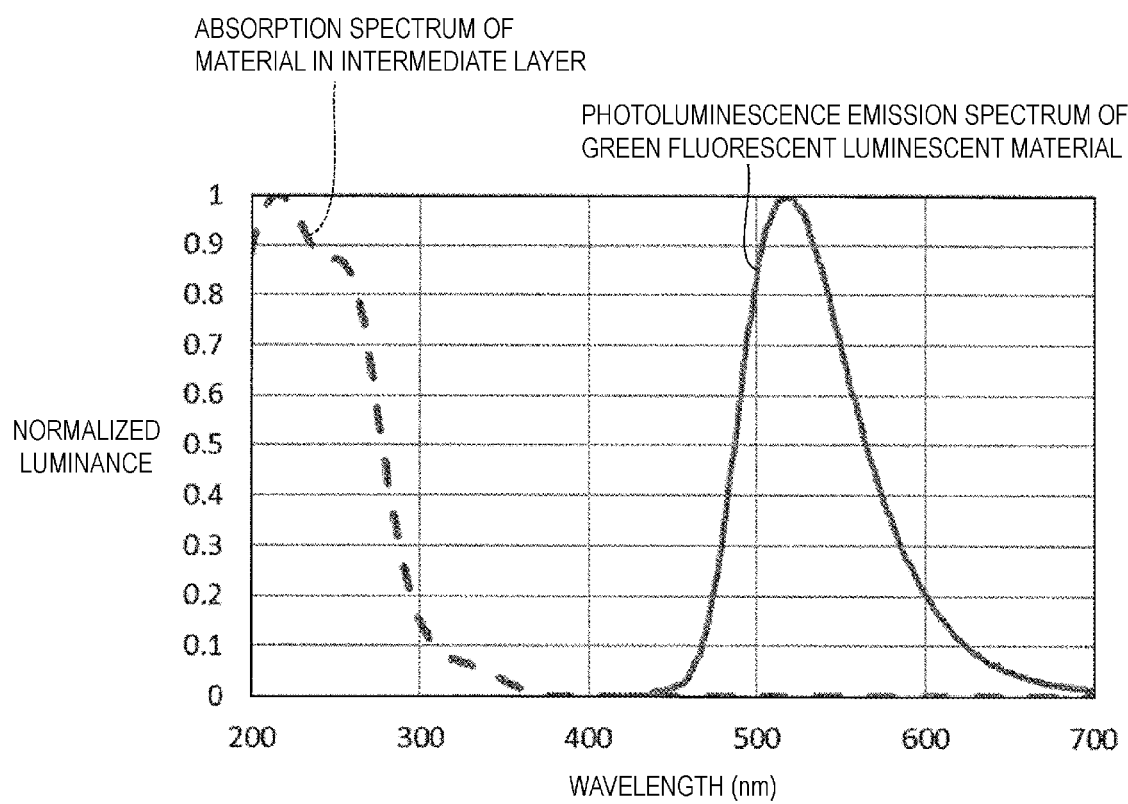
FIG. 7 is a graph illustrating an example of an absorption spectrum of a material of a separation layer, and a photoluminescence emission spectrum of the green fluorescent luminescent material, used in the first embodiment of the disclosure.

FIG. 7 is a graph illustrating an example of the absorption spectrum of the material of the separation layer 35, which is the intermediate layer, and the PL emission spectrum of the green fluorescent luminescent material, used in the present embodiment.

Note that FIG. 7 indicates the absorption spectrum of 4,4'-bis (9-carbazoyl)-biphenyl (CBP), used in Example 1 (described later), as the absorption spectrum of the material of the separation layer 35, and indicates the above-described PL emission spectrum of coumarin 6, used in Example 1 (described later), as the PL emission spectrum of the green fluorescent luminescent material.

As indicated in FIG. 6, it is preferable that the PL emission spectrum of the blue fluorescent luminescent material and the absorption spectrum of the green fluorescent luminescent material partially overlap. Furthermore, as indicated in FIG. 7, it is preferable that there is no overlapping between the PL emission spectrum of the green fluorescent luminescent material and the absorption spectrum of all the material contained in the intermediate layer provided between the green fluorescent light-emitting layer 34G and the red light-emitting layer 34R (the material of the separation layer 35, in the present embodiment).

Ensuring the PL emission spectrum of the blue fluorescent luminescent material and the absorption spectrum of the green fluorescent luminescent material partially overlap in this manner makes it easy for energy to be transferred from the blue fluorescent luminescent material to the green fluorescent luminescent material.

In the subpixel 3G1, the blue fluorescent light-emitting layer 34B and the green fluorescent light-emitting layer 34G are in direct contact, and thus the distance between opposing surfaces of the blue fluorescent light-emitting layer 34B and the green fluorescent light-emitting layer 34G (an opposing surface distance $D_{BG}$) is less than or equal to the Förster radius.

Thus, in the subpixel 3G1, Förster transfer arises, from the $S_1$ level of the blue fluorescent luminescent material to the $S_1$ level of the green fluorescent luminescent material. In other words, Förster transfer arises from the blue fluorescent light-emitting layer 34B to the green fluorescent light-emitting layer 34G.

Note that in the present embodiment, the distance between opposing surfaces of the blue fluorescent light-emitting layer 34B and the green fluorescent light-emitting layer 34G (the opposing surface distance $D_{BG}$) is a distance between the surface of the blue fluorescent light-emitting layer 34B located furthest on the green fluorescent light-emitting layer 34G side (an upper surface of the blue fluorescent light-emitting layer 34B, in the present embodiment) and the surface of the green fluorescent light-emitting layer 34G located furthest on the blue fluorescent light-emitting layer 34B side (a lower surface of the green fluorescent light-emitting layer 34G, in the present embodiment).

On the other hand, ensuring that there is no overlapping between the absorption spectrum of all the material included in the intermediate layer (the material of the separation layer 35) and the emission spectrum of the green fluorescent luminescent material makes it difficult for energy to transfer from the green fluorescent luminescent material to the material included in the intermediate layer.

The separation layer 35 has a thickness exceeding the Förster radius, and thus the opposing surface distance $D_{GR}$ in the subpixel 3G2 is greater than the Förster radius.

Thus in the subpixel 3G2, Förster-type energy transfer does not arise from the green fluorescent light-emitting layer 34G to the red light-emitting layer 34R through the intermediate layer. Of course, the intermediate layer is provided between the green fluorescent light-emitting layer 34G and the red light-emitting layer 34R, and the green fluorescent light-emitting layer 34G and the red light-emitting layer 34R are not in contact with each other, which means that Dexter-type energy transfer does not occur as well.

Each of the light-emitting layers 34 may be formed from a two-component system including a host material for transporting holes and electrons and a luminescent dopant (guest) material serving as a luminescent material and emitting light, or may be formed from a luminescent material alone.

Of the materials (components) of the light-emitting layer 34, either the host material or the luminescent material may have the greater content percentage.

The host material is a material into which holes and electrons can be injected, and has a function of causing the luminescent material to emit light by holes and electrons being transported and recombining within the molecules of the material. When using a host material, the luminescent material is dispersed uniformly throughout the host material.

When using a host material, an organic compound having a higher value for the $S_1$ level, the energy level in a minimum excited triplet state (denoted as "$T_1$ level" hereinafter), or both, than that of the luminescent material, is used for the host material. Accordingly, the host material can trap the energy of the luminescent material in the luminescent material, which makes it possible to improve the light emission efficiency of the luminescent material.

To improve the efficiency of the luminescent colors to be displayed by the subpixels 3 having the layered structure described in the present embodiment, it is desirable that the material in the green fluorescent light-emitting layer 34G having the highest content percentage, and desirably all the materials, be a hole transporting material with extremely low electron mobility, as indicated by the arrows in FIGS. 1 and 2 that represent the movement of holes (h+) and electrons (e−). Additionally, it is desirable that the separation layer 35 exhibit bipolar transport properties, where both the hole transport properties and the electron transport properties are high, for the separation layer 35 as a whole. Accordingly, the material contained in the separation layer 35 may be a material exhibiting bipolar transport properties alone, such as a bipolar transporting material. Alternatively, two or more types of a material that alone exhibits hole transport properties in which the hole mobility is higher than the electron mobility, or a material that alone exhibits electron transport properties in which the electron mobility is higher than the hole mobility, may be used in combination so as to exhibit bipolar transport properties as the separation layer 35. Furthermore, it is desirable that the material in the red light-emitting layer 34R having the highest combination ratio, and desirably all of the materials, be a bipolar transporting material, as indicated in FIGS. 1 and 2. However, this material may be a hole transporting material. A bipolar transporting material or a hole transporting material can be used favorably as the material in the blue fluorescent light-emitting layer 34B having the highest combination ratio, and desirably, as all of the materials.

Hole transporting materials such as 4,4'-bis [N-phenyl-N-(3"-methylphenyl) amino] biphenyl (TPD), 9,10-di (2-naphthyl) anthracene (ADN), 1,3-bis (carbazol-9-yl) benzene (mCP), and 3,3'-di (9H-carbazol-9-yl) biphenyl (mCBP) can be given as examples of host materials having hole transport properties. Electron transporting materials such as 2,9-dimethyl-4,7-diphenyl-1,10-phenanthroline (BCP), bis [(2-diphenylphosphoryl) phenyl]ether (DPEPO), 4,4'-Bis (2,2-diphenylvinyl)-1,1'-biphenyl (DPVBi), 2,2', 2"-(1,3,5-benztrile)-tris (1-phenyl-benzimidazolyl) (TPBi), and bis (2-methyl-8-quinolinolate)-4-(phenylphenolate) aluminum (BAlq) can be given as examples of host materials having electron transport properties. A bipolar transporting material such as 4,4'-bis (9-carbazoyl)-biphenyl (CBP) can be given as an example of a host material having bipolar transport properties.

The luminescent materials in the blue fluorescent light-emitting layer 34B and the green fluorescent light-emitting layer 34G are both fluorescent luminescent materials.

A fluorescent luminescent material that emits blue light, such as 2,5,8,11-tetra-tert-butylperylene (TBPe), bis [4-(9, 9-dimethyl-9,10-dihydroacridine) phenyl]sulfone (DMAC- DPS), perylene, and 4,5-bis (carbazol-9-yl)-1,2-dicyanobenzene (2CzPN) can be used as the blue fluorescent luminescent material.

3-(2-benzothiazolyl)-7-(diethylamino) coumarin (coumarin 6), 8-hydroxyquinoline aluminum (Alq 3), 1,2,3,5-tetrakis (carbazol-9-yl)-4,6-dicyano benzene (4CzIPN), 1,2,3,4-tetrakis (carbazol-9-yl)-5,6-dicyanobenzene (4CzPN), PXZ-DPS indicated in the following formula, and the like can be given.

[Chemical Formula 1]

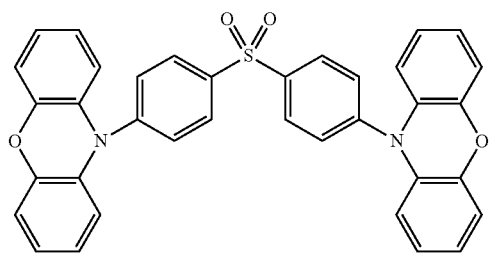

These materials can be given as examples of green fluorescent luminescent materials.

The red luminescent material may be a phosphorescent luminescent material or a fluorescent luminescent material, as long as the luminescent color is red. However, because the red light-emitting layer 34R does not use energy transfer, a phosphorescent luminescent material or a Thermally Activated Delayed Fluorescence (TADF) material has a high light emission efficiency and is therefore desirable.

The TADF material is a material in which a minimum excited singlet state can be generated through reverse intersystem crossing from a minimum excited triplet state by thermal activation, and is a delayed fluorescent material in which the energy difference $\Delta E_{ST}$ between the $S_1$ level and the $T_1$ level is extremely small. When a delayed fluorescent material in which the energy difference $\Delta E_{ST}$ between the $S_1$ level and the $T_1$ level is extremely small is used for the luminescent material, reverse intersystem crossing from the $T_1$ level to the $S_1$ level occurs due to thermal energy. Using the delayed fluorescence provided by the TADF material can theoretically enhance the internal quantum efficiency to 100%, even in the case of fluorescent light emission. The lower $\Delta E_{ST}$ is, the easier it is for reverse intersystem crossing to arise from the minimum excited triplet state to the minimum excited singlet state, and reverse intersystem crossing can occur comparatively easily, even at room temperature, if $\Delta E_{ST}$ is less than or equal to 0.3 eV.

Tetraphenyldibenzoperilenthene (DBP), (E)-2-{2-[4-(dimethylamino) styryl]-6-methyl-4H-pyran-4-ylidene}malononitrile (DCM), and the like can be given as examples of red fluorescent luminescent materials. Tris (1-phenylisoquinoline) iridium (III) (Ir(piq)3), bis (2-benzo[b]thiophen-2-yl-pyridine) (acetylacetonate) iridium (III) (Ir(btp) 2 (acac)), and the like can be given as examples of red phosphorescent luminescent materials. Examples of the TADF material that emits red light include PPZ-DPO, indicated by the following formula:

[Chemical Formula 2]

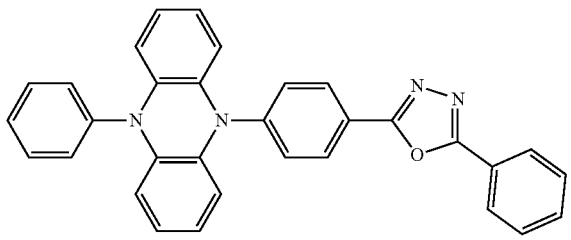

PPZ-DPS, indicated by the following formula:

[Chemical Formula 3]

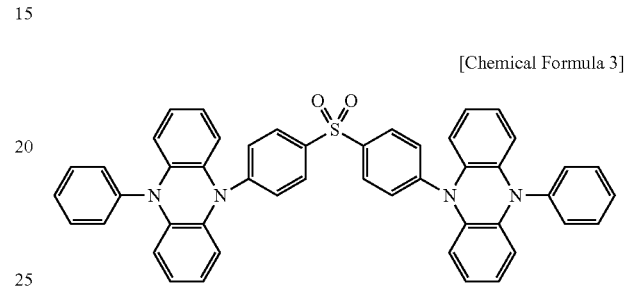

and 4CzTPN-Ph, indicated by the following formula:

[Chemical Formula 4]

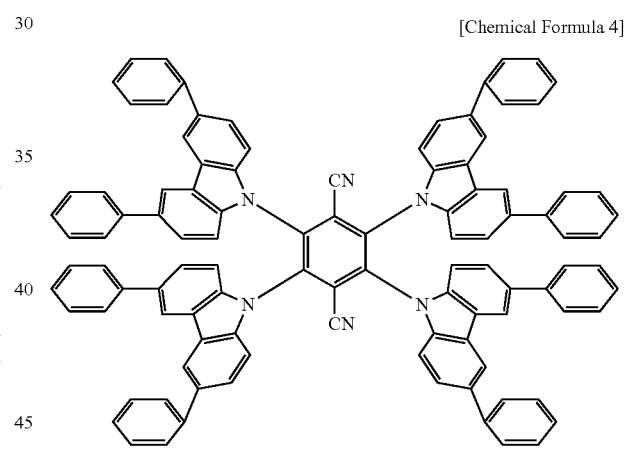

These materials can be used.

4,4'-bis (9-carbazoyl)-biphenyl (CBP) or the like, which is one of the above-described bipolar transporting materials, can be given as an example of the separation layer 35.

The thicknesses of the function layers in the light-emitting layer unit 33 are not particularly limited as long as the layers are formed so that the opposing surface distance $D_{GR}$ and the opposing surface distance $D_{BG}$ satisfy the above-described conditions. However, of the light-emitting layer unit 33, it is preferable that the thickness of the blue fluorescent light-emitting layer 34B be set to less than or equal to 10 nm.

Förster transfer is used in the subpixel 3G1, as described earlier. Setting the thickness of the blue fluorescent light-emitting layer 34B to less than or equal to 10 nm ensures that the distance, in the subpixel 3G1, from the molecules of the blue fluorescent luminescent material in the blue fluorescent light-emitting layer 34B that are furthest from the green fluorescent light-emitting layer 34G (i.e., the molecules at the surface of the blue fluorescent light-emitting layer 34B on the side opposite from the side on which the green fluorescent light-emitting layer 34G is located, which in the present embodiment are the molecules of the blue fluorescent luminescent material located on the lower surface of the blue fluorescent light-emitting layer 34B) to green fluorescent luminescent material in the green fluorescent light-emitting layer 34G is less than or equal to 10 nm. In other words, the shortest distances from given positions of the blue fluorescent light-emitting layer 34B to the green fluorescent light-emitting layer 34G are all less than or equal to 10 nm. As such, Förster transfer is possible from the molecules at a given location of the blue fluorescent luminescent material to the green fluorescent luminescent material in the subpixel 3G1. Förster transfer is also possible from, for example, molecules of the blue fluorescent luminescent material located at the surface of the blue fluorescent light-emitting layer 34B on the opposite side from the side on which the green fluorescent light-emitting layer 34G is located.

Hole Injection Layer 31 and Hole Transport Layer 32

The hole injection layer 31 includes a material with hole injecting properties, and has a function of increasing the hole injection efficiency to the light-emitting layer 34. The hole injection layer 31 and the hole transport layer 32 may be formed as mutually independent layers, or may be integrated together as a hole injection-cum-transport layer. It is not necessary that both the hole injection layer 31 and the hole transport layer 32 be provided, and only one (e.g., the hole transport layer 32) may be provided.

A known material can be used as the material of the hole injection layer 31, the hole transport layer 32, or the hole injection-cum-transport layer, that is, as a hole injection material or a hole transporting material.

Examples of such a material include linear or heterocyclic conjugated monomers, oligomers, or polymers such as naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivatives thereof, a thiophene-based compound, a polysilane-based compound, a vinyl carbazole-based compound, and an aniline-based compound. Specifically, N,N'-di(naphthalen-1-yl)-N,N'-diphenyl-benzidine (α-NPD), 2,3,6,7,10,11-hexacyano-1,4,5,8,9,12-hexaazatriphenylene (HAT-CN), 1,3-bis(carbazol-9-yl)benzene (mCP), di-[4-(N,N-ditolylamino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2,C2'](Ir(dpbic)$_3$), 4,4',4"-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injection layer 31, the hole transport layer 32, or the hole injection-cum-transport layer, an intrinsic hole injecting material or an intrinsic hole transporting material that is not doped with an impurity may be used. Alternatively, the material may be doped with an impurity to enhance the electrical conductivity.

To achieve highly-efficient light emission, it is desirable that the excitation energy be trapped within the light-emitting layer unit 33, and particularly within the light-emitting layer 34 of the light-emitting layer unit 33. Therefore, it is desirable that as the hole injecting material and the hole transporting material, a material having an $S_1$ level and a $T_1$ level that are excitation levels higher than the $S_1$ level and the $T_1$ level of the luminescent material in the light-emitting layer 34 be used. Therefore, it is more preferable that as the hole injecting material and the hole transporting material, a material having high excitation level and high hole mobility be selected.

Electron Transport Layer 36 and Electron Injection Layer 37

The electron injection layer 37 includes an electron injecting material and has a function of increasing the electron injection efficiency to the light-emitting layer 34.

The electron transport layer 36 includes an electron transporting material and has a function of increasing the electron transport efficiency to the light-emitting layers 34.

The electron injection layer 37 and the electron transport layer 36 may be formed as mutually independent layers, or may be integrated together as an electron injection-cum-transport layer. It is not necessary that both the electron injection layer 37 and the electron transport layer 36 be provided, and only one, e.g., the electron transport layer 36, may be provided. Of course, it is acceptable for neither to be provided as well.

A known material can be used as a material for the electron injection layer 37, the electron transport layer 36, or an electron injection-cum-transport layer, i.e., a material used as the electron injecting material or the electron transporting material.

Examples of the material include quinoline, perylene, phenanthroline, bisstyryl, pyrazine, triazole, oxazole, oxadiazole, fluorenone, and derivatives and metal complexes thereof, and lithium fluoride (LiF).

More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline)aluminum), LiF, and the like.

Protection Layer 24

The protection layer 24 is formed from a transparent insulating material or conductive material. Inorganic insulating materials such as silicon nitride (SiN), silicon oxide (SiO), silicon oxynitride (SiON), and aluminum oxide ($Al_2O_3$), conductive materials such as ITO, and the like can be given as examples of the material of the protection layer 24. Note that the protection layer 24 may have a layered structure including an inorganic insulating layer and an organic insulating layer. A polysiloxane, silicon oxide carbide (SiOC), an acrylate, a polyurea, parylene, a polyimide, a polyamide, and the like can be given as examples of organic insulating materials that can be used as the organic insulating layer.

The thickness of the protection layer 24 is not particularly limited, and may be set as appropriate in accordance with the material so that oxygen, moisture, and the like can be prevented from infiltrating into the organic EL elements 20.

Sealing Substrate 40

An insulating substrate such as a glass substrate or a plastic substrate can be used as the sealing substrate 40. When the organic EL display device 1 is a top-emitting organic EL display device as in the present embodiment, a transparent insulating substrate is used as the sealing substrate 40.

Note that the insulating substrate 11 and the sealing substrate 40 may be flexible insulating films. Using flexible substrates for the insulating substrate 11 and the sealing substrate 40 makes it possible to make the organic EL display device 1 a flexible display or a bendable display.

Note that gap spacers (not illustrated) may be provided between the TFT substrate 10 and the sealing substrate 40, to prevent the sealing substrate 40 from contacting the TFT substrate 10 and damaging the organic EL elements 20.

Display Method of Organic EL Display Device 1

A display method of the organic EL display device 1 according to the present embodiment will be described next.

As described earlier, the organic EL display device 1 includes a plurality of subpixels 3 in which the organic EL elements 20, which include the light-emitting layers 34 of the respective colors, are provided. A color display is achieved by using the TFTs 12 to selectively cause the organic EL elements 20 in the subpixels 3 to emit light at desired luminances. The emission of light by the subpixels 3 will be described next.

The organic EL display device 1 according to the present embodiment is an active-matrix organic EL display device, and a plurality of the pixels 2 are arranged in a matrix in a display region.

As described above, each pixel 2 includes two types of green subpixels 3 (subpixels 3G), namely the subpixel 3G1 and the subpixel 3G2, and is therefore constituted by four subpixels 3, namely the subpixel 3B, the subpixel 3G1, the subpixel 3G2, and the subpixel 3R.

As illustrated in FIG. 3, in the display region, the pixels 2 have a S-Stripe type pixel arrangement (an S-Stripe arrangement), in which the subpixel 3B is adjacent to the subpixel 3G1 and the subpixel 3R is adjacent to the subpixel 3G2 in a row direction (a first direction), and the subpixel 3B is adjacent to the subpixel 3R and the subpixel 3G1 is adjacent to the subpixel 3G2 in a column direction (a second direction) orthogonal to the row direction. A column constituted by the subpixel 3B and the subpixel 3G1, and a column constituted by the subpixel 3G2 and the subpixel 3R, which are formed along the row direction, are arranged so as to alternate in the column direction. As such, in the display region, the subpixels 3B and the subpixels 3G1 are arranged in an alternating manner in odd-numbered rows, for example, and the subpixels 3R and the subpixels 3G2 are arranged in an alternating manner in even-numbered rows.

According to the present embodiment, employing an S-Stripe type pixel arrangement makes it possible to improve the apparent resolution.

Unlike organic EL display devices having a known S-Stripe type pixel arrangement, the subpixel 3G1 and the subpixel 3G2 have different layered structures in the present embodiment, as illustrated in FIGS. 1, 2, and 4.

In the organic EL display device 1 according to the present embodiment, the holes ($h^+$) and electrons ($e^-$) injected into the organic EL layer 22 from the first electrode 21 and the second electrode 23, respectively, as indicated in FIG. 4, recombine and generate excitons in the blue fluorescent light-emitting layer 34B of the subpixel 3B, as indicated in FIG. 1. The generated excitons give out light upon deactivating and returning to a ground state (denoted as "$S_0$" hereinafter). The subpixel 3B emits blue light as a result.

Additionally, as described earlier, the $S_1$ level of the green fluorescent luminescent material is lower than the $S_1$ level of the blue fluorescent luminescent material. Additionally, a hole transporting material is used for the material having the highest content percentage among the materials in the green fluorescent light-emitting layer 34G, and a bipolar transporting material or a hole transporting material is used for the material having the highest content percentage among the materials in the blue fluorescent light-emitting layer 34B. As such, in the subpixel 3G1, the holes and electrons injected into the organic EL layer 22 from the first electrode 21 and the second electrode 23, respectively, recombine in the green fluorescent light-emitting layer 34G and generate excitons, as indicated in FIG. 1.

Even in a case where, for example, holes and electrons recombine in the blue fluorescent light-emitting layer 34B, energy moves from the blue fluorescent light-emitting layer 34B to the green fluorescent light-emitting layer 34G through Förster transfer between the $S_1$ levels. The green fluorescent light-emitting layer 34G emits light (green light) at substantially 100%, which suppresses the mixing of blue light.

Additionally, as described earlier, a hole transporting material is used for the material having the highest content percentage among the materials in the green fluorescent light-emitting layer 34G, and a bipolar transporting material, for example, is used for the material having the highest content percentage among the materials in the red light-emitting layer 34R and the separation layer 35. Accordingly, in the subpixel 3G2, the holes and electrons injected into the organic EL layer 22 from the first electrode 21 and the second electrode 23, respectively, recombine in the green fluorescent light-emitting layer 34G and generate excitons, as indicated in FIG. 1.

At this time, the $S_1$ level of the green fluorescent luminescent material is higher than the $S_1$ level of the red luminescent material. However, the separation layer 35 inhibits energy transfer from the green fluorescent light-emitting layer 34G to the red light-emitting layer 34R. This suppresses mixing of red light in the subpixel 3G2, so that the subpixel 3G2 emits green light.

Even in a case where, when the blue fluorescent light-emitting layer 34B is formed in common for the subpixel 3B and the subpixel 3G1 through linear deposition (described later), the blue fluorescent light-emitting layer 34B has infiltrated the subpixel 3G1, the green fluorescent light-emitting layer 34G has extremely low electron transport properties, and almost no electrons flow as a result. As such, blue color mixing does not arise in the subpixel 3G2. "Linear deposition" refers to deposition in a linear shape rather than in dot shapes.

Furthermore, as described earlier, a bipolar transporting material, for example, is used for the material having the highest content percentage among the materials in the red light-emitting layer 34R and the separation layer 35. Accordingly, in the subpixel 3R, the holes and electrons injected into the organic EL layer 22 from the first electrode 21 and the second electrode 23, respectively, recombine in the red light-emitting layer 34R and generate excitons, as indicated in FIG. 1. The subpixel 3R emits blue light as a result.

Manufacturing Method for Organic EL Display Device 1

A manufacturing method for the organic EL display device 1 according to the present embodiment will be described next with reference to FIGS. 8 to 10.

Figure 9A:
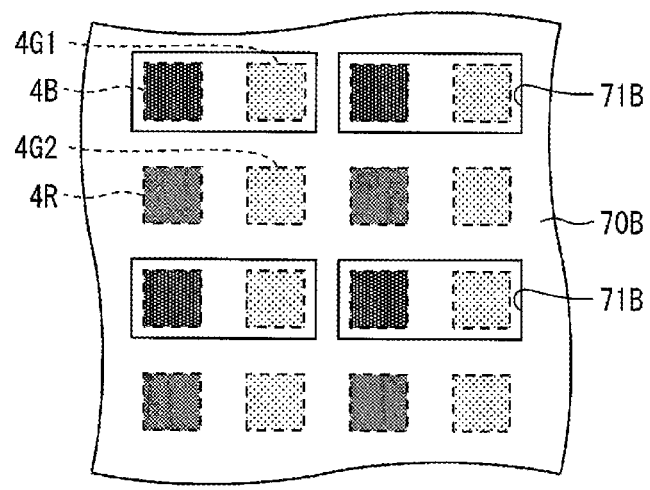
FIGS. 9A to 9C are plan views illustrating processes for producing the light-emitting layer unit in the organic EL display device according to the first embodiment of the disclosure, in the order of those processes.
Figure 9B:
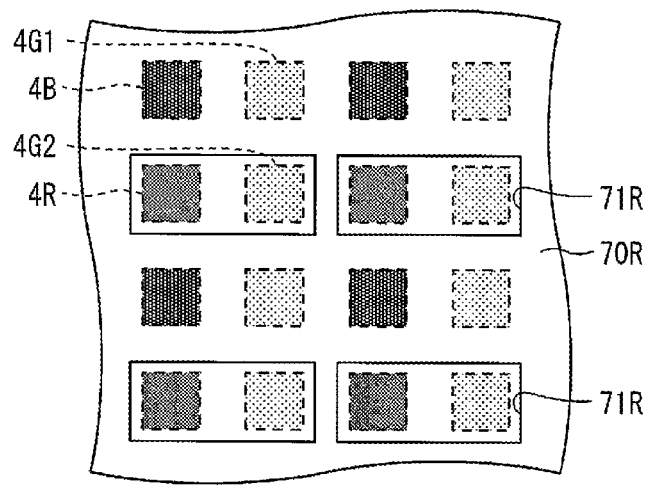
Figure 9C:
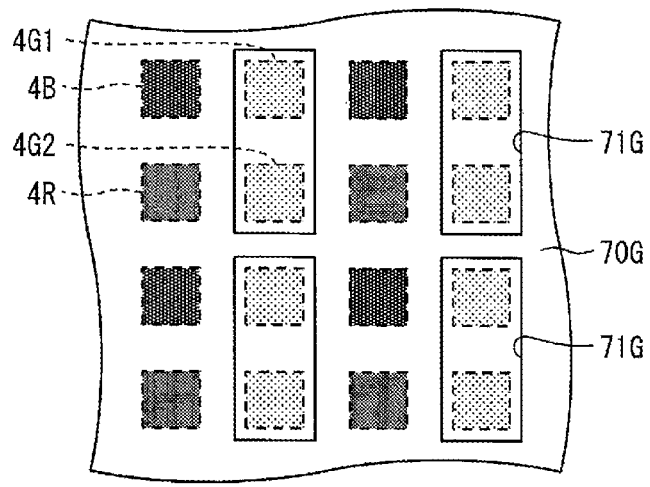

FIGS. 9A to 9C are plan views illustrating processes for producing the light-emitting layer unit 33 in the organic EL display device 1 according to the present embodiment, in the order of those processes. FIG. 10 is a flowchart illustrating the flow of processes for producing main portions of the organic EL display device 1 according to the present embodiment.

Note that in FIGS. 9A to 9C, the same hatching as that indicated in FIG. 3 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G in vapor deposition masks 70B, 70R, and 70G, respectively. The light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

The processes of producing the organic EL display device 1 according to the present embodiment include a TFT substrate preparation process of preparing the above-described TFT substrate 10, an organic EL element preparation process of forming the organic EL elements 20 on the TFT substrate 10, and a sealing process of sealing the organic EL elements 20 prepared in the organic EL element preparation process.

Figure 10:
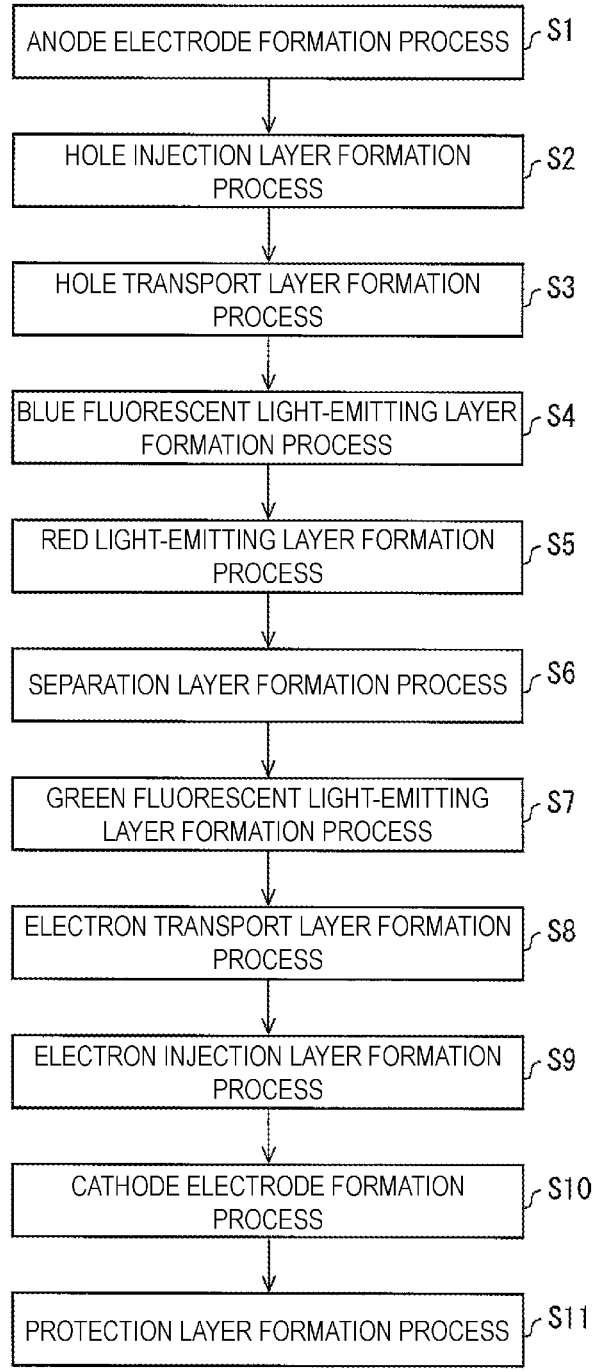
FIG. 10 is a flowchart illustrating the flow of processes for producing main portions of the organic EL display device according to the first embodiment of the disclosure.

As illustrated in FIG. 10, the organic EL element preparation process includes, for example, an anode electrode formation process (S1), a hole injection layer formation process (S2), a hole transport layer formation process (S3), a blue fluorescent light-emitting layer formation process (S4), a red light-emitting layer formation process (S5), a separation layer formation process (S6), a green fluorescent light-emitting layer formation process (S7), an electron transport layer formation process (S8), an electron injection layer formation process (S9), a cathode electrode formation process (S10), and a protection layer formation process (S11). The organic EL element preparation process is carried out in this order, for example, in the present embodiment. Note that the signs in the parentheses indicate step numbers.

However, as long as the organic EL display device 1 having the layered structure illustrated in FIGS. 1, 2, and 4 can be produced, the present embodiment is not limited to the above-described order of processes. For example, the red light-emitting layer formation process (S5) and the separation layer formation process (S6) may be carried out before the blue fluorescent light-emitting layer formation process (S4), as described later in a twelfth embodiment.

Each of the processes indicated above will be described next.

First, in the TFT substrate preparation process, a photosensitive resin is applied, using a known technique, to the insulating substrate 11 in which the TFTs 12, the wiring lines 14, and the like are formed, and is then patterned through a photolithography technique to form the interlayer insulating film 13 on the insulating substrate 11.

An acrylic resin, a polyimide resin, or the like can be used as the interlayer insulating film 13, for example. As long as steps produced by the TFTs 12 can be compensated for, the film thickness of the interlayer insulating film 13 is not particularly limited.

Next, the contact hole 13a for electrically connecting the first electrode 21, serving as the anode electrode, to the TFT 12, is formed in the interlayer insulating film 13. The TFT substrate 10 is prepared as a result.

Next, the organic EL elements 20 are formed on the TFT substrate 10 formed in this manner (the organic EL element preparation process).

In the organic EL element preparation process, first, the first electrode 21 is formed on the TFT substrate 10 as the anode electrode (S1).

The anode electrode formation process (S1) according to the present embodiment includes a reflective electrode formation process of forming the reflective electrode 21a on the TFT substrate 10, and a light-transmissive electrode formation process of forming the light-transmissive electrode 21b on the reflective electrode 21a.

Accordingly, in the anode electrode formation process (S1), first, a reflective electrode material is patterned and formed at a prescribed thickness on the TFT substrate 10 as the reflective electrode 21a of the first electrode 21.

The reflective electrode 21a may, for example, be patterned by forming a reflective electrode material as a film through sputtering or the like, using photolithography to form a resist pattern (not illustrated) for each subpixel 3, etching the layer constituted by the reflective electrode material using the resist patterns as a mask, and then separating the resist pattern on a subpixel 3-by-subpixel 3 basis through peeling and cleaning. Alternatively, a pattern film may be formed through a printing method, vapor deposition using a vapor deposition mask, or the like. For example, vacuum vapor deposition, chemical vapor deposition (CVD), plasma CVD, or the like can be used as the vapor deposition method.

Next, a light-transmissive electrode material is patterned and formed at a prescribed thickness on the reflective electrode 21a as the light-transmissive electrode 21b of the first electrode 21.

It is desirable that the distance between the reflective electrode 21a and the second electrode 23 serving as the cathode electrode be set to a distance that strengthens the intensity of the peak wavelengths of light in the wavelength ranges of the colors of light emitted from the respective subpixels 3.

Figure 8:
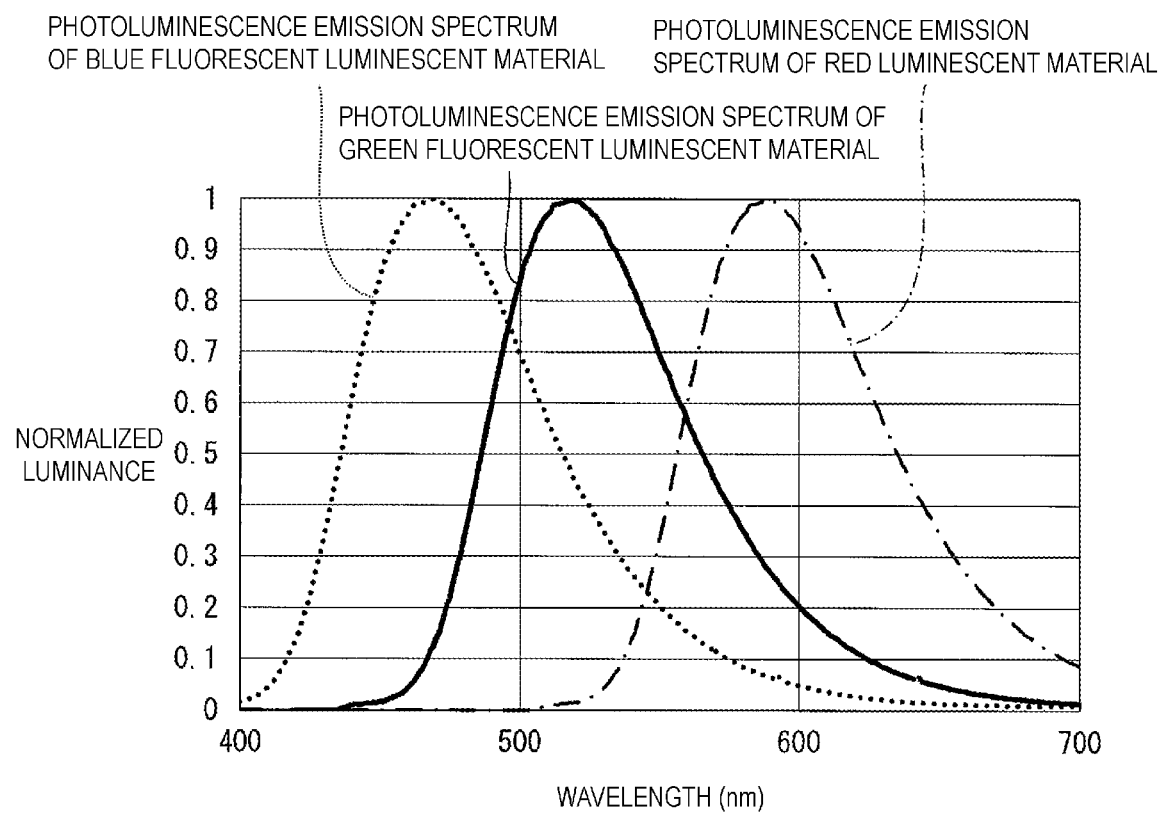
FIG. 8 is a graph illustrating an example of the photoluminescence emission spectrum of the blue fluorescent luminescent material, the photoluminescence emission spectrum of the green fluorescent luminescent material, and a photoluminescence emission spectrum of the red luminescent material.

FIG. 8 is a graph illustrating an example of the PL emission spectrum of the blue fluorescent luminescent material, the PL emission spectrum of the green fluorescent luminescent material, and the PL emission spectrum of the red luminescent material.

Note that FIG. 8 illustrates the PL emission spectrum of TBPe, used in Example 1 (described later), as the PL emission spectrum of the blue fluorescent luminescent material; the PL emission spectrum of coumarin 6, used in Example 1 (described later), as the PL emission spectrum of the green fluorescent luminescent material; and the PL emission spectrum of Ir(piq)3, used in Example 1 (described later), as the PL emission spectrum of the red luminescent material.

As illustrated in FIG. 8, the peak wavelength of the blue fluorescent luminescent material (a first peak wavelength) is approximately 470 nm, the peak wavelength of the green fluorescent luminescent material (a second peak wavelength) is approximately 520 nm, and the peak wavelength of the red luminescent material (a third peak wavelength) is approximately 590 nm.

The organic EL elements 20 according to the present embodiment are microcavity-type organic EL elements. In a microcavity-type organic EL element, emitted light is reflected in multiple between the anode electrode and the cathode electrode and resonated to produce a steep emission spectrum, and the light emission intensity at a specific wavelength is amplified.

A method of varying lengths between two resonance surfaces of organic EL elements (cavity lengths) on a luminescent color-by-luminescent color basis, i.e., varying the optical path length, is known as an example of a method for introducing such a resonance structure (microcavity structure) into organic EL elements.

In the present embodiment, the cavity length is varied on a subpixel 3-by-subpixel 3 basis by setting the thickness of the light-transmissive electrode 21b on a subpixel 3-by-subpixel 3 basis, and the microcavity effect is used to improve the light emission color, the light emission efficiency, and the like.

Accordingly, some of the light emitted from the luminescent materials in each subpixel 3 according to the present embodiment is emitted directly to the exterior, and the remaining light is reflected in multiple and then emitted to the exterior. In other words, the light emitted to the exterior from each subpixel 3 includes: light that is emitted from the luminescent material, and is emitted as-is to the exterior through the light-transmissive electrode (the second electrode 23, in the present embodiment) provided on the side opposite from the side on which the reflective electrode is provided, with the organic EL layer 22 interposed therebetween; and light that is emitted from the luminescent material, is reflected in multiple between the anode electrode and the cathode electrode (and more specifically, between the reflective electrode and the light-transmissive electrode, which in the present embodiment is between the reflective electrode 21*a* of the first electrode 21 and the second electrode 23), and is then emitted to the exterior through the light-transmissive electrode (the second electrode 23, in the present embodiment) provided on the side opposite from the side on which the reflective electrode is provided.

As such, in the subpixel 3B, the light emitted from the blue fluorescent light-emitting layer 34B is emitted to the exterior, and the light emitted to the exterior at this time includes light obtained by the light emitted from the blue fluorescent light-emitting layer 34B (i.e., light emitted from the blue fluorescent luminescent material) being reflected in multiple between the anode electrode and the cathode electrode in the subpixel 3B. Likewise, in the subpixel 3G1 and the subpixel 3G2, the light emitted from the green fluorescent light-emitting layer 34G is emitted to the exterior; the light emitted to the exterior from the subpixel 3G1 includes light obtained by the light emitted from the green fluorescent light-emitting layer 34G (i.e., light emitted from the green fluorescent luminescent material) being reflected in multiple between the anode electrode and the cathode electrode in the subpixel 3G1, and the light emitted to the exterior from the subpixel 3G2 includes light obtained by the light emitted from the green fluorescent light-emitting layer 34G being reflected in multiple between the anode electrode and the cathode electrode in the subpixel 3G2. Additionally, in the subpixel 3R, the light emitted from the red light-emitting layer 34R is emitted to the exterior, and the light emitted to the exterior at this time includes light obtained by the light emitted from the red light-emitting layer 34R (i.e., light emitted from the red luminescent material) being reflected in multiple between the anode electrode and the cathode electrode in the subpixel 3R.

In the subpixel 3B, the thickness of the light-transmissive electrode 21*b* is set such that the distance between the reflective electrode 21*a* and the second electrode 23 is an optimal thickness for emitting light in a blue wavelength range to the exterior (a distance that strengthens the intensity of the peak wavelength of the blue fluorescent luminescent material). Likewise, in the subpixel 3G1 and the subpixel 3G2, the thickness of the light-transmissive electrode 21*b* is set such that the distance between the reflective electrode 21*a* and the second electrode 23 is an optimal thickness for emitting light in a green wavelength range to the exterior (a distance that strengthens the intensity of the peak wavelength of the green fluorescent luminescent material); and in the subpixel 3R, the thickness of the light-transmissive electrode 21*b* is set such that the distance between the reflective electrode 21*a* and the second electrode 23 is an optimal thickness for emitting light in a red wavelength range to the exterior (a distance that strengthens the intensity of the peak wavelength of the red luminescent material).

The method for changing the thickness of the light-transmissive electrode 21*b* in each subpixel 3 is not particularly limited. The light-transmissive electrode material may be formed at a desired thickness for each subpixel 3 through vapor deposition, a printing method, or the like; or the light-transmissive electrode material may be formed through sputtering and patterned through photolithography, after which the thickness of each layer constituted by the light-transmissive electrode material is adjusted to the desired thickness through ashing or the like.

As a result, the first electrodes 21, which have a different thickness for each of the subpixels 3, are formed in a matrix on the TFT substrate 10.

Next, the banks 15 are patterned and formed so as to cover the end portions of the first electrodes 21, in the same manner as the interlayer insulating film 13. Through this process, the first electrodes 21 are formed as the anode electrodes, so as to be separated by the bank 15 in each subpixel 3.

The TFT substrate 10 that has gone through the processes described above is then subjected to low-pressure baking to remove moisture, and an oxygen plasma process to clean the surfaces of the first electrodes 21.

Next, the material of the hole injection layer 31 and the material of the hole transport layer 32 are vapor-deposited, in that order, on the entirety of the display region of the TFT substrate 10 on which the first electrodes 21 are formed, as carried out in the related art (S2, S3).

Then, the material of the blue fluorescent light-emitting layer 34B is deposited linearly in a direction connecting the subpixel 3B and the subpixel 3G1, using the vapor deposition mask 70B for forming the blue fluorescent light-emitting layer, in which a plurality of the openings 71B for two subpixels, corresponding to the subpixel 3B and the subpixel 3G1 in each pixel 2, are provided in the row direction and the column direction; as a result, the blue fluorescent light-emitting layer 34B is formed in the light emitting region 4B and the light emitting region 4G1, as indicated by the broken lines in FIG. 9A. In the present embodiment, the material of the blue fluorescent light-emitting layer 34B is linearly deposited in subpixel columns of odd-numbered rows that constitute the subpixel 3B and the subpixel 3G1. The blue fluorescent light-emitting layer 34B is formed on the hole transport layer 32 as an intermittent stripe following the row direction as a result (S4).

Next, the material of the red light-emitting layer 34R is deposited linearly in a direction connecting the subpixel 3R and the subpixel 3G2, using the vapor deposition mask 70R for forming the red light-emitting layer, in which a plurality of the openings 71R for two subpixels, corresponding to the subpixel 3R and the subpixel 3G2 in each pixel 2, are provided in the row direction and the column direction; as a result, the red light-emitting layer 34R is formed in the light emitting region 4R and the light emitting region 4G2, as indicated by the broken lines in FIG. 9B. In the present embodiment, the material of the red light-emitting layer 34R is linearly deposited in subpixel columns of even-numbered rows that constitute the subpixel 3R and the subpixel 3G2. The red light-emitting layer 34R is formed on the hole transport layer 32 as an intermittent stripe parallel to the blue fluorescent light-emitting layer 34B and following the row direction as a result (S5).

Next, the material of the separation layer 35 is deposited linearly in a direction connecting the subpixel 3R and the subpixel 3G2, using the vapor deposition mask 70R for forming the red light-emitting layer, on the red light-emitting layer 34R. As a result, the separation layer 35 having the same pattern as the red light-emitting layer 34R when viewed in a plan view is layered upon the red light-emitting layer 34R (S6).

Note that in the present embodiment, the red light-emitting layer 34R and the separation layer 35 have the same pattern when viewed in a plan view, and thus an example in which the red light-emitting layer 34R and the separation layer 35 are formed consecutively using the same vapor deposition mask 70R has been described as an example. However, the present embodiment is not limited thereto. The red light-emitting layer 34R and the separation layer 35 may be patterned and formed using separate dedicated vapor deposition masks having the same opening pattern.

Next, the material of the green fluorescent light-emitting layer 34G is deposited linearly in a direction connecting the subpixel 3G1 and the subpixel 3G2, using the vapor deposition mask 70G for forming the green fluorescent light-emitting layer, in which a plurality of the openings 71G for two subpixels, corresponding to the subpixel 3G1 and the subpixel 3G2 in each pixel 2, are provided in the row direction and the column direction; as a result, the green fluorescent light-emitting layer 34G is formed in the light emitting region 4G1 and the light emitting region 4G2, as indicated by the broken lines in FIG. 9C. In the present embodiment, the material of the green fluorescent light-emitting layer 34G is linearly deposited in even-numbered subpixel columns that constitute the subpixel 3G1 and the subpixel 3G2. Accordingly, the green fluorescent light-emitting layer 34G is formed, as an intermittent stripe following the column direction, on the hole transport layer 32, overlapping the blue fluorescent light-emitting layer 34B in the subpixel 3G1 and overlapping the separation layer 35 in the subpixel 3G2 (S7).

Note that metal masks formed from a metal can be used as the vapor deposition masks 70B, 70R, and 70G, for example.

Then, the material of the electron transport layer 36 and the material of the electron injection layer 37 are vapor-deposited, in that order, on the entirety of the display region of the TFT substrate 10 on which the above-described colors of light-emitting layers 34 are formed, as carried out in the related art (S8, S9).

Next, the second electrode 23 is formed as the cathode electrode on the entirety of the display region in the TFT substrate 10, so as to cover the electron injection layer 37 (S10).

Vapor deposition such as vacuum vapor deposition, CVD, and plasma CVD, or sputtering, a printing method, or the like may be used to form the second electrode 23.

Then, the material of the protection layer 24 is vapor-deposited on the entirety of the display region in the TFT substrate 10, so as to cover the second electrode 23 (S11). The organic EL elements 20 are formed on the TFT substrate 10 as a result.

The TFT substrate 10 on which the organic EL elements 20 are formed and the sealing substrate 40 are then affixed to each other by a filler layer and a sealing member (not illustrated), as illustrated in FIG. 4, by carrying out the sealing process. The organic EL display device 1 according to the present embodiment is obtained in this manner.

However, the method of sealing the organic EL elements 20 is not limited to the method described above, and various known sealing methods can be employed instead.

In the present embodiment, the reflective electrode 21a, the light-transmissive electrode 21b, the hole injection layer 31, the hole transport layer 32, the blue fluorescent light-emitting layer 34B, the red light-emitting layer 34R, the separation layer 35, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 10, as Example 1.

Materials for the layers layered on the TFT substrate 10 and thicknesses thereof in Example 1 are as follows. However, the dimensions and materials denoted below are merely examples, and the present embodiment is not intended to be limited to these specific dimensions and materials. The following assumes that the thickness of the light-transmissive electrode 21b has been optically optimized through optical simulations to align the luminescent color of the subpixel 3G1 and the luminescent color of the subpixel 3G2.

Example 1

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)

Hole transport layer 32: TCTA (20 nm)

Blue fluorescent light-emitting layer 34B: ADN (host material, 90%)/TBPe (blue fluorescent luminescent material, 10%) (10 nm)

Red light-emitting layer 34R: CBP (host material 90%)/Ir(piq)3 (red luminescent material, 10%) (10 nm)

Separation layer 35: CBP (20 nm)

Green fluorescent light-emitting layer 34G: TPD (host material, 90%)/coumarin 6 (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

As described above, in the present embodiment, the blue fluorescent light-emitting layer 34B, the green fluorescent light-emitting layer 34G, and the red light-emitting layer 34R are common light-emitting layers that are each common to two of the subpixels 3 in each pixel 2. By using common light-emitting layers, light emission is achieved using the Förster-type energy transfer of the fluorescent luminescent material and the transferrable distance thereof, while improving the productivity.

As described above, according to the present embodiment, in the subpixel 3G2, the blue fluorescent light-emitting layer 34B and the green fluorescent light-emitting layer 34G are layered, but the green fluorescent luminescent material has a lower $S_1$ level than the blue fluorescent luminescent material, and the opposing surface distance $D_{BG}$ between the blue fluorescent light-emitting layer 34B and the green fluorescent light-emitting layer 34G is less than or equal to the Förster radius. As such, even in a case where, for example, holes and electrons recombine in the blue fluorescent light-emitting layer 34B, the Förster transfer enables the green fluorescent luminescent material to emit light at substantially 100% while suppressing color mixing.

In the subpixel 3R, the green fluorescent light-emitting layer 34G and the red light-emitting layer 34R are layered, but the green fluorescent light-emitting layer 34G and the red light-emitting layer 34R are layered with the separation layer 35 (the intermediate layer) interposed therebetween. Energy transfer from the red light-emitting layer 34R to the green fluorescent light-emitting layer 34G is inhibited as a result, which makes it possible to suppress color mixing.

In an organic EL display device having an S-Stripe arrangement that does not employ the above-described layered structure, linear deposition can only be carried out for subpixel columns constituted by green subpixels.

However, according to the present embodiment, the subpixel 3G1 and the subpixel 3G2 have the above-described layered structure. Therefore, as described above, linear deposition can be carried out not only in the direction connecting the subpixel 3G1 and the subpixel 3G2, but also in the direction connecting the subpixel 3B and the subpixel 3G1 and in the direction connecting the subpixel 3G2 and the subpixel 3R. This makes it possible to suppress color mixing in those directions as well.

Furthermore, according to the present embodiment, the light-emitting layers 34 and the separation layer 35 in all of the RGB subpixels 3, which are arranged having an S-Stripe arrangement, can be vapor-deposited using a vapor deposition mask having an opening pattern constituted by two subpixels' worth of openings, as described above. As such, the vapor deposition margin for preventing color mixing can be reduced, the resolution can be improved by reducing the pitch of the subpixels 3, and the surface area of the subpixels 3 can be broadened and current stress reduced while providing the same resolution, which makes it possible to lengthen the lifespan of the organic EL elements 20.

Thus, according to the present embodiment, the blue fluorescent light-emitting layer 34B, the green fluorescent light-emitting layer 34G, and the red light-emitting layer 34R can be linearly deposited, and color mixing does not arise easily despite the light-emitting layers 34 having the layered structures described above. Accordingly, the vapor deposition margin for preventing color mixing can be reduced more than in display devices using known separate-patterning techniques, and a higher resolution can be achieved than in display devices using known separate-patterning techniques.

Additionally, the organic EL display device 1 does not require a CF layer or an optical interference effect as with the white CF technique or PTL 1, despite having the above-described layered structure for the light-emitting layers. This makes it possible to avoid a situation where more power is consumed, the light distribution properties worsen, and the like. Therefore, a high color level and low power consumption can be achieved at the same time.

Thus, according to the present embodiment, it is possible to provide a display device that can reduce the vapor deposition margin for preventing color mixing by making color mixing less likely than in display devices using the known separate-patterning technique, thereby achieving higher resolutions more easily, and that can achieve both high color levels and low power consumption.

Modified Example

The present embodiment describes an example in which the display device according to the present embodiment is an organic EL display device. However, the display device according to the present embodiment may be any display device employing PL light emission. The display device according to the present embodiment is therefore not limited to the above-described examples, and may be, for example, an inorganic EL display device, a display device aside from an EL display device that employs PL light emission, or the like. Furthermore, inorganic materials may be used for the luminescent materials, and inorganic layers may be formed instead of organic layers.

The present embodiment describes forming the blue fluorescent light-emitting layer 34B as the first light-emitting layer containing the first fluorescent luminescent material, forming the green fluorescent light-emitting layer 34G as the second light-emitting layer containing the second fluorescent luminescent material, and forming the red light-emitting layer 34R as the third light-emitting layer containing the third luminescent material. However, the present embodiment is not limited thereto. The combination of the first fluorescent luminescent material, the second fluorescent luminescent material, and the third luminescent material is not limited to a combination of the blue fluorescent luminescent material, the green fluorescent luminescent material, and the red luminescent material. Any combination may be used as long as the second fluorescent luminescent material emits light having a peak wavelength (second peak wavelength) higher than the peak wavelength of the light emitted from the first fluorescent luminescent material (first peak wavelength), the third luminescent material emits light having a peak wavelength (third peak wavelength) higher than the second peak wavelength, and the $S_1$ level of the second fluorescent luminescent material is lower than the S1 level of the first fluorescent luminescent material and higher than the $S_1$ level of the third luminescent material.

Second Embodiment

Figure 11:
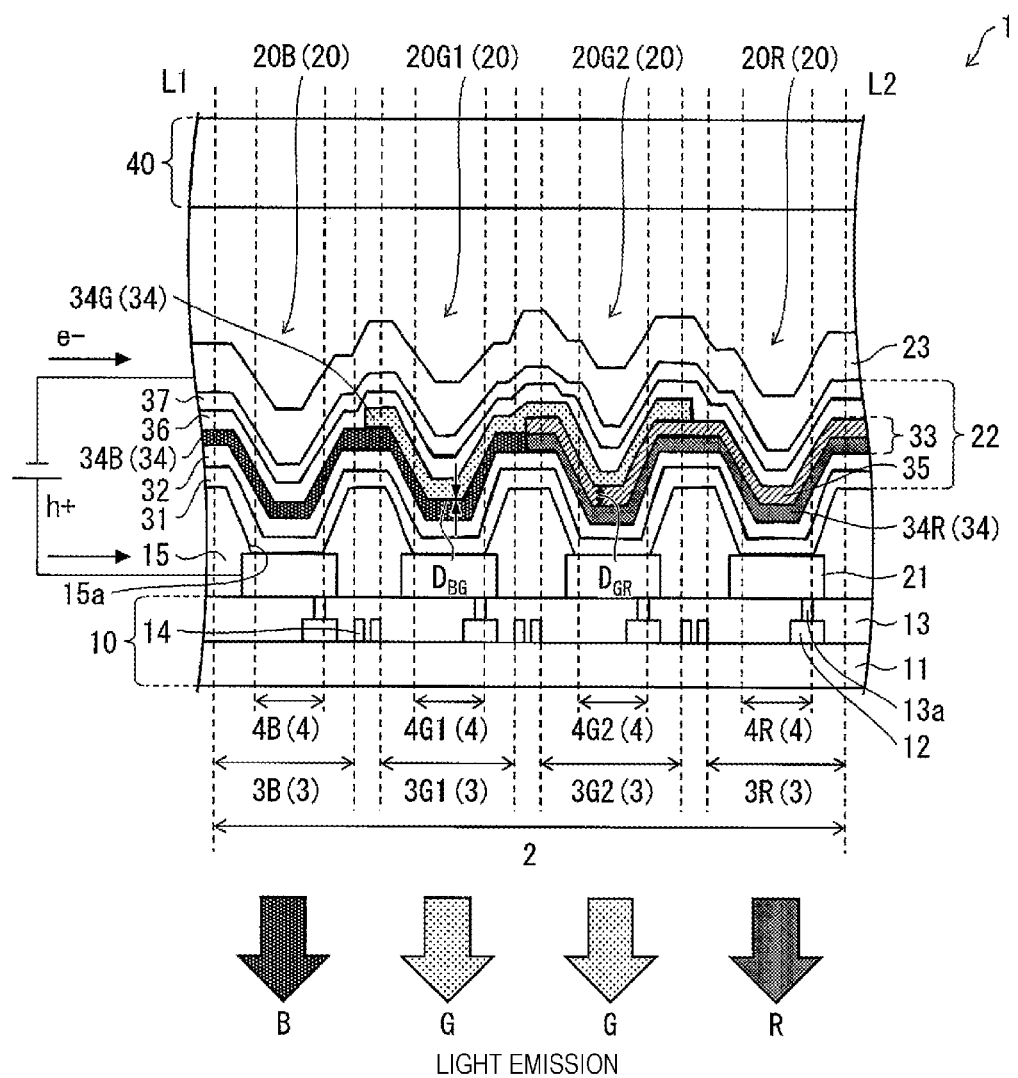
FIG. 11 is a cross-sectional view illustrating an example of the overall configuration of an organic EL display device according to a second embodiment of the disclosure.

A description follows regarding another embodiment of the disclosure, primarily on the basis of FIGS. 3, 10, and 11.

The present embodiment will describe differences from the first embodiment, and constituent elements having the same functions as the constituent elements described in the first embodiment will be assigned the same reference signs, with descriptions thereof omitted. It goes without saying that the same modifications as those of the first embodiment can be applied to the present embodiment as well.

FIG. 11 is a cross-sectional view illustrating an example of the overall configuration of the organic EL display device 1 according to the present embodiment. Like the organic EL display device 1 according to the first embodiment, the organic EL display device 1 according to the present embodiment has the S-Stripe pixel arrangement illustrated in FIG. 3. As such, FIG. 11 illustrates an example of the overall configuration of a single pixel area, enclosed within the single dot-single dash line in FIG. 3, and illustrates the overall configuration in a cross-section taken along the line L1-L2 indicated in FIG. 3.

The organic EL display device 1 according to the present embodiment is a bottom-emitting organic EL display device in which light from the light-emitting layer unit 33 is emitted from the first electrode 21 side, i.e., from the TFT substrate 10 side. The first electrode 21 is a light-transmissive electrode, and a reflective electrode that is thicker than the second electrode 23 (the semitransparent electrode) in the organic EL display device 1 according to the first embodiment is used as the second electrode 23 instead of providing the protection layer 24. Aside from this, however, the organic EL display device 1 according to the present embodiment is the same as the organic EL display device 1 according to the first embodiment.

The light-emission direction of the organic EL display device 1 may be on the first electrode 21 side or on the second electrode 23 side. As such, the organic EL display device 1 may have a bottom-emitting structure, as in the present embodiment.

Note that when the organic EL display device 1 is a bottom-emitting device, an insulating substrate that is transparent, called a transparent substrate or a light-transmitting substrate, such as a glass substrate or a plastic substrate, is used as the insulating substrate 11.

Additionally, when the organic EL display device 1 is a bottom-emitting device, the light from the light-emitting layer unit 33 is emitted from the light-transmissive electrode side directly from the light-transmissive electrode side, or having been reflected by the reflective electrode. Accordingly, in the present embodiment, the first electrode 21 on the TFT substrate 10 is a light-transmissive electrode, and the second electrode 23 is a reflective electrode, as described above. The light-transmissive electrode material, the reflective electrode material, and the like described as examples in the first embodiment can be used as the materials of the light-transmissive electrode and the reflective electrode.

In the present embodiment, the first electrode 21 constituted by the light-transmissive electrode, the hole injection layer 31, the hole transport layer 32, the blue fluorescent light-emitting layer 34B, the red light-emitting layer 34R, the separation layer 35, the green fluorescent light-emitting layer 34G, the electron transport layer 36, the electron injection layer 37, and the second electrode 23 constituted by the reflective electrode are layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 2

First electrode 21 (anode electrode, light-transmissive electrode) ITO: (50 nm)
Hole injection layer 31: HAT-CN (10 nm)
Hole transport layer 32: TCTA (20 nm)
Blue fluorescent light-emitting layer 34B: ADN (host material, 90%)/TBPe (blue fluorescent luminescent material, 10%) (10 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Electron transport layer 36: BCP (30 nm)
Electron injection layer 37: LiF (1 nm)
Second electrode 23 (cathode electrode, reflective electrode): Al (100 nm)

According to the present embodiment, a bottom-emitting organic EL display device 1 having the same effects as those of the first embodiment can be provided.

Additionally, when the organic EL display device 1 has a bottom-emitting structure as described above, the microcavity effect is weak, and thus the color level, light emission efficiency, and the like of the organic EL elements 20 in the subpixels 3 do not easily change even in a case where the optical path length (cavity length) of the organic EL elements 20 in the subpixels 3 is changed. As such, in a case where, like the first electrode 21 according to the first embodiment, the second electrode 23 is given a layered structure including the reflective electrode and a light-transmissive electrode serving as a thickness adjustment layer (an optical path length adjustment layer), the color level, efficiency, and the like of the organic EL elements 20 in the subpixels 3 will not change easily, even in cases where the optical path length of the organic EL elements 20 in the subpixels 3 is changed by changing the thickness of the light-transmissive electrode, the thickness of the organic EL layer 22 between the first electrode 21 and the second electrode 23 is changed in each subpixel 3, or the like.

Thus, according to the present embodiment, there is no particular problem even in a case where the layers in the organic EL display device 1 have a uniform thickness as described above, and thus the process of producing the organic EL display device 1 can be simplified compared to when a top-emitting structure is used.

Third Embodiment

A description follows regarding yet another embodiment of the disclosure, primarily on the basis of FIGS. 1 to 4 and 10 to 13C.

The present embodiment will describe differences from the first and second embodiments, and constituent elements having the same functions as the constituent elements described in the first and second embodiments will be assigned the same reference signs, with descriptions thereof omitted. It goes without saying that the same modifications as those of the first and second embodiments can be applied to the present embodiment as well.

Overall Configuration of Organic EL Display Device 1

Figure 12:
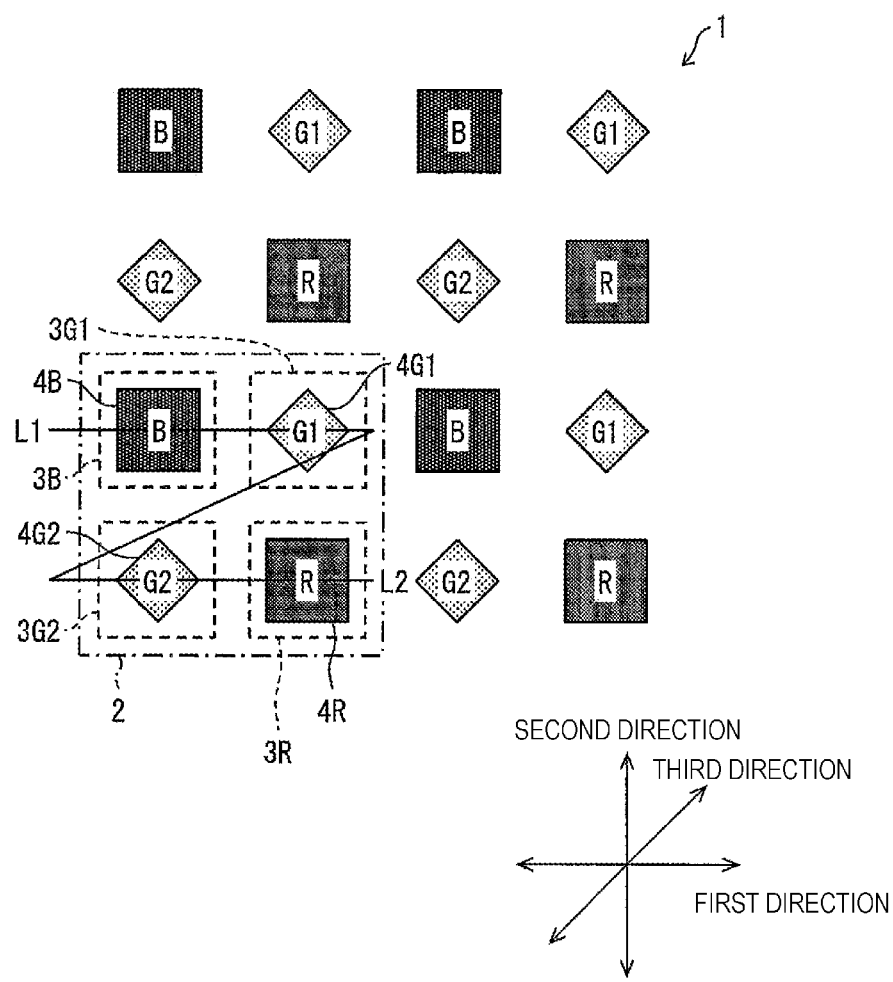
FIG. 12 is a diagram schematically illustrating a pixel arrangement in an organic EL display device according to a third embodiment of the disclosure.

FIG. 12 is a diagram schematically illustrating a pixel arrangement in the organic EL display device 1 according to the present embodiment.

The first and second embodiments describe a case where the organic EL display device 1 has an S-Stripe arrangement as an example. However, as illustrated in FIG. 12, the organic EL display device 1 may have a PenTile-type pixel arrangement (PenTile arrangement), in which the subpixel 3G1 is adjacent to the subpixel 3B in the row direction and adjacent to the subpixel 3R in the column direction, the subpixel 3G2 is adjacent to the subpixel 3R in the row direction and adjacent to the subpixel 3B in the column direction, and the subpixel 3B is adjacent to the subpixel 3R, and the subpixel 3G1 to the subpixel 3G2, in an oblique direction (a third direction) intersecting with the row direction and the column direction (specifically, intersecting with those directions at an angle of 45 degrees).

Note that with a PenTile arrangement, in the display region, the pixels 2 are arranged such that in the row direction, the subpixel 3B is adjacent to the subpixel 3G1 and the subpixel 3G2 is adjacent to the subpixel 3R, and in the column direction, the subpixel 3B is adjacent to the subpixel 3G2 and the subpixel 3G1 is adjacent to the subpixel 3R. A column constituted by the subpixel 3B and the subpixel 3G1, and a column constituted by the subpixel 3G2 and the subpixel 3R, which are formed along the row direction, are arranged so as to alternate in the column direction. Accordingly, in the display region, the respective colors of the subpixels 3 repeat in the row direction such that the subpixel 3B and the subpixel 3G1 are arranged in an alternating manner in odd-numbered rows, and the subpixel 3G2 and the subpixel 3R are arranged in an alternating manner in even-numbered rows, for example, in the PenTile arrangement as well, in the same manner as an S-Stripe arrangement. These arrangements make use of the fact that human vision is less sensitive to R and B and more sensitive to G. As illustrated in FIGS. 3 and 12, in these arrangements, each row is constituted by two colors at a time, namely the subpixel 3B and the subpixel 3G1 or the subpixel 3G2 and the subpixel 3R. Also, in each row, subpixels of colors lacking as compared to RGB arrangements are reproduced in a simulated manner through combinations with subpixels in adjacent rows. Thus, in these arrangements, the dot width of the subpixels 3 in each row can be increased in the row direction by an amount corresponding to the subpixels of the colors lacking, as compared to a vertical stripe-type RGB arrangement. Accordingly, a high-resolution organic EL display device 1 can be produced with ease, and a resolution that appears high can be maintained, even with a lower number of pixels.

Unlike an organic EL display device having a known PenTile arrangement, the subpixel 3G1 and the subpixel 3G2 in the organic EL display device 1 according to the present embodiment have a different layered structure, as illustrated in FIGS. 1, 2, 4, and 11.

Manufacturing Method for Organic EL Display Device 1

Figure 13A:
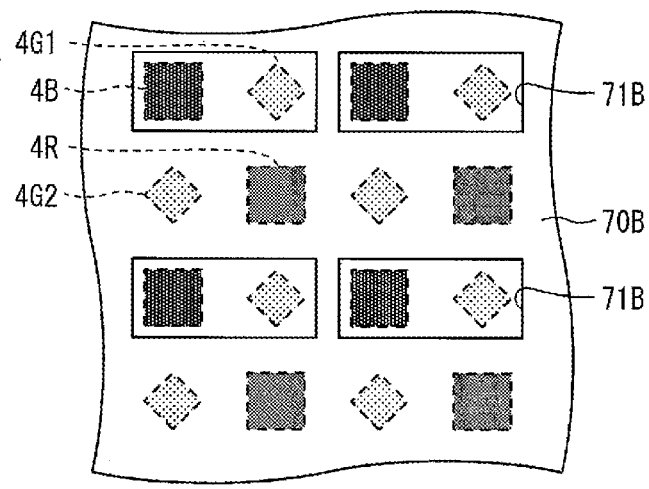
FIGS. 13A to 13C are plan views illustrating processes for producing the light-emitting layer unit in the organic EL display device according to the third embodiment of the disclosure, in the order of those processes.
Figure 13B:
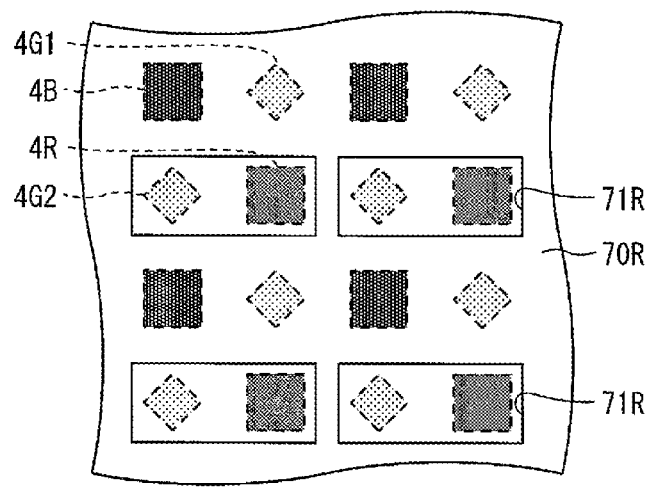
Figure 13C:
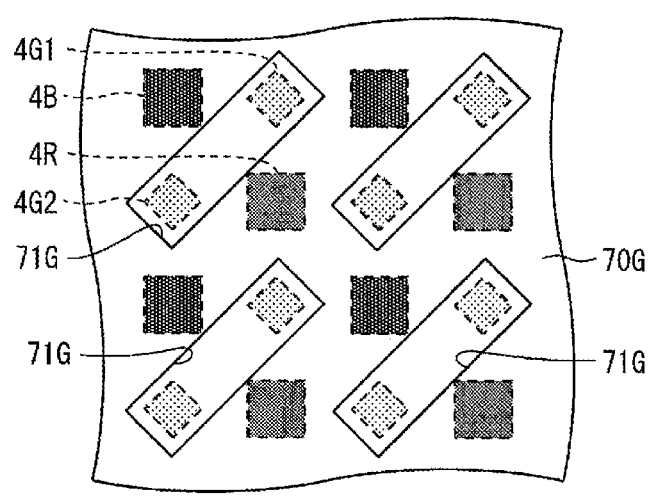

FIGS. 13A to 13C are plan views illustrating processes for producing the light-emitting layer unit 33 in the organic EL display device 1 according to the present embodiment, in the order of those processes. Note that in FIGS. 13A to 13C, the same hatching as that indicated in FIG. 12 has been added to the light emitting regions 4 for the purpose of identifying the light emitting region 4B, the light emitting region 4G1, the light emitting region 4G2, and the light emitting region 4R. The actual deposition is carried out through openings 71B, 71R, and 71G in vapor deposition masks 70B, 70R, and 70G, respectively. As described earlier, the light emitting region 4B, the light emitting region 4G1, the light emitting region 4G2, and the light emitting region 4R are positioned within the subpixel 3B, the subpixel 3G1, the subpixel 3G2, and the subpixel 3R, respectively, in that order.

In the manufacturing method for the organic EL display device 1 according to the present embodiment, when forming the bank 15, the bank 15 is patterned and formed so that the opening 15a corresponding to the light emitting region 4 is formed; and as illustrated in FIG. 13C, in the green fluorescent light-emitting layer formation process (S7), a vapor deposition mask 70G having a different opening pattern than the vapor deposition mask 70G according to the first embodiment is used. Aside from these points, however, the manufacturing method according to the present embodiment is the same as the manufacturing method for the organic EL display device 1 according to the first and second embodiments. In the manufacturing method for the organic EL display device 1 according to the present embodiment, vapor deposition is carried out using the vapor deposition masks 70B, 70R, and 70G illustrated in FIGS. 13A to 13C in the blue fluorescent light-emitting layer formation process (S4) to the green fluorescent light-emitting layer formation process (S7) illustrated in FIG. 10.

According to the present embodiment, in the blue fluorescent light-emitting layer formation process (S4), the material of the blue fluorescent light-emitting layer 34B is linearly-deposited in the direction connecting the subpixel 3B and the subpixel 3G1 using, as the vapor deposition mask 70B, a vapor deposition mask 70B similar to the vapor deposition mask 70B illustrated in FIG. 9A, in which a plurality of the openings 71B are provided in the row direction and the column direction for two subpixels, corresponding to the subpixel 3B and the subpixel 3G1 in each pixel 2; as a result, the blue fluorescent light-emitting layer 34B is formed in the light emitting region 4B and the light emitting region 4G1 indicated by the broken lines, as illustrated in FIG. 13A. In the present embodiment, like in the first embodiment, the blue fluorescent light-emitting layer 34B is formed on the hole transport layer 32 as an intermittent stripe following the row direction, by linearly depositing the material of the blue fluorescent light-emitting layer 34B in subpixel columns of odd-numbered rows constituted by the subpixel 3B and the subpixel 3G1

Additionally, in the red light-emitting layer formation process (S5) and the separation layer formation process (S6), the material of the red light-emitting layer 34R and the material of the separation layer 35 are linearly-deposited in the direction connecting the subpixel 3G2 and the subpixel 3R using, as the vapor deposition mask 70R, a vapor deposition mask 70R similar to the vapor deposition mask 70R illustrated in FIG. 9A, in which a plurality of the openings 71R are provided in the row direction and the column direction for two subpixels, corresponding to the subpixel 3G2 and the subpixel 3R in each pixel 2; as a result, the red light-emitting layer 34R and the separation layer 35 are formed in the light emitting region 4G2 and the light emitting region 4R indicated by the broken lines, as illustrated in FIG. 13B. In the present embodiment, the red light-emitting layer 34R is formed on the hole transport layer 32 as an intermittent stripe, parallel to the blue fluorescent light-emitting layer 34B and following the row direction, by linearly depositing the material of the red light-emitting layer 34R in subpixel columns of even-numbered rows constituted by the subpixel 3G2 and the subpixel 3R. The separation layer 35 having the same pattern as the red light-emitting layer 34R is layered on the red light-emitting layer 34R when viewed in a plan view.

However, in the present embodiment too, the red light-emitting layer 34R and the separation layer 35 may of course be patterned and formed using separate dedicated vapor deposition masks having the same opening pattern, in the same manner as in the first embodiment.

In the green fluorescent light-emitting layer formation process (S7), the material of the green fluorescent light-emitting layer 34G is linearly-deposited in the direction connecting the adjacent subpixel 3G1 and subpixel 3G2 in each pixel 2 (i.e., the direction connecting the subpixel 3G1 and the subpixel 3G2 that are directly adjacent) using, as the vapor deposition mask 70G, a vapor deposition mask 70G in which a plurality of the openings 71G are provided in the aforementioned oblique direction for two subpixels, corresponding to the subpixel 3G1 and the subpixel 3G2 in each pixel 2; as a result, the green fluorescent light-emitting layer 34G is formed in the light emitting region 4G1 and the light emitting region 4G2 indicated by the broken lines, as illustrated in FIG. 13C. Accordingly, the green fluorescent light-emitting layer 34G is formed, as an intermittent stripe following the oblique direction, on the hole transport layer 32, overlapping the blue fluorescent light-emitting layer 34B in the subpixel 3G1 and overlapping the separation layer 35 in the subpixel 3G2.

The present embodiment describes an example in which a vapor deposition mask 70G in which a plurality of the openings 71G are provided in the oblique direction is used as the vapor deposition mask 70G, as described above. However, in the green fluorescent light-emitting layer formation process (S7), the blue fluorescent light-emitting layer 34B, the green fluorescent light-emitting layer 34G, and the red light-emitting layer 34R may be linearly-deposited by using a vapor deposition mask 70G similar to the vapor deposition mask 70G used in the first embodiment and linearly-depositing a film formed substrate (a function layer formed substrate, which here is the TFT substrate 10 on which the separation layer 35 is formed through the processes up to the separation layer formation process (S6) immediately before the green fluorescent light-emitting layer formation process (S7)) after being rotated 45 degrees relative to the vapor deposition mask 70G.

Additionally, when forming the green fluorescent light-emitting layer 34G, a normal vapor deposition mask having an opening pattern in which individual openings 71G are provided for each subpixel may be used as the vapor deposition mask 70G. In other words, the function layers constituting the light-emitting layer unit 33, aside from the green fluorescent light-emitting layer 34G, may be vapor-deposited using a vapor deposition mask having an opening pattern in which two subpixels' worth of openings are provided in the above-described directions, and only the green fluorescent light-emitting layer 34G may be vapor-deposited using the above-described normal vapor deposition mask.

According to the present embodiment, employing a Pen-Tile type pixel arrangement makes it possible to improve the apparent resolution.

Normally, in an organic EL display device having a PenTile arrangement, linear deposition can only be carried out for subpixel columns constituted by green subpixels. However, according to the present embodiment, all of the layers constituting the light-emitting layer unit 33 can be linearly deposited. The organic EL display device 1 according to the present embodiment simply has a different pixel arrangement, as described above. The display method (display principles) of the organic EL display device 1 is the same as in the first embodiment. Accordingly, the present embodiment can also achieve effects similar to those of the first embodiment.

Fourth Embodiment

A description follows regarding yet another embodiment of the disclosure, primarily on the basis of FIGS. 14A to 14C.

The present embodiment will describe differences from the first to third embodiments, and constituent elements having the same functions as the constituent elements described in the first to third embodiments will be assigned the same reference signs, with descriptions thereof omitted. It goes without saying that the same modifications as those of the first to third embodiments can be applied to the present embodiment as well.

The organic EL display device 1 according to the present embodiment differs from the organic EL display device 1 according to the first embodiment in that a TADF material is used for the blue fluorescent luminescent material.

FIG. 14A is a diagram illustrating Förster transfer, FIG. 14B is a diagram illustrating Dexter transfer (Dexter-type energy transfer), and FIG. 14C is a diagram illustrating a TADF material.

As illustrated in FIG. 14A, in Förster transfer using the Förster mechanism (dipole-dipole interaction), acceptor electrons in the HOMO (highest occupied molecular orbital) level resonate with dipole vibrations of donor electrons excited at the LUMO (lowest unoccupied molecular orbital) level and change to wave motion at the LUMO level, and are excited from a ground state (singlet ground state) to an excited singlet state. In this manner, energy of light absorbed by the donors in the excited singlet state is transferred to the acceptors, and when the acceptors are fluorescent molecules, the acceptors give out fluorescent light. Note that in FIG. 14A, $^1D^*$ indicates the donor excited singlet state, and $^1A$ indicates the acceptor ground state (singlet ground state).

In Förster transfer, excitation energy moves directly between two adjacent colorant molecules due to electron resonance, and thus direct contact between colorant molecules is not required for energy transfer. Förster transfer can occur as long as the distance between the donor and acceptor is within an effective radius (Förster radius).

As illustrated in FIG. 14B, in Dexter transfer using the Dexter mechanism (electron exchange interaction), overlapping orbits between colorant molecules caused by collisions between colorant molecules results in the exchange of donor electrons in an excited triplet state and acceptor electrons in a triplet ground state, which produces energy transfer. Note that in FIG. 14B, $^3D^*$ indicates the donor excited triplet state, and $^3A$ indicates the acceptor ground state (triplet ground state).

In Dexter transfer, collision between colorant molecule is required, and thus it is necessary for the colorant molecules to be in contact with each other.

Normally, in an organic EL element, electrons and holes are injected into the light-emitting layer and recombine to generate excitons, and the light given out when the excitons are deactivated is utilized. Here, the probability of the excitons being generated in the excited singlet state is 25%, and the probability of the excitons being generated in the excited triplet state is 75%.

However, as illustrated in FIG. 14A, a transition from the excited singlet state ($S_1$ level) to the ground state ($S_0$ level) is a permitted transition between states having the same spin multiplicity, whereas as illustrated in FIG. 14B, a transition from the excited triplet state ($T_1$ level) to the ground state ($S_0$ level) is a prohibited transition between states having different spin multiplicities. Therefore, the triplet excitons generated at the $T_1$ level change to thermal energy or the like and deactivate as heat, without emitting light, and therefore do not contribute to light emission. There is thus a problem in that the light emission efficiency of a normal fluorescent luminescent material drops when excitons are generated at the $T_1$ level.

Furthermore, Förster transfer from a given material in an excited triplet state (one of two adjacent colorant molecules) to another material in an excited triplet state (the other of the two adjacent colorant molecules) is prohibited, and only Dexter transfer occurs. Thus, when excitons have been generated at the $T_1$ level, energy is transferred only to molecules in direct contact.

Thus, in the subpixel 3G1, when excitons are generated in the blue fluorescent light-emitting layer 34B, no energy is transferred from the blue fluorescent luminescent material at the $T_1$ level to the green fluorescent luminescent material. Energy is only transferred from the blue fluorescent luminescent material at the $S_1$ level to the green fluorescent luminescent material at the $S_1$ level, and thus in the subpixel 3G1, it is possible that color mixing, a drop in the light emission efficiency, or the like will arise.

Accordingly, the blue fluorescent luminescent material used for the blue fluorescent light-emitting layer 34B is preferably a TADF material.

As described in the first embodiment, a TADF material has an extremely low $\Delta E_{ST}$, and as illustrated in FIG. 14C, reverse intersystem crossing from the $T_1$ level to the $S_1$ level arises in a TADF material. Thus, in a case where a TADF material is used for the blue fluorescent luminescent material, excitons at the $T_1$ level are upconverted to the $S_1$ level through the reverse intersystem crossing.

Thus, in the case where a TADF material is used for the blue fluorescent luminescent material, even in a case where, for example, excitons have been generated in the blue fluorescent light-emitting layer 34B of the subpixel 3G1, energy will be transferred from the blue fluorescent luminescent material to the green fluorescent luminescent material due to Förster transfer between $S_1$ levels resulting from the reverse intersystem crossing from the $T_1$ level to the $S_1$ level. Accordingly, using a TADF material for the blue fluorescent luminescent material makes it possible to suppress blue color mixing in the subpixel 3G1 and thus improve the color level in the subpixel 3G1.

Additionally, using a TADF material for the blue fluorescent luminescent material results in excitons at the $T_1$ level being upconverted to the $S_1$ level in the subpixel 3B, which improves the light emission efficiency in the subpixel 3B and in turn improves the light emission efficiency of the organic EL display device 1. For the same reason, a TADF material may be used for the green fluorescent luminescent material. In this case, in the subpixels 3G1 and 3G2, excitons at the $T_1$ level are upconverted to the $S_1$ level, which improves the light emission efficiency in the subpixels 3G1 and 3G2 and in turn improves the light emission efficiency of the organic EL display device 1. Of course, a TADF material may be used as the red luminescent material, as described earlier, to improve the light emission efficiency in the subpixel 3R.

The above-described 2CzPN, DMAC-DPS, and the like can be given as examples of TADF materials that emit blue light. The above-described 4CzIPN, 4CzPN, PXZ-DPS, and the like can be given as examples of TADF materials that emit green light.

In the present embodiment, an organic EL display device 1 having the same conditions as in Example 1 was produced as an example, with the exception of the blue fluorescent light-emitting layer 34B being formed from mCP (host material, 90%)/DMAC-DPS (blue fluorescent luminescent material, 10%) instead of ADN (host material, 90%)/TBPe (blue fluorescent luminescent material, 10%).

Fifth Embodiment

Yet another embodiment of the disclosure will be described below with reference primarily to FIGS. 1, 2, 4, and 10. The present embodiment will describe differences from the first to fourth embodiments, and constituent elements having the same functions as the constituent elements described in the first to fourth embodiments will be assigned the same reference signs, with descriptions thereof omitted. It goes without saying that the same modifications as those of the first to fourth embodiments can be applied to the present embodiment as well.

The organic EL display device 1 according to the present embodiment has the same layered structure as the layered structure illustrated in FIGS. 1, 2, and 4. As illustrated in FIG. 1, in the organic EL display device 1 having such a layered structure, it is necessary, in the subpixel 3G2, for holes and electrons to recombine and generate excitons to emit green light in the green fluorescent light-emitting layer 34G on the cathode electrode side of the separation layer 35 (i.e., the second electrode 23). Additionally, in the subpixel 3R, it is necessary for holes and electrons to recombine and generate excitons to emit red light in the red light-emitting layer 34R on the anode electrode side of the separation layer 35 (i.e., the first electrode 21).

It is therefore desirable that the separation layer 35 exhibit bipolar transport properties, where both the hole transport properties and the electron transport properties are high, as described in the first embodiment.

Accordingly, in the present embodiment, the carrier transport properties are adjusted by forming the separation layer 35 from a plurality of materials.

In particular, when the separation layer 35 is provided on the red light-emitting layer 34R in the subpixel 3R, as illustrated in FIGS. 1, 2, and 4, there is a concern that the light emission efficiency will drop due to excessive flow of holes from the red light-emitting layer 34R to the separation layer 35. Accordingly, it is desirable that the combination ratio of the electron transporting material in the separation layer 35 be greater than the combination ratio of the hole transporting material.

In this manner, forming the separation layer 35 from a plurality of materials having different carrier transport properties makes it easier to control the carrier transport properties, and makes it possible to more easily improve the light emission efficiency of the respective colors, than when forming the separation layer 35 from a single type of material having bipolar transport properties.

In the present embodiment, the reflective electrode 21a, the light-transmissive electrode 21b, the hole injection layer 31, the hole transport layer 32, the blue fluorescent light-emitting layer 34B, the red light-emitting layer 34R, the separation layer 35, the green fluorescent light-emitting layer 34G, the electron transport layer 36, the electron injection layer 37, the second electrode 23, and the protection layer 24 are layered, in that order from the TFT substrate 10 side, on the TFT substrate 10, on the basis of the flowchart illustrated in FIG. 10, as illustrated in FIG. 4.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 3

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)

Hole transport layer 32: TCTA (20 nm)

Blue fluorescent light-emitting layer 34B: mCP (host material, 90%)/DMAC-DPS (blue fluorescent luminescent material, 10%) (10 nm)

Red light-emitting layer 34R: CBP (host material 90%)/Ir(piq)3 (red luminescent material, 10%) (10 nm)

Separation layer 35: BCP (70%)/TPD (30%) (10 nm)

Green fluorescent light-emitting layer 34G: TPD (host material, 90%)/coumarin 6 (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

As described above, according to the present embodiment, the separation layer 35 is formed as a mixed layer of BCP, which is an electron transporting material, and TPD, which is a hole transporting material, with a greater amount of BCP being used than TPD.

Sixth Embodiment

A description follows regarding still another embodiment of the disclosure, primarily on the basis of FIGS. 3, 10, 12, and 15 to 17. The present embodiment will describe differences from the first to fifth embodiments, and constituent elements having the same functions as the constituent elements described in the first to fifth embodiments will be assigned the same reference signs, with descriptions thereof omitted. It goes without saying that the same modifications as those of the first to fifth embodiments can be applied to the present embodiment as well.

Overall Configuration of Organic EL Display Device 1

Figure 15:
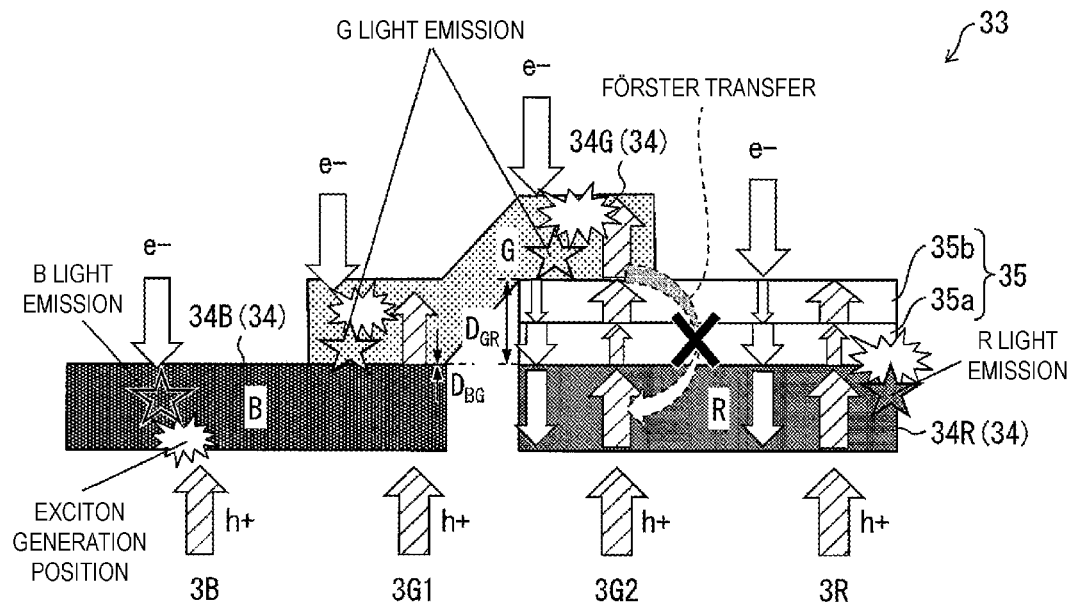
FIG. 15 is a diagram schematically illustrating the principle of light emission by a light-emitting layer unit of an organic EL display device according to a sixth embodiment of the disclosure.
Figure 16:
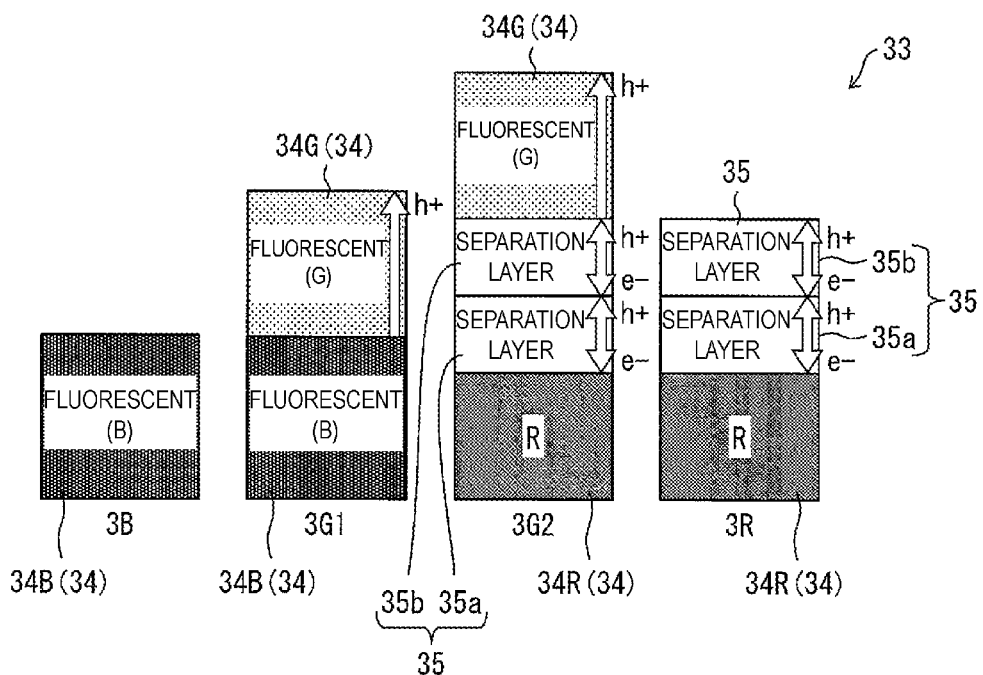
FIG. 16 is a diagram schematically illustrating a layered structure in the light-emitting layer unit of the organic EL display device according to the sixth embodiment of the disclosure.
Figure 17:
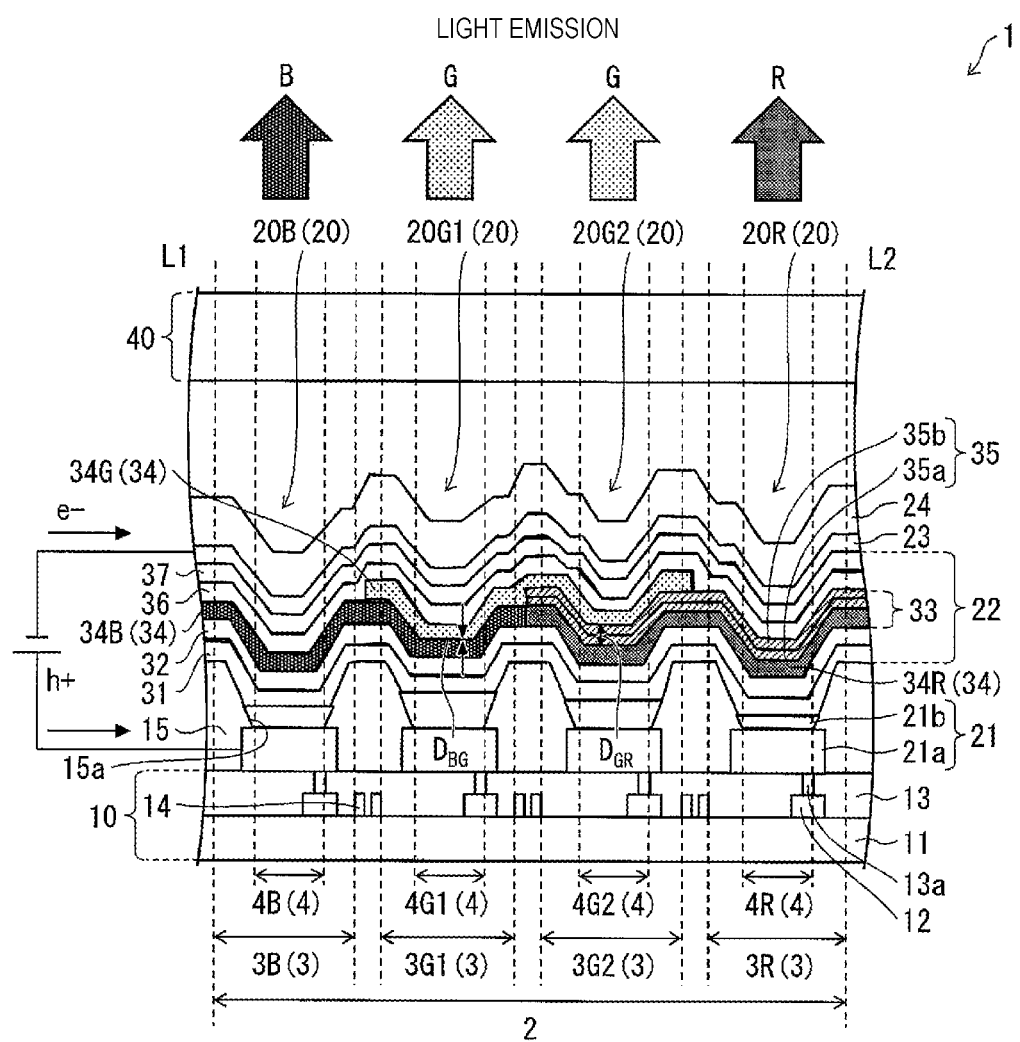
FIG. 17 is a cross-sectional view illustrating an example of the overall configuration of the organic EL display device according to the sixth embodiment of the disclosure.

FIG. 15 is a diagram schematically illustrating the principle of light emission by the light-emitting layer unit 33 of the organic EL display device 1 according to the present embodiment. FIG. 16 is a diagram schematically illustrating the layered structure of the light-emitting layer unit 33 of the organic EL display device 1 according to the present embodiment. FIG. 17 is a cross-sectional view illustrating an example of the overall configuration of the organic EL display device 1 according to the present embodiment. Note that FIG. 17 illustrates an example of the overall configuration of a single pixel area, corresponding to a cross-section taken along the line L1-L2 indicated in FIG. 3 or FIG. 12.

The organic EL display device 1 according to the present embodiment is the same as the organic EL display device 1 according to the first to fifth embodiments, aside from the separation layer 35 being a layered body constituted by a plurality of layers.

As illustrated in FIGS. 15 to 17, the separation layer 35 according to the present embodiment has a dual-layer structure including a first separation layer 35a and a second separation layer 35b. As illustrated in FIGS. 15 and 16, the first separation layer 35a and the second separation layer 35b have mutually-different carrier transport properties. When the first separation layer 35a and the second separation layer 35b have mutually-different carrier transport properties in this manner, the luminescent colors displayed by the subpixels 3 can be obtained with a higher level of efficiency.

For example, making the combination ratio of the electron transporting material higher than the combination ratio of the hole transporting material in the first separation layer 35a located on the first electrode 21 (anode electrode) side makes it possible to suppress hole leakage from the red light-emitting layer 34R adjacent to the first separation layer 35a. On the other hand, making the combination ratio of the hole transporting material higher than the combination ratio of the electron transporting material in the second separation layer 35b located on the second electrode 23 (cathode electrode) side makes it possible to suppress electron leakage from the green fluorescent light-emitting layer 34G adjacent to the second separation layer 35b. Accordingly, in the subpixel 3R, a drop in the light emission efficiency of the red luminescent material caused by hole leakage from the red light-emitting layer 34R can be suppressed, and in the subpixel 3G2, a drop in the light emission efficiency of the green fluorescent luminescent material caused by electron leakage from the green fluorescent light-emitting layer 34G can be suppressed.

As described above, as long as the opposing surface distance $D_{GR}$ in the subpixel 3G2 is greater than the Förster radius, no energy will be transferred (through Förster transfer or Dexter transfer) from the green fluorescent light-emitting layer 34G to the red light-emitting layer 34R in the subpixel 3G2.

Accordingly, when the separation layer 35 is a layered body constituted by a plurality of layers as described above, the thickness of each layer constituting the separation layer 35 may be less than or equal to the Förster radius as long as the thickness of the layered body (i.e., the total thickness of the layers constituting the separation layer 35) is greater than the Förster radius.

For example, even in a case where both the thickness of the first separation layer 35a and the thickness of the second separation layer 35b described above are less than or equal to the Förster radius, energy transfer between the green fluorescent light-emitting layer 34G and the red light-emitting layer 34R in the subpixel 3G2 can be inhibited as illustrated in FIG. 15, and an effect of suppressing color mixing in the subpixel 3G2 can be achieved, as long as the thickness of the separation layer 35 constituted by the first separation layer 35a and the second separation layer 35b (i.e., the total thickness of the first separation layer 35a and the second separation layer 35b) is greater than the Förster radius.

Manufacturing Method for Organic EL Display Device 1

In the present embodiment, the separation layer 35 is constituted by the first separation layer 35a and the second separation layer 35b as described above, and as such, the separation layer formation process (S6) indicated in FIG. 10 includes a first separation layer formation process and a second separation layer formation process.

The first separation layer 35a and the second separation layer 35b both have the same pattern as the red light-emitting layer 34R when viewed in a plan view.

Accordingly, in the first separation layer formation process and the second separation layer formation process, the material of the first separation layer 35a and the material of the second separation layer 35b, respectively, can be linearly deposited in a direction connecting the subpixel 3R and the subpixel 3G2, using the vapor deposition mask 70R for forming the red light-emitting layer. Accordingly, the first separation layer 35a and the second separation layer 35b having the same pattern as the red light-emitting layer 34R when viewed in a plan view can be layered upon the red light-emitting layer 34R.

The present embodiment describes, as an example, a case where the red light-emitting layer 34R, the first separation layer 35a, and the second separation layer 35b have the same pattern when viewed in a plan view, so that the red light-emitting layer 34R, the first separation layer 35a, and the second separation layer 35b are formed consecutively using the same vapor deposition mask 70R. However, the present embodiment is not limited thereto. The red light-emitting layer 34R, the first separation layer 35a, and the second separation layer 35b may be patterned and formed using separate dedicated vapor deposition masks having the same opening pattern.

In the present embodiment, the reflective electrode 21a, the light-transmissive electrode 21b, the hole injection layer 31, the hole transport layer 32, the blue fluorescent light-emitting layer 34B, the red light-emitting layer 34R, the first separation layer 35a, the second separation layer 35b, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 4

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)

Hole transport layer 32: TCTA (20 nm)

Blue fluorescent light-emitting layer 34B: mCP (host material, 90%)/DMAC-DPS (blue fluorescent luminescent material, 10%) (10 nm)

Red light-emitting layer 34R: CBP (host material 90%)/Ir(piq)3 (red luminescent material, 10%) (10 nm)

First separation layer 35a: BCP (80%)/TPD (20%) (10 nm)

Second separation layer 35b: BCP (30%)/TPD (70%) (10 nm)

Green fluorescent light-emitting layer 34G: TPD (host material, 90%)/coumarin 6 (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

As described above, in the present embodiment, the separation layer 35 is given a dual-layer structure including the first separation layer 35a and the second separation layer 35b, and the thickness of the separation layer 35 is set to greater than or equal to 15 nm. In the present embodiment as well, the thickness of the separation layer 35 constituted by the first separation layer 35a and the second separation layer 35b is preferably less than or equal to 50 nm, and more preferably less than or equal to 30 nm. It is therefore desirable that the thickness of the first separation layer 35a and the thickness of the second separation layer 35b be set to satisfy the above-describe ranges.

Seventh Embodiment

A description follows regarding still another embodiment of the disclosure, primarily on the basis of FIGS. 10 and 18 to 20. The present embodiment will describe differences from the first to sixth embodiments, and constituent elements having the same functions as the constituent elements described in the first to sixth embodiments will be assigned the same reference signs, with descriptions thereof omitted.

It goes without saying that the same modifications as those of the first to sixth embodiments can be applied to the present embodiment as well.

Overall Configuration of Organic EL Display Device 1

Figure 18:
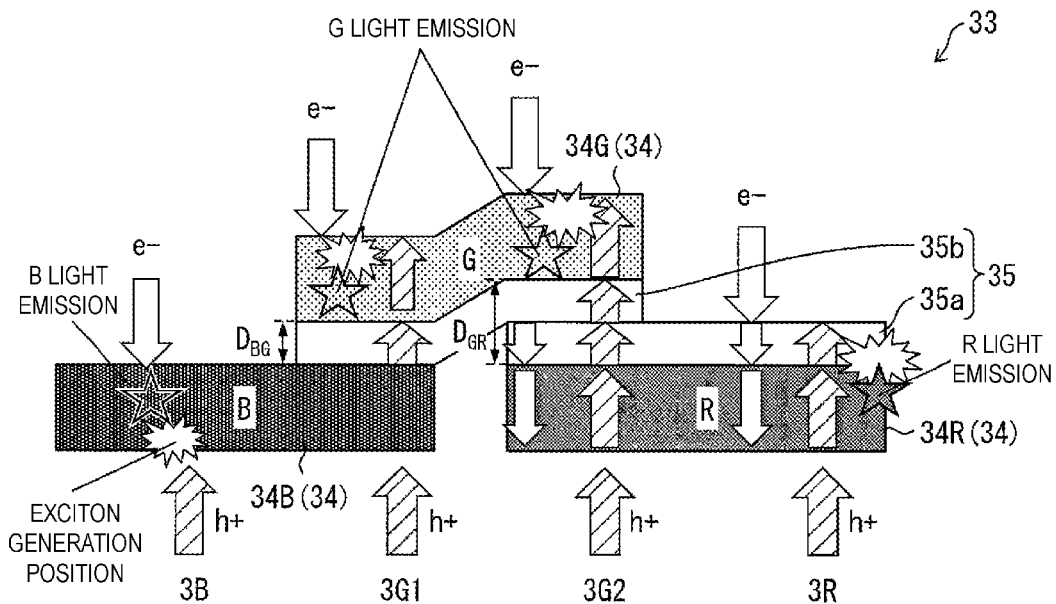
FIG. 18 is a diagram schematically illustrating the principle of light emission by a light-emitting layer unit of an organic EL display device according to a seventh embodiment of the disclosure.
Figure 19:
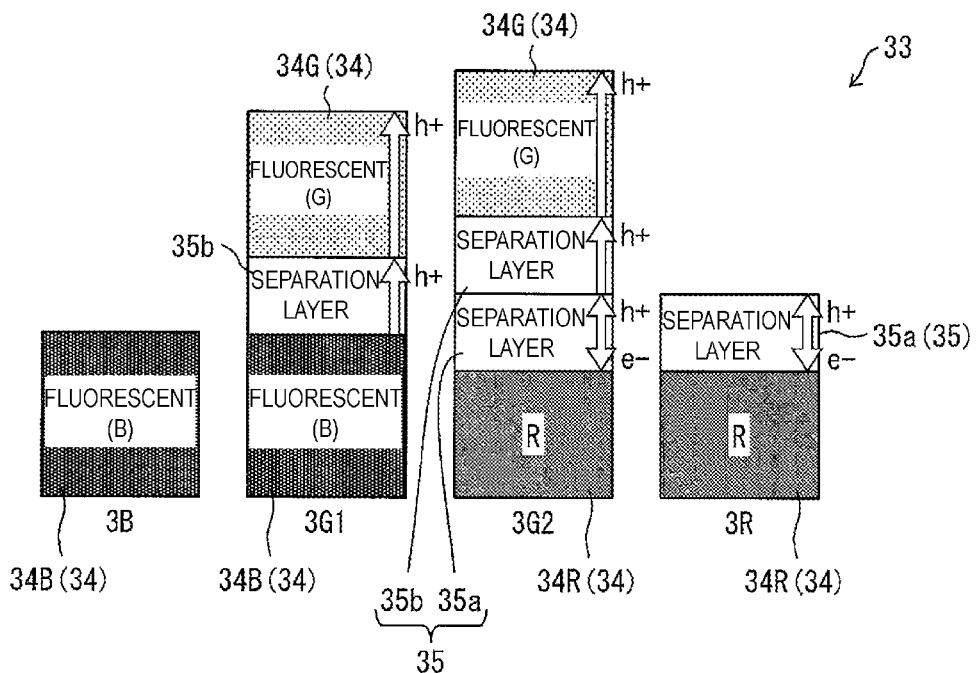
FIG. 19 is a diagram schematically illustrating a layered structure in a light-emitting layer unit of an organic EL display device according to a seventh embodiment of the disclosure.
Figure 20:
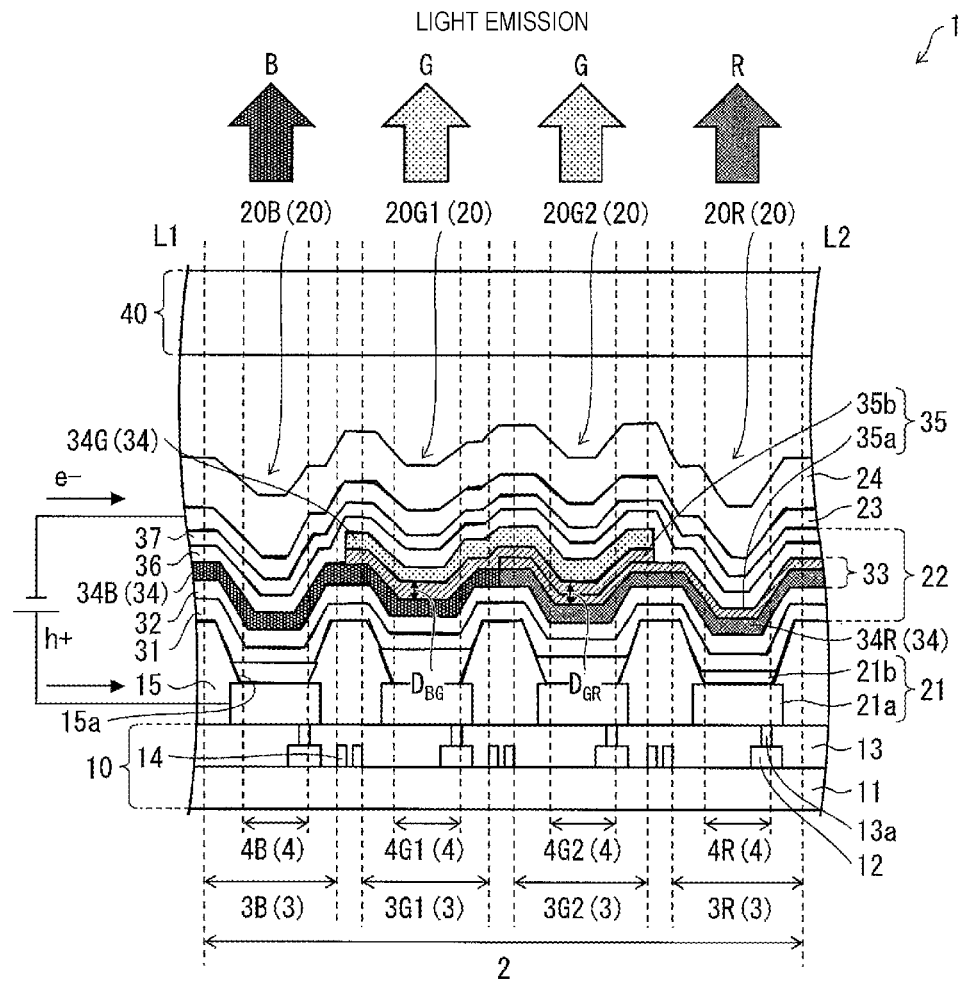
FIG. 20 is a cross-sectional view illustrating an example of the overall configuration of the organic EL display device according to the seventh embodiment of the disclosure.

FIG. 18 is a diagram schematically illustrating the principle of light emission by the light-emitting layer unit 33 of the organic EL display device 1 according to the present embodiment. FIG. 19 is a diagram schematically illustrating the layered structure of the light-emitting layer unit 33 of the organic EL display device 1 according to the present embodiment. FIG. 20 is a cross-sectional view illustrating an example of the overall configuration of the organic EL display device 1 according to the present embodiment. Note that FIG. 20 illustrates an example of the overall configuration of a single pixel area, corresponding to a cross-section taken along the line L1-L2 indicated in FIG. 3 or FIG. 12.

As illustrated in FIGS. 18 to 20, the organic EL display device 1 according to the present embodiment has the same configuration as the organic EL display device 1 according to the sixth embodiment, aside from a film formation region of the first separation layer 35a being shifted from a film formation region of the second separation layer 35b (to rephrase, aside from a film formation range being different between the first separation layer 35a and the second separation layer 35b).

In the present embodiment, the first separation layer 35a is provided in common for the subpixel 3G2 and the subpixel 3R, whereas the second separation layer 35b is provided in common for the subpixel 3G1 and the subpixel 3G2. In other words, in the present embodiment, the first separation layer 35a and the second separation layer 35b are formed so as to overlap only in the subpixel 3G2.

As described above, as long as the opposing surface distance $D_{GR}$ in the subpixel 3G2 is greater than the Förster radius, no energy will be transferred (through Förster transfer or Dexter transfer) from the green fluorescent light-emitting layer 34G to the red light-emitting layer 34R in the subpixel 3G2.

Accordingly, the transfer of energy from the green fluorescent light-emitting layer 34G to the red light-emitting layer 34R can be inhibited in the subpixel 3G2 as long as the total thickness of the first separation layer 35a and the second separation layer 35b between the green fluorescent light-emitting layer 34G and the red light-emitting layer 34R in the subpixel 3G2 is greater than the Förster radius. Accordingly, the first separation layer 35a and the second separation layer 35b may be formed at positions shifted as described above, as long as the first separation layer 35a and the second separation layer 35b are provided so that the first separation layer 35a and the second separation layer 35b are located between the green fluorescent light-emitting layer 34G and the red light-emitting layer 34R in the subpixel 3G2.

When the second separation layer 35b is provided as a common layer for the subpixel 3G1 and the subpixel 3G2 as described above, the second separation layer 35b will be disposed between the blue fluorescent light-emitting layer 34B and the green fluorescent light-emitting layer 34G in the subpixel 3G1, as illustrated in FIGS. 18 to 20, in a case where the separation layer formation process (S6) is carried out between the blue fluorescent light-emitting layer formation process (S4) and the green fluorescent light-emitting layer formation process (S7) as indicated in FIG. 10.

In a case where some of the function layers constituting the separation layer 35 are disposed as intermediate layers between the blue fluorescent light-emitting layer 34B and the green fluorescent light-emitting layer 34G in the subpixel 3G1 in this manner, Förster transfer between the blue fluorescent light-emitting layer 34B and the green fluorescent light-emitting layer 34G cannot be utilized in a case where the thickness of the intermediate layers is greater than the Förster radius.

To use Förster transfer between the blue fluorescent light-emitting layer 34B and the green fluorescent light-emitting layer 34G in the subpixel 3G1, it is necessary for the opposing surface distance $D_{BG}$ in the subpixel 3G1 to be less than or equal to the Förster radius.

Accordingly, when the second separation layer 35b is disposed between the blue fluorescent light-emitting layer 34B and the green fluorescent light-emitting layer 34G in the subpixel 3G1 as described above, it is necessary for the thickness of the second separation layer 35b to be less than or equal to the Förster radius. Thus, in this case, the thickness of the second separation layer 35b is preferably less than or equal to 10 nm, and more preferably less than or equal to 5 nm.

On the other hand, the first separation layer 35a may have a thickness less than or equal to the Förster radius as long as the total thickness of the first separation layer 35a and the second separation layer 35b is set to exceed the Förster radius, or the first separation layer 35a alone may have a thickness exceeding the Förster radius.

However, in a case where the layering order of the function layers constituting the light-emitting layer unit 33 is changed, and the blue fluorescent light-emitting layer formation process (S4) and the green fluorescent light-emitting layer formation process (S7) are carried out consecutively, the blue fluorescent light-emitting layer 34B and the green fluorescent light-emitting layer 34G will be in direct contact regardless of whether the blue fluorescent light-emitting layer formation process (S4) or the green fluorescent light-emitting layer formation process (S7) is carried out first. Thus, in a case where the layering order of the function layers constituting the light-emitting layer unit 33 are changed so that the blue fluorescent light-emitting layer 34B and the green fluorescent light-emitting layer 34G are adjacent, the respective thicknesses of the first separation layer 35a and the second separation layer 35b may be thicknesses less than or equal to the Förster radius, or the thicknesses of those layers alone may exceed the Förster radius, as long as the total thickness of the first separation layer 35a and the second separation layer 35b is set to exceed the Förster radius.

Setting the film formation range of the first separation layer 35a and the film formation region of the second separation layer 35b to different film formation ranges so that the first separation layer 35a and the second separation layer 35b overlap only in the subpixel 3G2 makes it possible to more easily control carrier balance in the subpixel 3G2 and the subpixel 3R.

For example, when the first separation layer 35a is provided in common for the subpixel 3G2 and the subpixel 3R and the second separation layer 35b is provided in common for the subpixel 3G1 and the subpixel 3G2 as illustrated in FIG. 18, in a case where the first separation layer 35a is constituted by a bipolar transporting material and the second separation layer 35b is constituted by a hole transporting material as indicated in FIGS. 18 and 19, holes and electrons will recombine easily in the green fluorescent light-emitting layer 34G of the subpixels 3G1 and 3G2, and holes and electrons will recombine easily in the red light-emitting layer 34R of the subpixel 3R.

Accordingly, employing the above-described configuration makes it possible to more easily improve the light emission efficiency of the respective colors and suppress color mixing.

Manufacturing Method for Organic EL Display Device 1

As in the sixth embodiment, in the present embodiment, the separation layer 35 is constituted by the first separation layer 35a and the second separation layer 35b as described above, and as such, the separation layer formation process (S6) indicated in FIG. 10 includes a first separation layer formation process and a second separation layer formation process.

In the present embodiment, the first separation layer 35a is provided in common for the subpixel 3G2 and the subpixel 3R as described above, and as a result, the red light-emitting layer 34R and the first separation layer 35a adjacent to the red light-emitting layer 34R have the same pattern when viewed in a plan view.

Additionally, in the present embodiment, the second separation layer 35b is provided in common for the subpixel 3G1 and the subpixel 3G2, and as a result, the green fluorescent light-emitting layer 34G and the second separation layer 35b adjacent to the green fluorescent light-emitting layer 34G have the same pattern when viewed in a plan view.

Accordingly, in the first separation layer formation process, the material of the first separation layer 35a can be linearly deposited in a direction connecting the subpixel 3R and the subpixel 3G2, using the vapor deposition mask 70R for forming the red light-emitting layer. Through this, the first separation layer 35a having the same pattern as the red light-emitting layer 34R when viewed in a plan view can be layered upon the red light-emitting layer 34R.

Additionally, in the second separation layer formation process, the material of the second separation layer 35b can be linearly deposited in a direction connecting the subpixel 3G1 and the subpixel 3G2, using the vapor deposition mask 70G for forming the green fluorescent light-emitting layer. Through this, the second separation layer 35b, and the green fluorescent light-emitting layer 34G layered on the second separation layer 35b and having the same pattern as the second separation layer 35b when viewed in a plan view, can be formed in the subpixel 3G1 and the subpixel 3G2.

The present embodiment describes, as an example, a case where the red light-emitting layer 34R and the first separation layer 35a are formed consecutively using the same vapor deposition mask 70R, and the second separation layer 35b and the green fluorescent light-emitting layer 34G are formed consecutively using the same vapor deposition mask 70G. However, the present embodiment is not limited thereto. The red light-emitting layer 34R and the first separation layer 35a may be patterned and formed using separate dedicated vapor deposition masks having the same opening pattern, and the second separation layer 35b and the green fluorescent light-emitting layer 34G may be patterned and formed using separate dedicated vapor deposition masks having the same opening pattern.

In the present embodiment, the reflective electrode 21a, the light-transmissive electrode 21b, the hole injection layer 31, the hole transport layer 32, the blue fluorescent light-emitting layer 34B, the red light-emitting layer 34R, the first separation layer 35a, the second separation layer 35b, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 5

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 150 nm/subpixel 3G2: 145 nm/subpixel 3R: 50 nm)
Hole injection layer 31: HAT-CN (10 nm)
Hole transport layer 32: TCTA (20 nm)
Blue fluorescent light-emitting layer 34B: mCP (host material, 90%)/DMAC-DPS (blue fluorescent luminescent material, 10%) (10 nm)
Red light-emitting layer 34R: CBP (host material 90%)/Ir(piq)3 (red luminescent material, 10%) (10 nm)
First separation layer 35a: CBP (10 nm)
Second separation layer 35b: TPD (10 nm)
Green fluorescent light-emitting layer 34G: TPD (host material, 90%)/coumarin 6 (green fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

As described above, in the present embodiment, CBP, which is a bipolar transporting material, is used for the material of the first separation layer 35a, and TPD, which is a hole transporting material, is used for the material of the second separation layer 35b. Forming the first separation layer 35a from a bipolar transporting material in this manner makes it easier for holes and electrons to combine in the green fluorescent light-emitting layer 34G of the subpixel 3G1, and makes it easier for holes and electrons to combine in the red light-emitting layer 34R of the subpixel 3R. In the subpixel 3G2, it is easier for holes and electrons to combine in the green fluorescent light-emitting layer 34G, but the second separation layer 35b blocks electrons. Accordingly, it is difficult for holes and electrons to recombine in the red light-emitting layer 34R, and thus only green light is emitted.

Eighth Embodiment

A description follows regarding yet another embodiment of the disclosure, primarily on the basis of FIGS. 3, 10, 12, and 21 to 24B. The present embodiment will describe differences from the first to seventh embodiments, and constituent elements having the same functions as the constituent elements described in the first to seventh embodiments will be assigned the same reference signs, with descriptions thereof omitted. It goes without saying that the same modifications as those of the first to seventh embodiments can be applied to the present embodiment as well.

Overall Configuration of Organic EL Display Device 1

Figure 21:
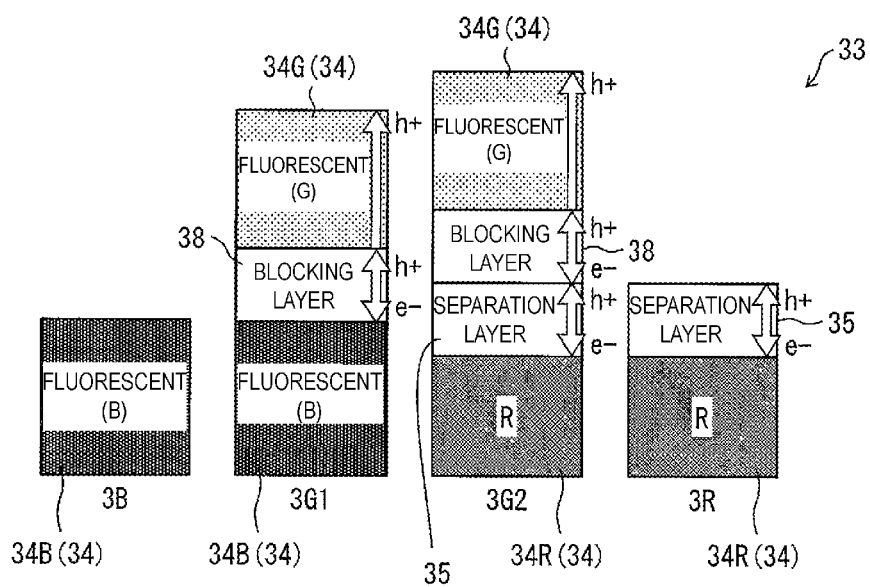
FIG. 21 is a diagram schematically illustrating a layered structure in a light-emitting layer unit of an organic EL display device according to an eighth embodiment of the disclosure.
Figure 22:
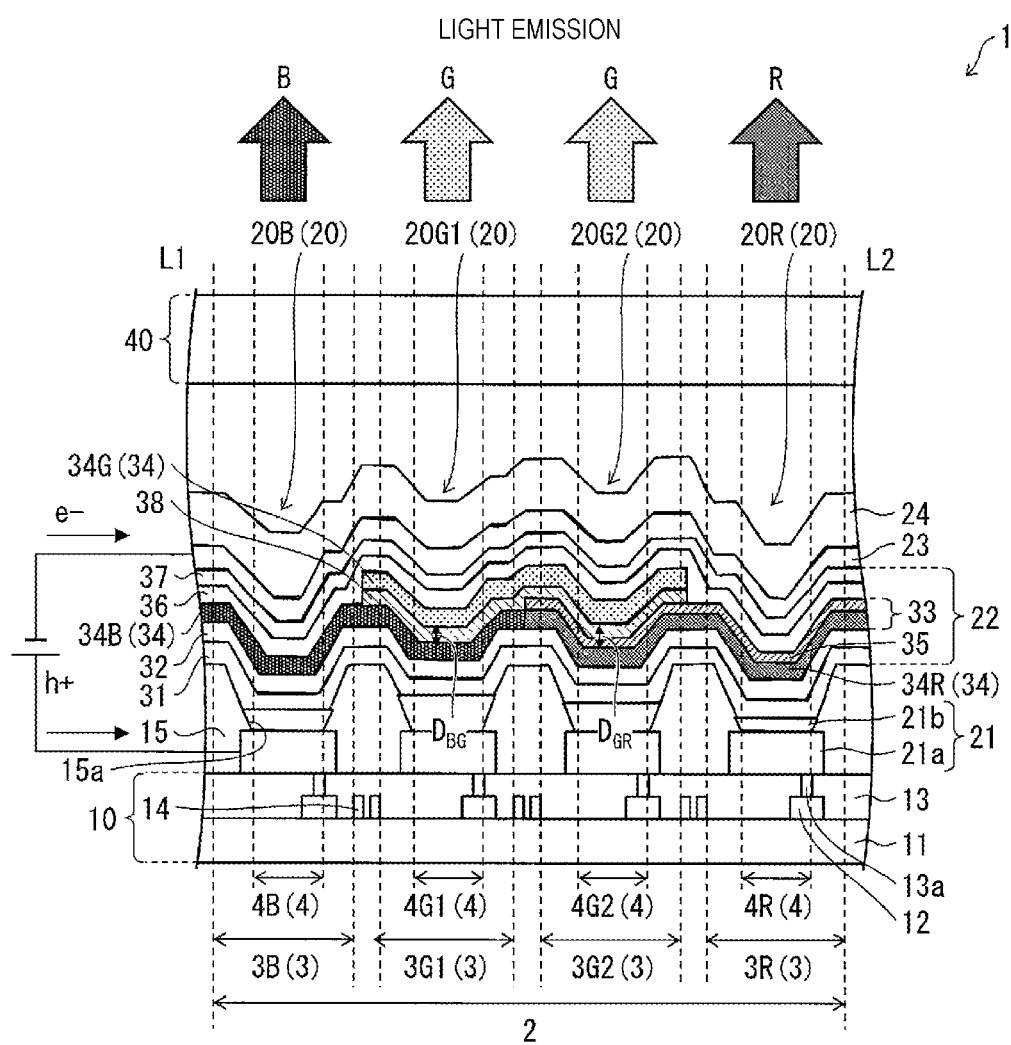
FIG. 22 is a cross-sectional view illustrating an example of the overall configuration of the organic EL display device according to the eighth embodiment of the disclosure.

FIG. 21 is a diagram schematically illustrating the layered structure of the light-emitting layer unit 33 of the organic EL display device 1 according to the present embodiment. FIG. 22 is a cross-sectional view illustrating an example of the overall configuration of the organic EL display device 1 according to the present embodiment. Note that FIG. 22 illustrates an example of the overall configuration of a single pixel area, corresponding to a cross-section taken along the line L1-L2 indicated in FIG. 3 or FIG. 12.

In the subpixel 3G1, in a case where, when energy is transferred from the blue fluorescent luminescent material in the blue fluorescent light-emitting layer 34B to the green fluorescent luminescent material in the green fluorescent light-emitting layer 34G, molecules of the blue fluorescent luminescent material and molecules of the green fluorescent luminescent material come into direct contact, it is possible that Dexter transfer between $T_1$ levels will arise and deactivation will occur as heat without light being emitted.

Accordingly, it is desirable to provide a blocking layer 38 between the blue fluorescent light-emitting layer 34B and the green fluorescent light-emitting layer 34G in the subpixel 3G1, the blocking layer 38 lacking a luminescent material, and having a thickness less than or equal to the Förster radius so as to inhibit Dexter transfer from the blue fluorescent luminescent material in the blue fluorescent light-emitting layer 34B to the green fluorescent luminescent material in the green fluorescent light-emitting layer 34G.

The blocking layer 38 has a thickness less than or equal to the Förster radius, and thus in the subpixel 3G1, Förster transfer from the blue fluorescent luminescent material to the green fluorescent luminescent material is not inhibited, but Dexter transfer is inhibited. Accordingly, providing the thin blocking layer 38, constituted by any desired material, between the blue fluorescent light-emitting layer 34B and the green fluorescent light-emitting layer 34G in the subpixel 3G1 makes it possible to improve the light emission efficiency of the green fluorescent luminescent material in the subpixel 3G1.

The thickness of the blocking layer 38 is equal to the opposing surface distance $D_{BG}$, and it is therefore necessary to set the thickness to be less than or equal to the Förster radius. To reliably ensure Förster transfer, the blocking layer 38 is preferably formed as thin as possible. The thickness of the blocking layer 38 is therefore preferably less than or equal to 10 nm, and more preferably less than or equal to 5 nm.

FIGS. 21 and 22 illustrate, as an example, a case where the blocking layer 38 is provided as a common layer for the subpixel 3G1 and the subpixel 3G2.

When the blocking layer 38 is provided in common for the subpixel 3G1 and the subpixel 3G2 in this manner, it is desirable that the blocking layer 38 have bipolar transport properties or hole transport properties for the blocking layer 38 as a whole, for example. To that end, a material that alone has bipolar transport properties, such as a bipolar transporting material, a material that has bipolar transport properties by combining two or more types of materials, or a material having hole transport properties, is used as the material of the blocking layer 38. Although FIG. 21 illustrates, as an example, a case where the blocking layer 38 is a bipolar transporting material, as indicated by the arrows, it is more preferable that a hole transporting material be used. This makes it easier for the holes and electrons to recombine in the green fluorescent light-emitting layer 34G, in the subpixels 3G1 and 3G2.

Manufacturing Method for Organic EL Display Device 1

Figure 23:
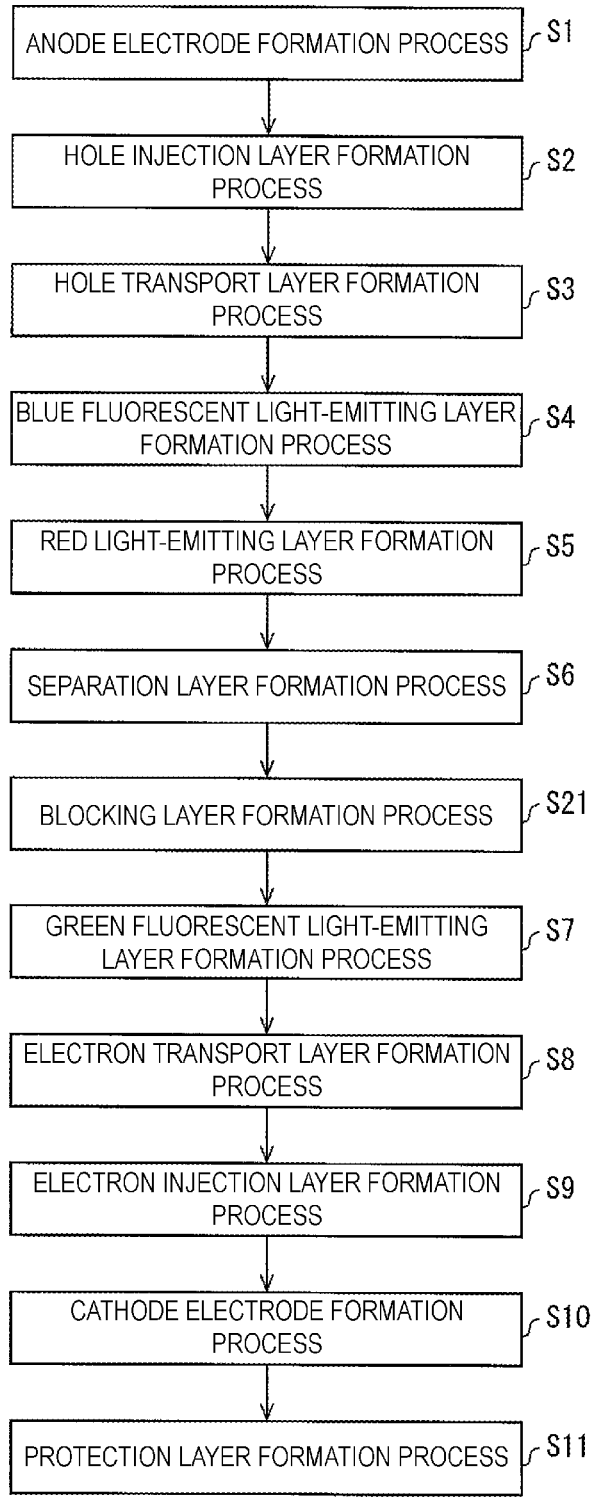
FIG. 23 is a flowchart illustrating the flow of processes for producing main portions of the organic EL display device according to the eighth embodiment of the disclosure.

FIG. 23 is a flowchart illustrating the flow of processes for producing main portions of the organic EL display device 1 according to the present embodiment.

The manufacturing method for the organic EL display device 1 according to the present embodiment is the same as the manufacturing method for the organic EL display devices 1 according to the first to seventh embodiments, aside from the organic EL element preparation process indicated in FIG. 10 including a blocking layer formation process (S21) between the separation layer formation process (S6) and the green fluorescent light-emitting layer formation process (S7), as illustrated in FIG. 23.

In a case where, when the blocking layer 38 is provided as a common layer for the subpixel 3G1 and the subpixel 3G2 as described above, the separation layer formation process (S6) and the blocking layer formation process (S21) are carried out between the red light-emitting layer formation process (S5) and the green fluorescent light-emitting layer formation process (S7) as indicated in FIG. 23, the separation layer 35 and the blocking layer 38 will be disposed between the red light-emitting layer 34R and the green fluorescent light-emitting layer 34G in the subpixel 3G2, as illustrated in FIGS. 21 and 22.

Accordingly, in the organic EL display device 1 illustrated in FIGS. 21 and 22, the separation layer 35 and the blocking layer 38 are provided as an intermediate layer (a first intermediate layer) between the red light-emitting layer 34R and the green fluorescent light-emitting layer 34G in the subpixel 3G2, whereas the blocking layer 38 is provided as an intermediate layer (a second intermediate layer) between the blue fluorescent light-emitting layer 34B and the green fluorescent light-emitting layer 34G in the subpixel 3B.

Accordingly, in the organic EL display device 1 illustrated in FIGS. 21 and 22, the total thickness of the separation layer 35 and the blocking layer 38 corresponds to the opposing surface distance $D_{GR}$ in the subpixel 3G2.

As described above, as long as the opposing surface distance $D_{GR}$ in the subpixel 3G2 is greater than the Förster radius, no energy will be transferred (through Förster transfer or Dexter transfer) from the green fluorescent light-emitting layer 34G to the red light-emitting layer 34R in the subpixel 3G2.

Accordingly, the separation layer 35 may have a thickness less than or equal to the Förster radius as long as the total thickness of the separation layer 35 and the blocking layer 38 is set to exceed the Förster radius, or the separation layer 35 may alone have a thickness exceeding the Förster radius.

In the organic EL display device 1 described in the seventh embodiment and illustrated in FIGS. 18 to 20, the first separation layer 35a is provided in common for the subpixel 3G2 and the subpixel 3R, whereas the second separation layer 35b, which has a thickness less than or equal to the Förster radius, is provided in common for the subpixel 3G1 in the subpixel 3G2. As opposed to this, in the above-described organic EL display device 1 illustrated in FIGS. 21 and 22, the separation layer 35 is provided in common for the subpixel 3G2 and the subpixel 3R, whereas the blocking layer 38, which has a thickness less than or equal to the Förster radius, is provided in common for the subpixel 3G1 and the subpixel 3G2.

The organic EL display device 1 illustrated in FIGS. 18 to 20 and the organic EL display device 1 illustrated in FIGS. 21 and 22 therefore have substantially the same configuration. However, as will be described later, in the present embodiment, the thicknesses and materials of the blocking layer 38 and the separation layer 35 are different from the thicknesses and materials of the first separation layer 35a and the second separation layer 35b of the organic EL display device 1 according to the seventh embodiment, and as a result of these differences, the thicknesses of the light-transmissive electrode 21b in the subpixels 3G1, 3G2, and 3R are different from those in the seventh embodiment.

The essential differences between the above-described second separation layer 35b and the blocking layer 38 are as follows. The second separation layer 35b is part of the separation layer 35, and inhibits Förster-type energy transfer from the green fluorescent luminescent material to the red luminescent material in the subpixel 3G2 (note that Dexter-type energy transfer from the green fluorescent luminescent material to the red luminescent material in the subpixel 3G2 is also inhibited as a result). The second separation layer 35b is necessarily disposed between the green fluorescent light-emitting layer 34G and the red light-emitting layer 34R in the subpixel 3G2, but is not necessarily disposed in the subpixels 3 aside from the subpixel 3G2. However, as described earlier, providing the separation layer 35, or both the first separation layer 35a and the second separation layer 35b, in common for the subpixel 3G2 and other subpixels 3 adjacent to the subpixel 3G2 in the pixel 2, makes it possible to linearly deposit the separation layer 35, or both the first separation layer 35a and the second separation layer 35b, in directions connecting the subpixel 3G2 and the other subpixels 3 adjacent to the subpixel 3G2.

As opposed to this, the blocking layer 38 is a layer for inhibiting Dexter transfer from the blue fluorescent luminescent material to the green fluorescent luminescent material in the subpixel 3G1. The blocking layer 38 is necessarily disposed between the green fluorescent light-emitting layer 34G and the blue fluorescent light-emitting layer 34B in the subpixel 3G1, but is not necessarily disposed in the subpixels 3 aside from the subpixel 3G1. However, providing the blocking layer 38 in common for the subpixel 3G1 and the subpixel 3G2 as described above, for example, makes it possible to linearly deposit the material of the blocking layer 38 in a direction connecting the subpixel 3G1 and the subpixel 3G2.

On the other hand, the first separation layer 35a may have a thickness less than or equal to the Förster radius as long as the total thickness of the first separation layer 35a and the second separation layer 35b is set to exceed the Förster radius, or the first separation layer 35a alone may have a thickness exceeding the Förster radius.

In the present embodiment, the reflective electrode 21a, the light-transmissive electrode 21b, the hole injection layer 31, the hole transport layer 32, the blue fluorescent light-emitting layer 34B, the red light-emitting layer 34R, the separation layer 35, the blocking layer 38, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 23.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 6

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 155 nm/subpixel 3G2: 140 nm/subpixel 3R: 45 nm)
  Hole injection layer 31: HAT-CN (10 nm)
  Hole transport layer 32: TCTA (20 nm)
  Blue fluorescent light-emitting layer 34B: mCP (host material, 90%)/DMAC-DPS (blue fluorescent luminescent material, 10%) (10 nm)
  Red light-emitting layer 34R: CBP (host material 90%)/Ir(piq)3 (red luminescent material, 10%) (10 nm)
  Separation layer 35: CBP (15 nm)
  Blocking layer 38: mCP (5 nm)
  Green fluorescent light-emitting layer 34G: TPD (host material, 90%)/coumarin 6 (green fluorescent luminescent material, 10%) (10 nm)
  Electron transport layer 36: BCP (30 nm)
  Electron injection layer 37: LiF (1 nm)
  Second electrode 23 (cathode electrode, semitransparent electrode): Ag—Mg alloy (Ag/Mg mixing ratio=0.9/0.1) (20 nm)
  Protection layer 24: ITO (80 nm)

Modified Example

FIGS. 21 and 22 illustrate, as an example, a case where the blocking layer 38 is provided in common for the subpixels 3G1 and 3G2. However, the present embodiment is not limited thereto.

Figure 24A:
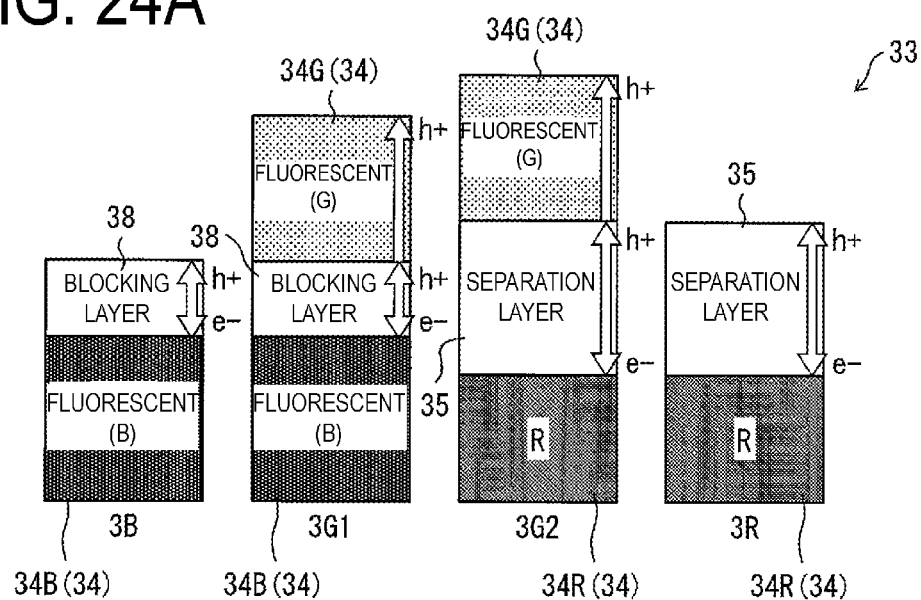
FIGS. 24A and 24B are diagrams schematically illustrating another example of the layered structure of the light-emitting layer unit according to the eighth embodiment of the disclosure.
Figure 24B:
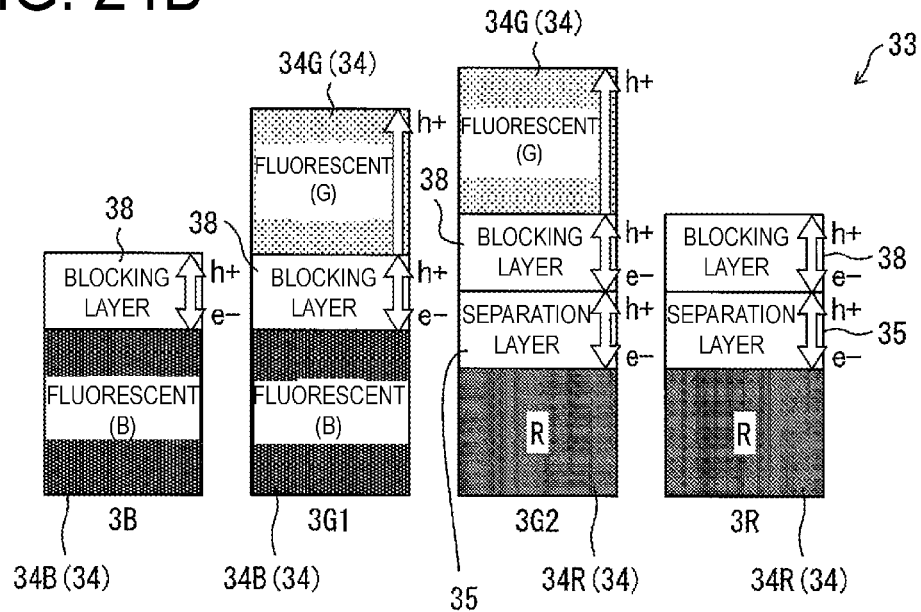

FIGS. 24A and 24B are diagrams schematically illustrating another example of the layered structure of the light-emitting layer unit 33 according to the present embodiment.

As described above, it is sufficient for the blocking layer 38 to be disposed between the green fluorescent light-emitting layer 34G and the blue fluorescent light-emitting layer 34B in the subpixel 3G1.

The blocking layer 38 may be provided as a common layer for the subpixels 3B and 3G1 as illustrated in FIG. 24A, or may be provided as a common layer for all the subpixels 3 as illustrated in FIG. 24B.

When the blocking layer 38 is formed in common for the subpixels 3B and 3G1 or all the subpixels 3, a bipolar transporting material is used for the material of the blocking layer 38, as illustrated in FIGS. 24A and 24B.

Providing the blocking layer 38 as a common layer for the subpixels 3B and 3G1 as illustrated in FIG. 24A makes it possible to inhibit Dexter transfer from the blue fluorescent luminescent material to the green fluorescent luminescent material in the subpixel 3G1, and also makes it possible to linearly deposit the material of the blocking layer 38 in a direction connecting the subpixel 3B and the subpixel 3G1.

Additionally, providing the blocking layer 38 as a common layer for all the subpixels 3 as illustrated in FIG. 24B makes it possible to inhibit Dexter transfer from the blue fluorescent luminescent material to the green fluorescent luminescent material in the subpixel 3G1, and also makes it possible to vapor-deposit the blocking layer 38 using an open mask in which the entire display region is open.

Ninth Embodiment

Yet another embodiment of the disclosure will be described below with reference primarily to FIGS. 3, 12, and 25 to 27. The present embodiment will describe differences from the first to eighth embodiments, and constituent elements having the same functions as the constituent elements described in the first to eighth embodiments will be assigned the same reference signs, with descriptions thereof omitted. It goes without saying that the same modifications as those of the first to eighth embodiments can be applied to the present embodiment as well.

Overall Configuration of Organic EL Display Device 1

Figure 25:
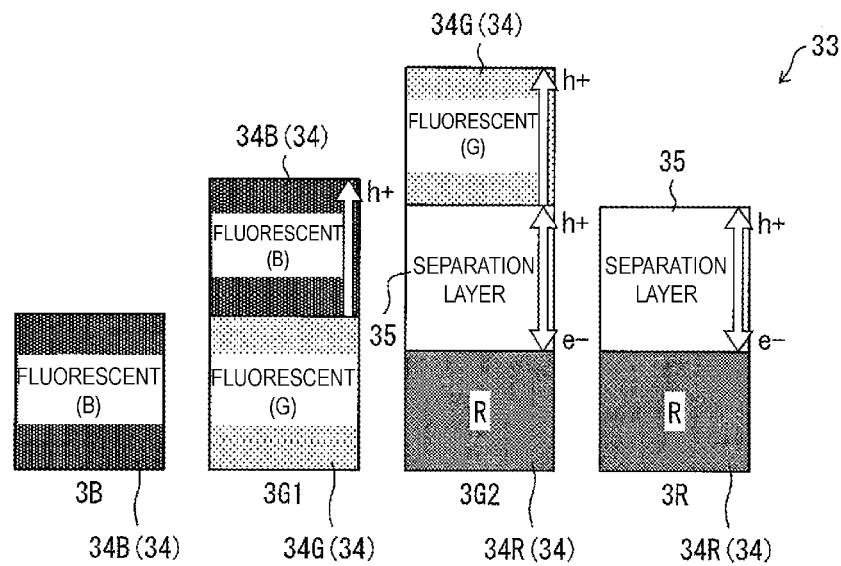
FIG. 25 is a diagram schematically illustrating a layered structure in a light-emitting layer unit of an organic EL display device according to a ninth embodiment of the disclosure.
Figure 26:
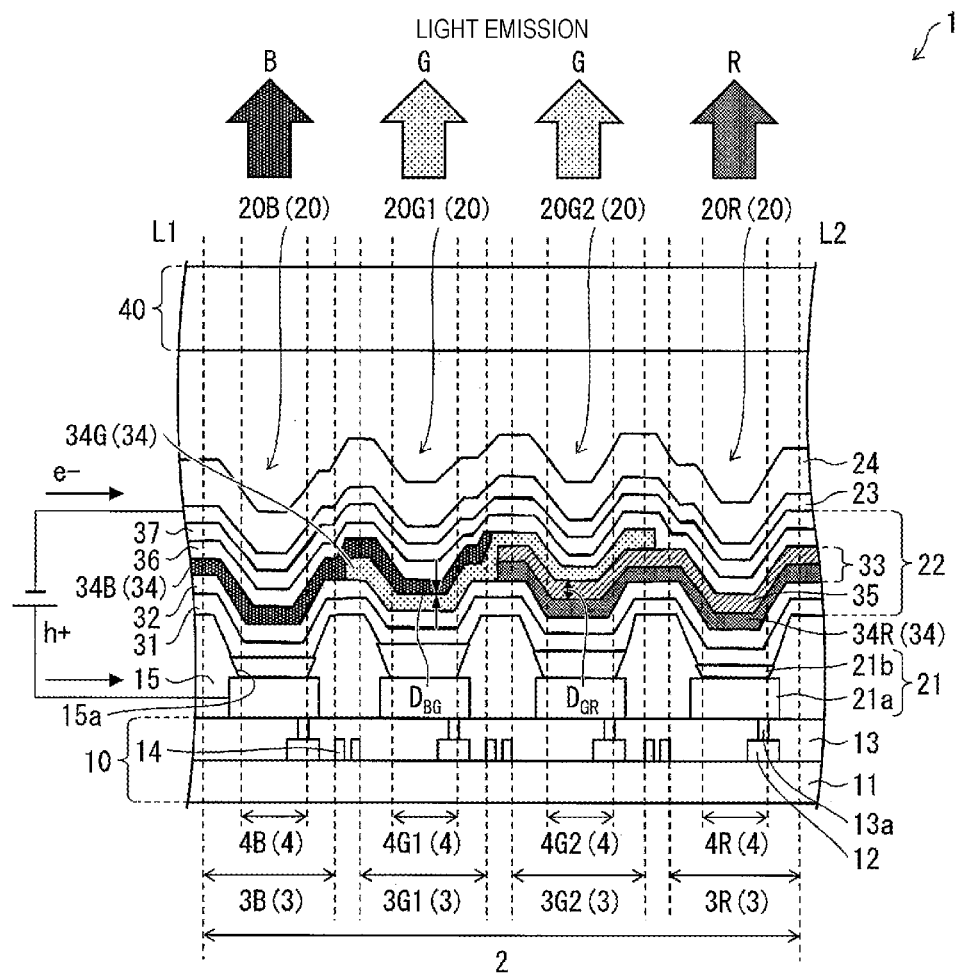
FIG. 26 is a cross-sectional view illustrating an example of the overall configuration of the organic EL display device according to the ninth embodiment of the disclosure.

FIG. 25 is a diagram schematically illustrating the layered structure of the light-emitting layer unit 33 of the organic EL display device 1 according to the present embodiment. FIG. 26 is a cross-sectional view illustrating an example of the overall configuration of the organic EL display device 1 according to the present embodiment. Note that FIG. 26 illustrates an example of the overall configuration of a single pixel area, corresponding to a cross-section taken along the line L1-L2 indicated in FIG. 3 or FIG. 12.

When the blue fluorescent light-emitting layer 34B contains a host material, it is preferable, to suppress a drop in light emission efficiency arising due to energy transfer from the blue fluorescent luminescent material to the host material, that a material having a high $S_1$ level, a high $T_1$ level, and the like be employed as the host material used in the blue fluorescent light-emitting layer 34B.

Host materials having electron transport properties make up most of the organic EL element host materials currently being used. As such, selecting a host material having electron transport properties as the host material broadens the range of selections, and makes it easy to select a host material satisfying the above-describe conditions.

However, when the material in the blue fluorescent light-emitting layer 34B having the highest mixing ratio is an electron transporting material, such as when a host material having electron transport properties is used in the blue fluorescent light-emitting layer 34B as the material having the highest content percentage in the blue fluorescent light-emitting layer 34B, and when the first electrode 21 is an anode electrode and the second electrode 23 is a cathode electrode as in the organic EL display device 1 according to the first to eighth embodiments, it is possible that the holes and electrons cannot recombine well in the green fluorescent light-emitting layer 34G of the subpixel 3G1 in a case where the blue fluorescent light-emitting layer 34B, the red light-emitting layer 34R, an intermediate layer, and the green fluorescent light-emitting layer 34G are layered, as the light-emitting layer unit 33, in that order from the first electrode 21 side between the first electrode 21 and the second electrode 23.

The reason for this is as follows. Of the function layers constituting the light-emitting layer unit 33, the green fluorescent light-emitting layer 34G is located furthest on the cathode electrode side, and a hole transporting material is used in the green fluorescent light-emitting layer 34G as the material having the highest content percentage within the green fluorescent light-emitting layer 34G. As such, electrons do not flow easily in the green fluorescent light-emitting layer 34G on the cathode electrode side. Additionally, when an electron transporting material is used in the blue fluorescent light-emitting layer 34B on the anode electrode side, as the material having the highest content percentage within the blue fluorescent light-emitting layer 34B as described above, holes do not flow easily in the blue fluorescent light-emitting layer 34B.

Thus, as illustrated in FIGS. 25 and 26, in the organic EL display device 1 according to the present embodiment, the light-emitting layer unit 33 has a configuration in which the red light-emitting layer 34R, the separation layer 35 (the intermediate layer), the green fluorescent light-emitting layer 34G, and the blue fluorescent light-emitting layer 34B are layered, in that order, from the first electrode 21 side. In other words, the organic EL display device 1 according to the present embodiment has the same configuration as the organic EL display devices 1 according to the first to eighth embodiments, aside from that the layering order of the blue fluorescent light-emitting layer 34B and the green fluorescent light-emitting layer 34G is reversed in the subpixel 3G1, and the blue fluorescent light-emitting layer 34B is located closer to the second electrode 23, which is a cathode electrode, than the green fluorescent light-emitting layer 34G.

Note the FIGS. 25 and 26 illustrate, as an example, a case where the intermediate layer is the separation layer 35 (i.e., only the separation layer 35 is provided as an intermediate layer), to simplify the descriptions and illustrations. However, the present embodiment is not limited thereto, and the intermediate layer may include the separation layer 35 and the blocking layer 38, as described above. Additionally, as described above, the separation layer 35 may be a layered body including the first separation layer 35a and the second separation layer 35b.

Manufacturing Method for Organic EL Display Device 1

Figure 27:
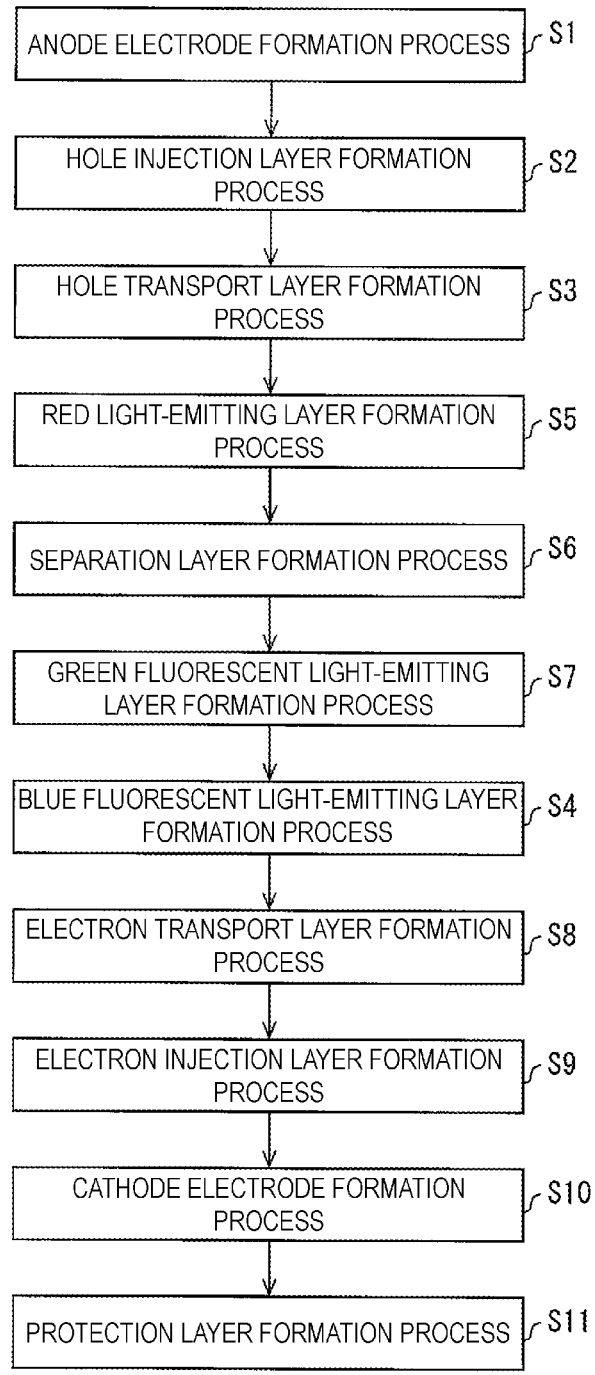
FIG. 27 is a flowchart illustrating the flow of processes for producing main portions of an organic EL display device according to a ninth embodiment of the disclosure.

FIG. 27 is a flowchart illustrating the flow of processes for producing main portions of the organic EL display device 1 according to the present embodiment.

The manufacturing method for the organic EL display device 1 according to the present embodiment is the same as the manufacturing methods for the organic EL display devices 1 according to the first to eighth embodiments, aside from the organic EL element preparation process being carried out in the following order, as illustrated in FIG. 27, for example: the anode electrode formation process (S1), the hole injection layer formation process (S2), the hole transport layer formation process (S3), the red light-emitting layer formation process (S5), the separation layer formation process (S6), the green fluorescent light-emitting layer formation process (S7), the blue fluorescent light-emitting layer formation process (S4), the electron transport layer formation process (S8), the electron injection layer formation process (S9), the cathode electrode formation process (S10), and the protection layer formation process (S11). Accordingly, the organic EL display device 1 having the layered structure illustrated in FIGS. 25 and 26 can be produced.

In the present embodiment, the reflective electrode 21a, the light-transmissive electrode 21b, the hole injection layer 31, the hole transport layer 32, the red light-emitting layer 34R, the separation layer 35, the green fluorescent light-emitting layer 34G, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 27.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 7

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 165 nm/subpixel 3G2: 145 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Green fluorescent light-emitting layer 34G: TPD (host material, 90%)/coumarin 6 (green fluorescent luminescent material, 10%) (10 nm)
Blue fluorescent light-emitting layer 34B: mCP (host material, 90%)/DMAC-DPS (blue fluorescent luminescent material, 10%) (10 nm)
Electron transport layer 36: DPEPO (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

In Example 7, mCP, which is a hole transporting material, is used as the host material, for the material in the blue fluorescent light-emitting layer 34B having the highest content percentage, as described above.

Advantageous Effects

Example 7 describes, as an example, a case where a hole transporting material is used as the material having the highest content percentage in the blue fluorescent light-emitting layer 34B. However, according to the present embodiment, even in a case where the material having the highest content percentage in the blue fluorescent light-emitting layer 34B is an electron transporting material as described above, the green fluorescent light-emitting layer 34G containing a hole transporting material as the material having the highest content percentage is located on the first electrode 21 (anode electrode) side in the subpixel 3G1, which makes it easy for holes and electrons to recombine in the green fluorescent light-emitting layer 34G, and makes it possible to improve the light emission efficiency.

In the present embodiment, there is no particular limit on the carrier mobility of the material having the highest content percentage in the blue fluorescent light-emitting layer 34B. The above-described effect can be achieved even in a case where the material is a hole transporting material or a bipolar transporting material, as in the first to eighth embodiments.

As in the first to eighth embodiments, a hole transporting material is used as the material having the highest content percentage in the green fluorescent light-emitting layer 34G, a bipolar transporting material or a hole transporting material (desirably, a bipolar transporting material) is used as the material having the highest content percentage in the red light-emitting layer 34R, and a material having bipolar transport properties for the intermediate layer as a whole is used as the intermediate layer in the present embodiment as well.

According to the present embodiment, the same effects as in the first to eighth embodiments can be achieved by using the above-described layered structure. Additionally, according to the present embodiment, employing the above-described layered structure of course makes it possible to suppress color mixing in the subpixels 3, in the same manner as in the first to eighth embodiments; furthermore, even in a case where the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to the present embodiment, the red light-emitting layer formation process (S5) is carried out before the blue fluorescent light-emitting layer formation process (S4), and thus even in a case where the red luminescent material has infiltrated into the subpixel 3B, the red light-emitting layer 34R that has infiltrated into the subpixel 3B is located further on the anode electrode side than the blue fluorescent light-emitting layer 34B. Accordingly, when the material having the highest content percentage in the blue fluorescent light-emitting layer 34B is a hole transporting material, electrons will not reach the red light-emitting layer 34R, and thus red color mixing will not arise in the subpixel 3B.

Tenth Embodiment

Yet another embodiment of the disclosure will be described below with reference primarily to FIGS. 3, 12, and 28 to 30. The present embodiment will describe differences from the first to ninth embodiments, and constituent elements having the same functions as the constituent elements described in the first to ninth embodiments will be assigned the same reference signs, with descriptions thereof omitted. It goes without saying that the same modifications as those of the first to ninth embodiments can be applied to the present embodiment as well.

Overall Configuration of Organic EL Display Device 1

Figure 28:
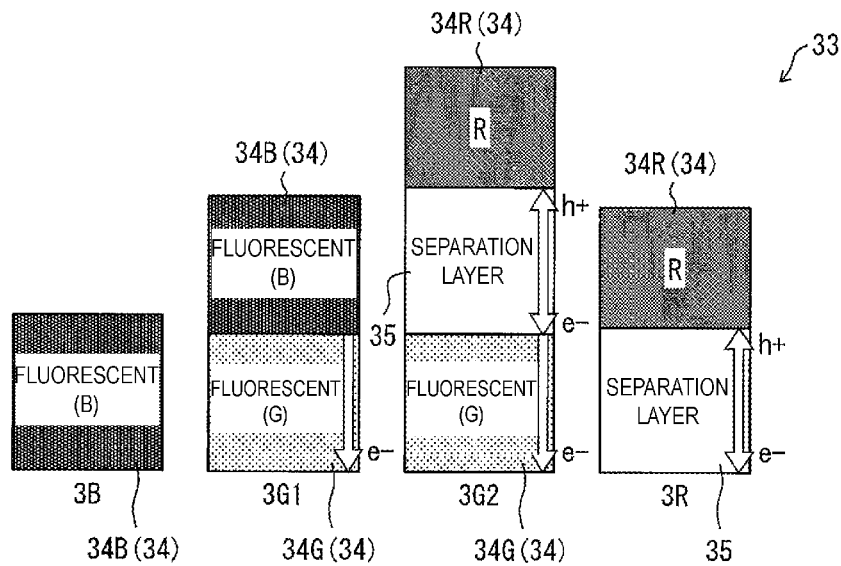
FIG. 28 is a diagram schematically illustrating a layered structure in a light-emitting layer unit of an organic EL display device according to a tenth embodiment of the disclosure.
Figure 29:
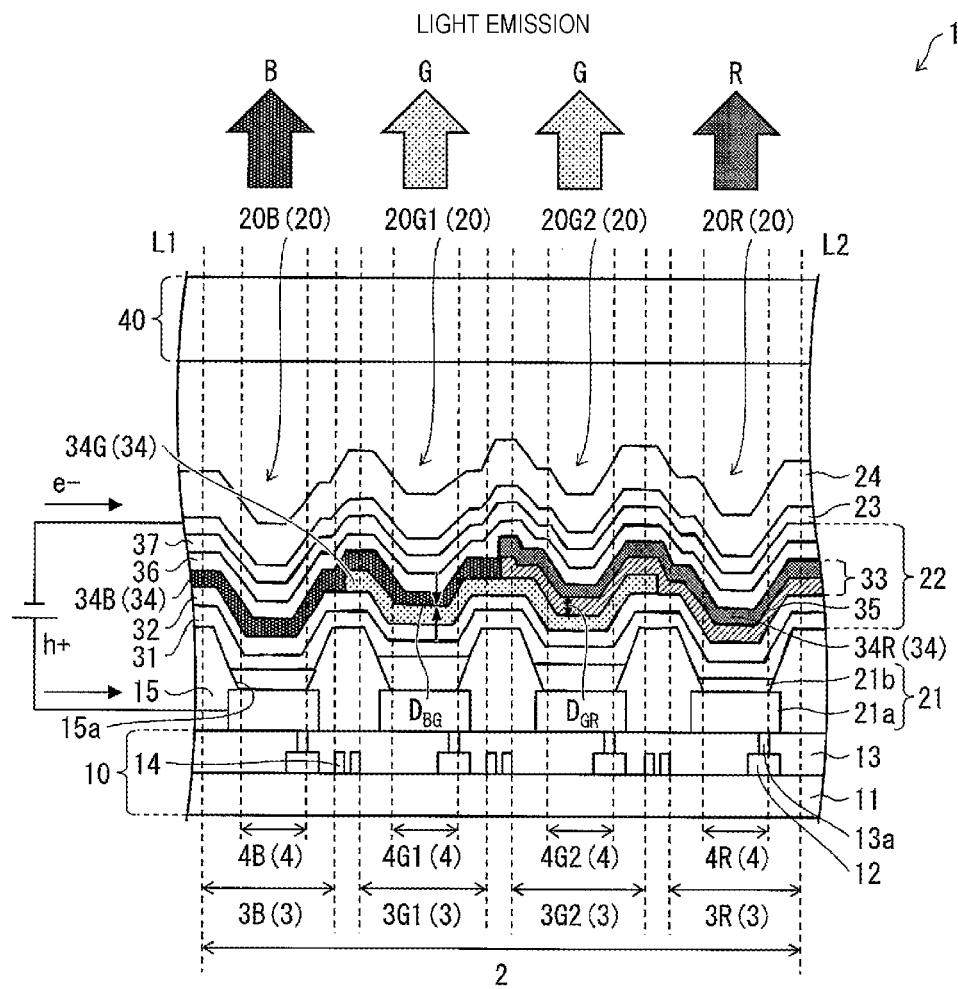
FIG. 29 is a cross-sectional view illustrating an example of the overall configuration of the organic EL display device according to the tenth embodiment of the disclosure.

FIG. 28 is a diagram schematically illustrating the layered structure of the light-emitting layer unit 33 of the organic EL display device 1 according to the present embodiment. FIG. 29 is a cross-sectional view illustrating an example of the overall configuration of the organic EL display device 1 according to the present embodiment. Note that FIG. 29 illustrates an example of the overall configuration of a single pixel area, corresponding to a cross-section taken along the line L1-L2 indicated in FIG. 3 or FIG. 12.

As described above, host materials having electron transport properties make up most of the organic EL element host materials currently being developed.

When the materials having the highest content percentages in the light-emitting layers 34 are all hole transporting materials, such as when a host material having hole transport properties is used as the material having the highest content percentage in each light-emitting layer 34, there is often an increase in voltage.

With respect to the recent state of development in the organic EL display device industry, host materials having hole transport properties can be synthesized more easily and have a wider range of types that host materials having electron transport properties, and have undergone much more development. Selecting a host material having electron transport properties as the host material therefore makes it easier to obtain a material having favorable properties than when selecting a host material having hole transport properties.

In reality, electron transporting materials having extremely high electron mobility are better known than hole transporting materials having extremely high hole mobility. As such, it is easier to achieve low voltages by selecting an electron transporting material than by selecting a hole transporting material as the material having the highest content percentage in each light-emitting layer 34.

Accordingly, in the organic EL display device 1 according to the present embodiment, the light-emitting layer unit 33 has a configuration in which the green fluorescent light-emitting layer 34G, the separation layer 35 (intermediate layer), the blue fluorescent light-emitting layer 34B, and the red light-emitting layer 34R are layered in that order from the first electrode 21, and an electron transporting material is used as the material having the highest content percentage in the green fluorescent light-emitting layer 34G, as illustrated in FIGS. 28 and 29. This makes it possible to reduce the voltage of the organic EL display device 1.

As described above, in the present embodiment, an electron transporting material is used as the material having the highest content percentage in the green fluorescent light-emitting layer 34G, a bipolar transporting material or an electron transporting material (desirably, an electron transporting material) is used as the material having the highest content percentage in the blue fluorescent light-emitting layer 34B, a bipolar transporting material or an electron transporting material is used as the material having the highest content percentage in the red light-emitting layer 34R, and a material having bipolar transport properties for the intermediate layer as a whole is used as the intermediate layer. This makes it possible to reduce the voltages of the organic EL elements 20, which in turn makes it possible to further reduce the voltage of the organic EL display device 1.

Additionally, according to the present embodiment, employing the above-described layered structure makes it possible to achieve the same effects as those described in the first to ninth embodiments. Additionally, according to the present embodiment, employing the above-described layered structure of course makes it possible to suppress color mixing in the subpixels 3, in the same manner as in the first to ninth embodiments; furthermore, by using an electron transporting material as the material having the highest content percentage in the green fluorescent light-emitting layer 34G as described above, even if the blue fluorescent light-emitting layer 34B has infiltrated into the subpixel 3G2, almost no holes flow in the green fluorescent light-emitting layer 34G, which provides an advantage in that no blue color mixing will arise in the subpixel 3G2.

Manufacturing Method for Organic EL Display Device 1

Figure 30:
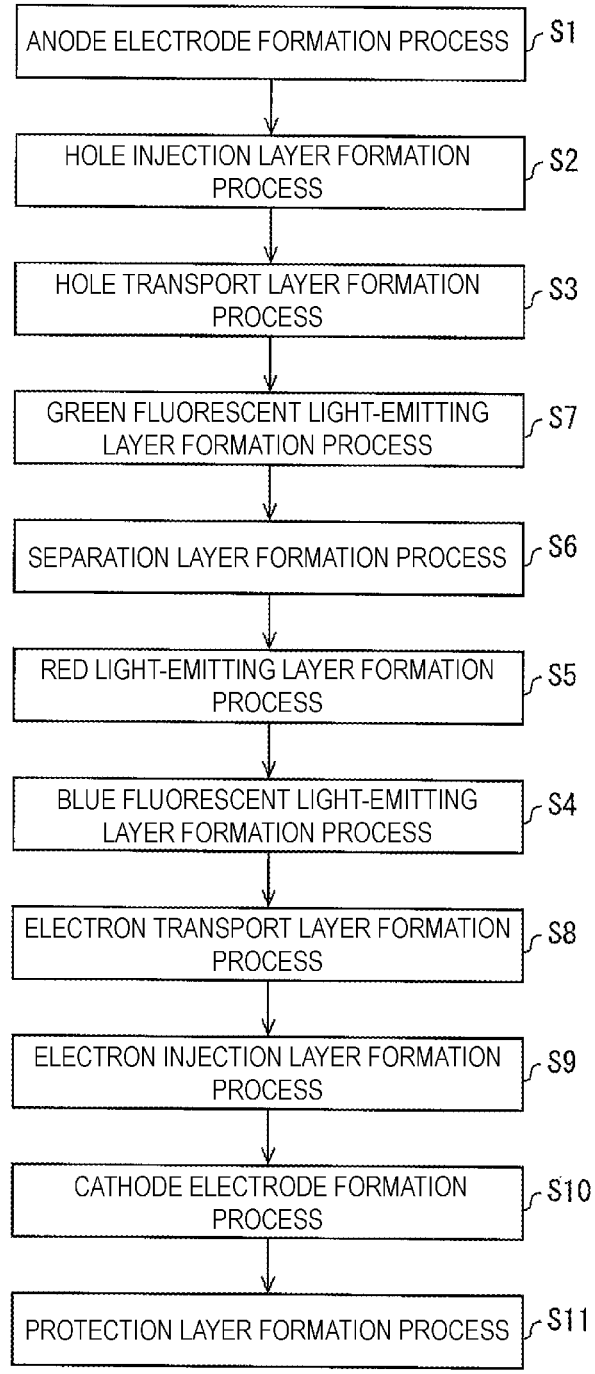
FIG. 30 is a flowchart illustrating the flow of processes for producing main portions of an organic EL display device according to the tenth embodiment of the disclosure.

FIG. 30 is a flowchart illustrating the flow of processes for producing main portions of the organic EL display device 1 according to the present embodiment.

The manufacturing method for the organic EL display device 1 according to the present embodiment is the same as the manufacturing methods for the organic EL display devices 1 according to the first to ninth embodiments, aside from the organic EL element preparation process being carried out in the following order, as illustrated in FIG. 30, for example: the anode electrode formation process (S1), the hole injection layer formation process (S2), the hole transport layer formation process (S3), the green fluorescent light-emitting layer formation process (S7), the separation layer formation process (S6), the red light-emitting layer formation process (S5), the blue fluorescent light-emitting layer formation process (S4), the electron transport layer formation process (S8), the electron injection layer formation process (S9), the cathode electrode formation process (S10), and the protection layer formation process (S11). Accordingly, the organic EL display device 1 having the layered structure illustrated in FIGS. 28 and 29 can be produced. However, as long as the organic EL display device 1 having the layered structure illustrated in FIGS. 28 and 29 can be produced, the present embodiment is not limited to the above-described order of manufacturing processes. The blue fluorescent light-emitting layer formation process (S4)

may be carried out after the green fluorescent light-emitting layer formation process (S7), and the separation layer formation process (S6) and the red light-emitting layer formation process (S5) may then be carried out, as in a thirteenth embodiment, which will be described later.

In the present embodiment, the reflective electrode 21a, the light-transmissive electrode 21b, the hole injection layer 31, the hole transport layer 32, the green fluorescent light-emitting layer 34G, the separation layer 35, the red light-emitting layer 34R, the blue fluorescent light-emitting layer 34B, the electron transport layer 36, the electron injection layer 37, the second electrode 23, and the protection layer 24 are layered on the TFT substrate 10, in that order from the TFT substrate 10 side, on the basis of the flowchart illustrated in FIG. 30.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 8

Reflective electrode 21a (first electrode 21; anode electrode): Ag (100 nm)
Light-transmissive electrode 21b (first electrode 21, anode electrode): ITO (subpixel 3B: 135 nm/subpixel 3G1: 165 nm/subpixel 3G2: 145 nm/subpixel 3R: 40 nm)
Hole injection layer 31: HAT-CN (10 nm)
Hole transport layer 32: TCTA (20 nm)
Green fluorescent light-emitting layer 34G: BCP (host material, 90%)/coumarin 6 (green fluorescent luminescent material, 10%) (10 nm)
Separation layer 35: CBP (20 nm)
Red light-emitting layer 34R: CBP (host material 90%)/Ir(piq)3 (red luminescent material, 10%) (10 nm)
Blue fluorescent light-emitting layer 34B: DPEPO (host material, 90%)/DMAC-DPS (blue fluorescent luminescent material, 10%) (10 nm)
Electron transport layer 36: DPEPO (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Thus, in the present embodiment, for example, a host material constituted by an electron transporting material is used as the material having the highest content percentage in the blue fluorescent light-emitting layer 34B and the green fluorescent light-emitting layer 34G, and a host material constituted by a bipolar transporting material is used as the material having the highest content percentage in the red light-emitting layer 34R.

Eleventh Embodiment

Yet another embodiment of the disclosure will be described below with reference primarily to FIGS. 3, 12, and 31 to 33. The present embodiment will describe differences from the first to tenth embodiments, and constituent elements having the same functions as the constituent elements described in the first to tenth embodiments will be assigned the same reference signs, with descriptions thereof omitted.

It goes without saying that the same modifications as those of the first to tenth embodiments can be applied to the present embodiment as well.

Overall Configuration of Organic EL Display Device 1

Figure 31:
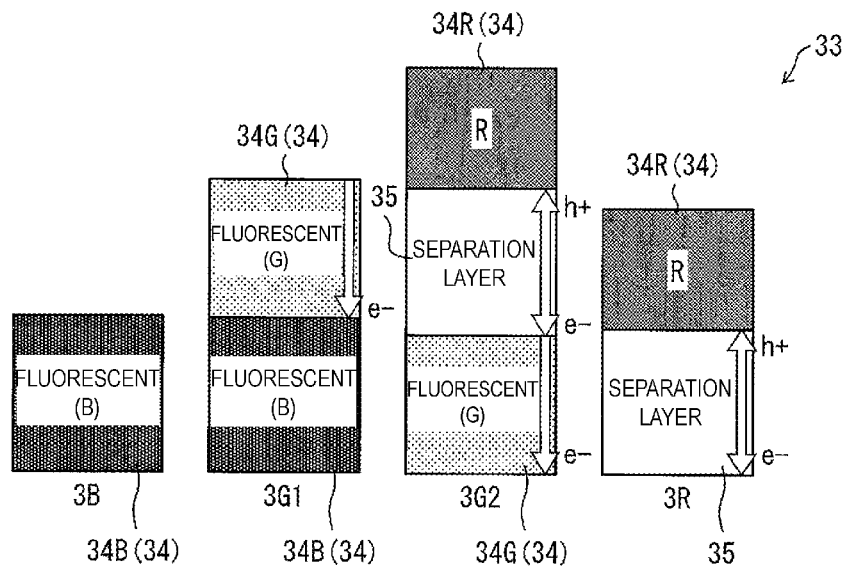
FIG. 31 is a diagram schematically illustrating a layered structure in a light-emitting layer unit of an organic EL display device according to an eleventh embodiment of the disclosure.
Figure 32:
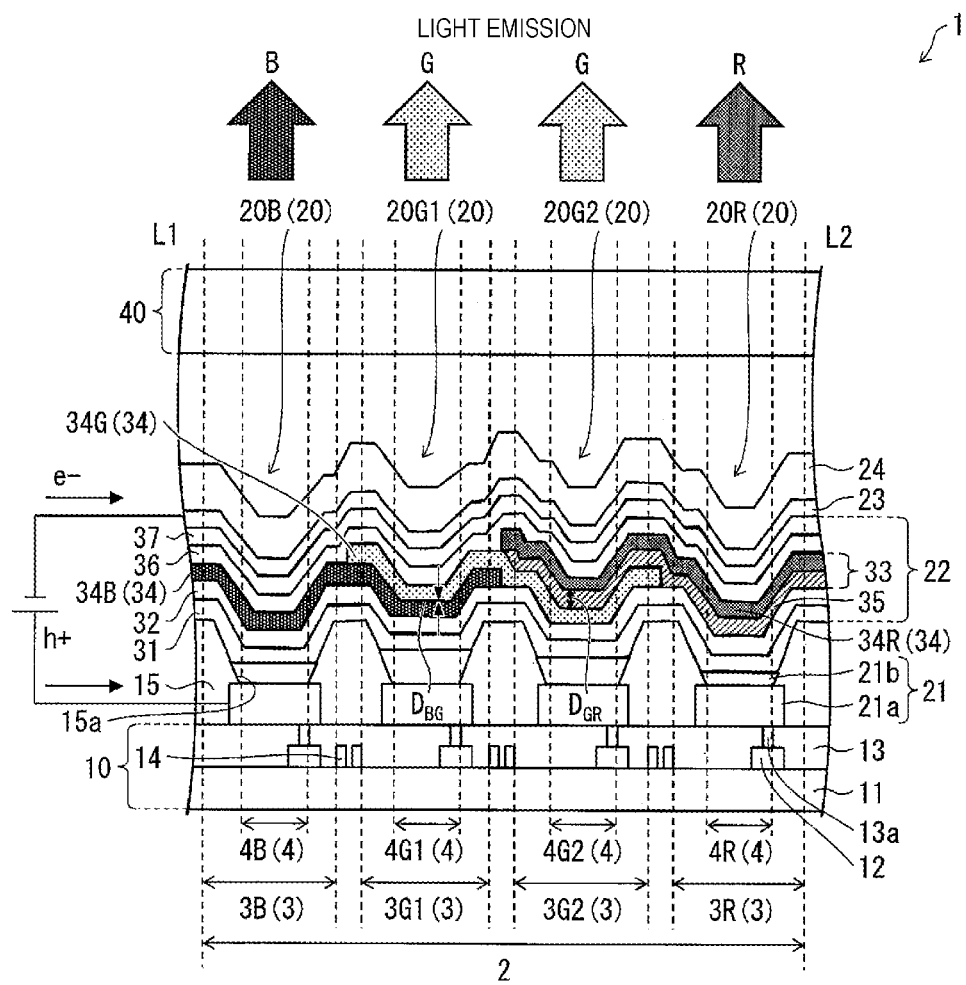
FIG. 32 is a cross-sectional view illustrating an example of the overall configuration of the organic EL display device according to the eleventh embodiment of the disclosure.

FIG. 31 is a diagram schematically illustrating the layered structure of the light-emitting layer unit 33 of the organic EL display device 1 according to the present embodiment. FIG. 32 is a cross-sectional view illustrating an example of the overall configuration of the organic EL display device 1 according to the present embodiment. Note that FIG. 32 illustrates an example of the overall configuration of a single pixel area, corresponding to a cross-section taken along the line L1-L2 indicated in FIG. 3 or FIG. 12.

As illustrated in FIGS. 31 and 32, in the organic EL display device 1 according to the present embodiment, the light-emitting layer unit 33 has a configuration in which the blue fluorescent light-emitting layer 34B, the green fluorescent light-emitting layer 34G, the separation layer 35 (intermediate layer), and the red light-emitting layer 34R are layered in that order, from the first electrode 21 side, between the first electrode 21 and the second electrode 23, and an electron transporting material is used as the material having the highest content percentage in the green fluorescent light-emitting layer 34G.

More specifically, the organic EL display device 1 according to the present embodiment has the same configuration as the organic EL display device 1 according to the tenth embodiment, aside from that the layering order of the blue fluorescent light-emitting layer 34B and the green fluorescent light-emitting layer 34G is reversed in the subpixel 3G1, and the green fluorescent light-emitting layer 34G is located closer to the second electrode 23, which is a cathode electrode, than the blue fluorescent light-emitting layer 34B.

In the present embodiment, an electron transporting material is used as a material having the highest content percentage in the green fluorescent light-emitting layer 34G, a bipolar transporting material or an electron transporting material is used as the material having the highest content percentage in the red light-emitting layer 34R, and a material having bipolar transport properties for the separation layer 35 as a whole is used as the separation layer 35, in the same manner as in the tenth embodiment.

Although the carrier mobility of the material having the highest content percentage in the blue fluorescent light-emitting layer 34B is not particularly limited, it is desirable that the material have electron transport properties (i.e., that the material having the highest content percentage in the blue fluorescent light-emitting layer 34B be an electron transporting material).

Manufacturing Method for Organic EL Display Device 1

Figure 33:
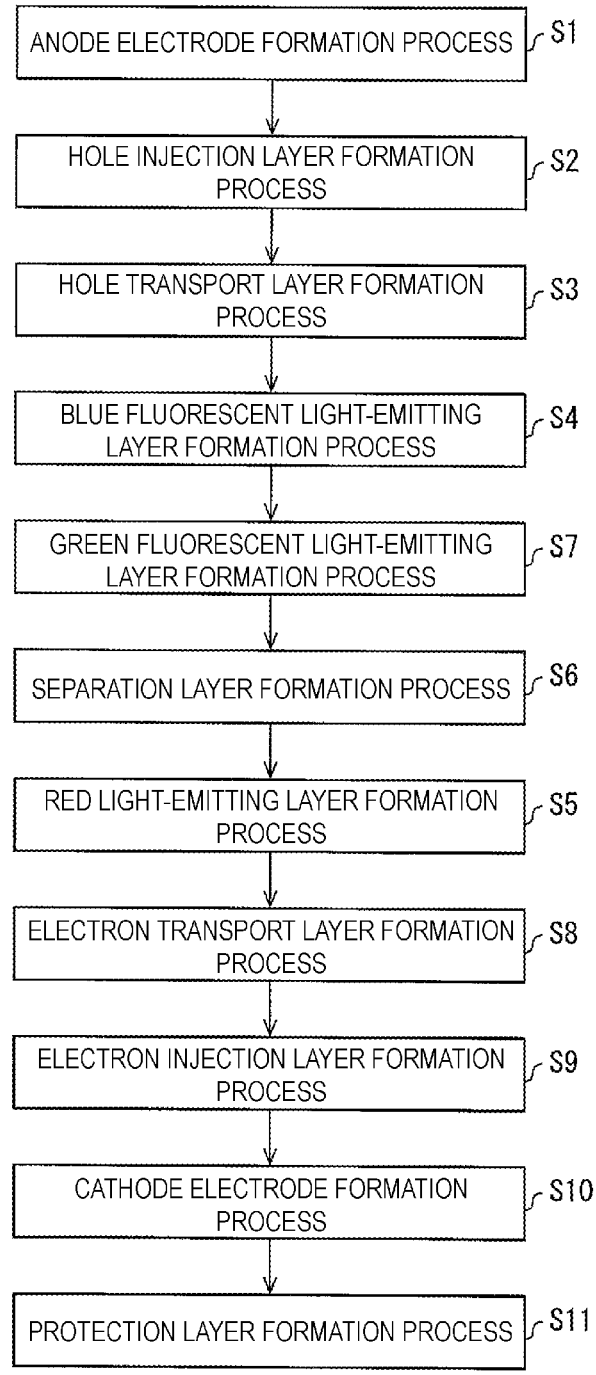
FIG. 33 is a flowchart illustrating the flow of processes for producing main portions of an organic EL display device according to the eleventh embodiment of the disclosure.

FIG. 33 is a flowchart illustrating the flow of processes for producing main portions of the organic EL display device 1 according to the present embodiment.

The manufacturing method for the organic EL display device 1 according to the present embodiment is the same as the manufacturing methods for the organic EL display devices 1 according to the first to tenth embodiments, aside from the organic EL element preparation process being carried out in the following order, as illustrated in FIG. 33, for example: the anode electrode formation process (S1), the hole injection layer formation process (S2), the hole transport layer formation process (S3), the blue fluorescent light-emitting layer formation process (S4), the green fluorescent light-emitting layer formation process (S7), the separation layer formation process (S6), the red light-emitting layer formation process (S5), the electron transport layer formation process (S8), the electron injection layer formation process (S9), the cathode electrode formation process (S10), and the protection layer formation process (S11). Accordingly, the organic EL display device 1 having the layered structure illustrated in FIGS. 31 and 32 can be produced.

In the present embodiment, the reflective electrode 21a, the light-transmissive electrode 21b, the hole injection layer 31, the hole transport layer 32, the blue fluorescent light-emitting layer 34B, the green fluorescent light-emitting layer 34G, the separation layer 35, the red light-emitting layer 34R, the electron transport layer 36, the electron injection layer 37, the second electrode 23, and the protection layer 24 are layered on the TFT substrate 10, in that order from the TFT substrate 10 side, on the basis of the flowchart illustrated in FIG. 33.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 9

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 160 nm/subpixel 3G2: 145 nm/subpixel 3R: 40 nm)

Hole injection layer 31: HAT-CN (10 nm)

Hole transport layer 32: TCTA (20 nm)

Blue fluorescent light-emitting layer 34B: DPEPO (host material, 90%)/DMAC-DPS (blue fluorescent luminescent material, 10%) (10 nm)

Green fluorescent light-emitting layer 34G: BCP (host material, 90%)/coumarin 6 (green fluorescent luminescent material, 10%) (10 nm)

Separation layer 35: CBP (20 nm)

Red light-emitting layer 34R: CBP (host material 90%)/Ir(piq)3 (red luminescent material, 10%) (10 nm)

Electron transport layer 36: DPEPO (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

According to the present embodiment, in the subpixel 3G1, the green fluorescent light-emitting layer 34G, which contains an electron transporting material as the material having the highest content percentage, is located on the second electrode 23 (cathode electrode) side, as illustrated in FIGS. 31 and 32. Accordingly, it is easy for holes and electrons to recombine in the green fluorescent light-emitting layer 34G, which makes it possible to realize a high level of light emission efficiency.

Additionally, using an electron transporting material as the material having the highest content percentage in the green fluorescent light-emitting layer 34G as described above makes it possible to reduce the voltage of the organic EL display device 1, in the same manner as in the tenth embodiment.

Furthermore, in light of host materials having electron transport properties often being used as the host materials for organic EL elements currently being developed, using an electron transporting material as the material having the highest content percentage in each of the light-emitting layers 34 as described above broadens the range of selections for the host material, for example, and furthermore is it possible to reduce the voltages of the organic EL elements 20, which in turn makes it possible to reduce the voltage of the organic EL display device 1.

Additionally, according to the present embodiment, it is more difficult for color mixing caused by deposited materials infiltrating to adjacent subpixels 3 to arise than in the organic EL display devices 1 according to the first to tenth embodiments.

According to the present embodiment, the same effects as in the first to tenth embodiments can be achieved by using the above-described layered structure. Additionally, according to the present embodiment, employing the above-described layered structure of course makes it possible to suppress color mixing in the subpixels 3, in the same manner as in the first to tenth embodiments; furthermore, even in a case where the blue fluorescent light-emitting layer 34B has infiltrated into the subpixel 3G2, energy is transferred from the blue fluorescent luminescent material to the green fluorescent luminescent material, which provides an advantage in that no blue color mixing will arise in the subpixel 3G2.

In another embodiment, blue light mixing will not arise even in a case where the blue fluorescent light-emitting layer 34B infiltrates into the subpixel 3G2 as described above; however, there is a risk that color mixing cannot be avoided in a case where the blue fluorescent light-emitting layer 34B infiltrates into another adjacent subpixel 3.

However, according to the present embodiment, when the material having the highest content percentage in the blue fluorescent light-emitting layer 34B is an electron transporting material, holes will not reach the red light-emitting layer 34R even in the case where the red luminescent material has infiltrated into the blue fluorescent light-emitting layer 34B in the subpixel 3B, and thus red light mixing will not arise in the subpixel 3B. There is thus a reduced risk of color mixing.

Twelfth Embodiment

Yet another embodiment of the disclosure will be described below with reference primarily to FIGS. 1, 2, 4, 11, 15 to 22, 24A and 24B, and 34. The present embodiment will describe differences from the first to eleventh embodiments, and constituent elements having the same functions as the constituent elements described in the first to eleventh embodiments will be assigned the same reference signs, with descriptions thereof omitted. It goes without saying that the same modifications as those of the first to eleventh embodiments can be applied to the present embodiment as well.

Overall Configuration of Organic EL Display Device 1

The organic EL display device 1 according to the present embodiment has the same configuration as the organic EL display device 1 according to the first to eighth embodiments (i.e., the configuration illustrated in FIGS. 1, 2, 4, 11, 15 to 22, and 24A and 24B), aside from the blue fluorescent light-emitting layer 34B being at least 15 nm thick.

Materials having the same carrier mobilities as the materials of the function layers in the light-emitting layer units 33 of the organic EL display devices 1 according to the first to eighth embodiments can be used as the materials of the function layers in the light-emitting layer unit 33 according to the present embodiment.

Accordingly, a bipolar transporting material or a hole transporting material can be used as the material having the highest content percentage in the blue fluorescent light-emitting layer 34B, but of those, it is preferable that a hole transporting material such as mCP indicated in Example 10 (described later) be used.

Manufacturing Method for Organic EL Display Device 1

Figure 34:
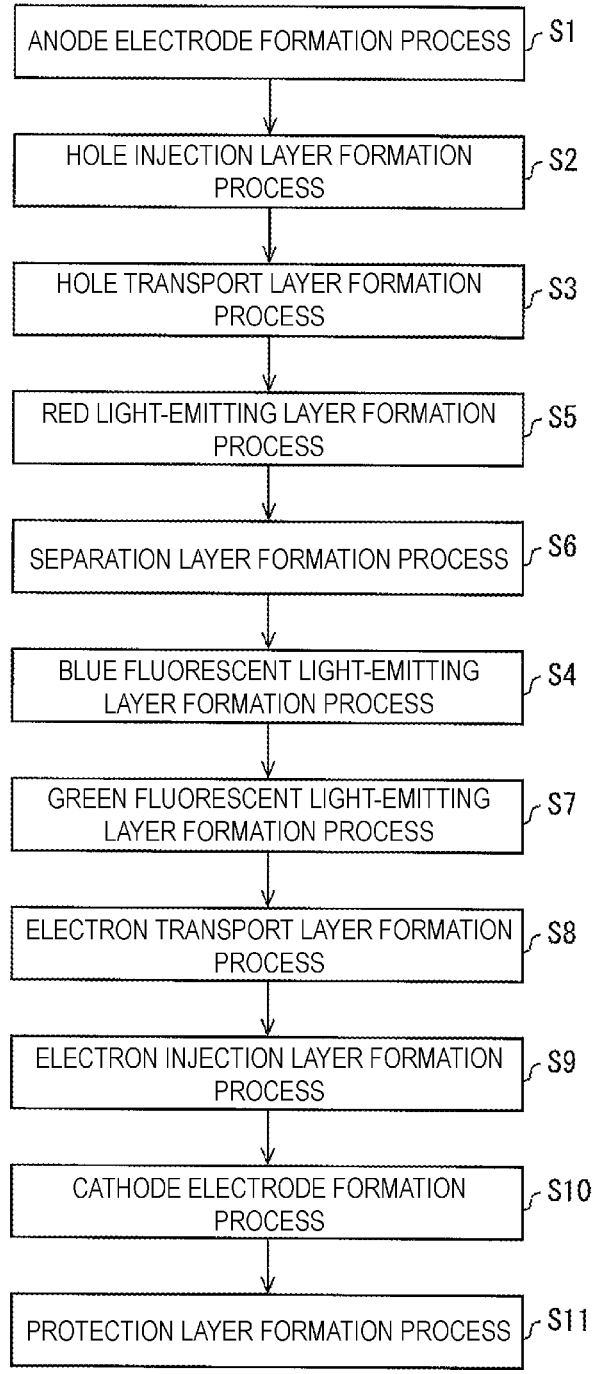
FIG. 34 is a flowchart illustrating the flow of processes for producing main portions of an organic EL display device according to a twelfth embodiment of the disclosure.

FIG. 34 is a flowchart illustrating the flow of processes for producing main portions of the organic EL display device 1 according to the present embodiment.

The first to eighth embodiments describe, as an example, a case where the blue fluorescent light-emitting layer 34B, the red light-emitting layer 34R, the separation layer 35, and the green fluorescent light-emitting layer 34G are layered in that order, from the first electrode 21 (anode electrode) side, in the light-emitting layer unit 33 (i.e., steps S4 to S7 are carried out in that order following step S1), as illustrated in FIGS. 10 and 23.

However, the order in which these function layers are formed in the light-emitting layer unit 33 (the layering order) is not limited thereto.

In the present embodiment, the red light-emitting layer 34R, the separation layer 35, the blue fluorescent light-emitting layer 34B, and the green fluorescent light-emitting layer 34G are formed in that order from the first electrode 21 (anode electrode) side.

Thus, in the present embodiment, the anode electrode formation process (S1), the hole injection layer formation process (S2), the hole transport layer formation process (S3), the red light-emitting layer formation process (S5), the separation layer formation process (S6, an intermediate layer formation process), the blue fluorescent light-emitting layer formation process (S4), the green fluorescent light-emitting layer formation process (S7), the electron transport layer formation process (S8), the electron injection layer formation process (9), the cathode electrode formation process (S10), and the protection layer formation process (S11) are carried out in that order, as illustrated in FIG. 34. Accordingly, the organic EL display device 1 having the above-described layered structure can be produced.

In the present embodiment, the reflective electrode 21a, the light-transmissive electrode 21b, the hole injection layer 31, the hole transport layer 32, the red light-emitting layer 34R, the separation layer 35, the blue fluorescent light-emitting layer 34B, the green fluorescent light-emitting layer 34G, the electron transport layer 36, the electron injection layer 37, the second electrode 23, and the protection layer 24 are layered on TFT substrate 10, in that order from the TFT substrate 10 side, on the basis of the flowchart illustrated in FIG. 34.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 10

Reflective electrode 21a (first electrode 21; anode electrode): Ag (100 nm)
Light-transmissive electrode 21b (first electrode 21, anode electrode): ITO (subpixel 3B: 130 nm/subpixel 3G1: 150 nm/subpixel 3G2: 145 nm/subpixel 3R: 40 nm)
Hole injection layer 31: HAT-CN (10 nm)
Hole transport layer 32: TCTA (20 nm)
Red light-emitting layer 34R: CBP (host material 90%)/Ir(piq)3 (red luminescent material, 10%) (10 nm)
Separation layer 35: CBP (20 nm)
Blue fluorescent light-emitting layer 34B: mCP (host material, 90%)/DMAC-DPS (blue fluorescent luminescent material, 10%) (20 nm)
Green fluorescent light-emitting layer 34G: TPD (host material, 90%)/coumarin 6 (green fluorescent luminescent material, 10%) (10 nm)
Electron transport layer 36: BCP (30 nm)
Electron injection layer 37: LiF (1 nm)
Second electrode 23 (cathode electrode, semitransparent electrode): Ag—Mg alloy (Ag/Mg mixing ratio=0.9/0.1) (20 nm)
Protection layer 24: ITO (80 nm)

Advantageous Effects

According to the present embodiment, the same effects as in the first to eighth embodiments, for example, can be achieved by using the above-described layered structure.

Additionally, according to the present embodiment, color mixing in the subpixels 3 can of course be suppressed; furthermore, even in a case where the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to the present embodiment, the red light-emitting layer formation process (S5) is carried out before the blue fluorescent light-emitting layer formation process (S4), and thus even in a case where the red luminescent material has infiltrated into the subpixel 3B, the red light-emitting layer 34R that has infiltrated into the subpixel 3B is located further on the anode electrode side than the blue fluorescent light-emitting layer 34B. Accordingly, when the material having the highest content percentage in the blue fluorescent light-emitting layer 34B is a hole transporting material, electrons will not reach the red light-emitting layer 34R, and thus red color mixing will not arise in the subpixel 3B.

Furthermore, when the red light-emitting layer 34R has infiltrated into the subpixel 3G1, the red light-emitting layer 34R that has infiltrated into the subpixel 3G1 is located closer to the anode electrode than the blue fluorescent light-emitting layer 34B, as with the subpixel 3B. Accordingly, in a case where the blue fluorescent light-emitting layer 34B is thick in the subpixel 3G1, electrons will not flow on the side further toward the anode electrode than the green fluorescent light-emitting layer 34G, and the thickness of the blue fluorescent light-emitting layer 34B will exceed the Förster radius. As a result, due to the distance, energy will not be transferred from the green fluorescent light-emitting layer 34G to the red light-emitting layer 34R through the blue fluorescent light-emitting layer 34B, and thus no red color mixing will arise.

Thus according to the present embodiment, employing the above-described layered structure provides three patterns of cases where color mixing can be avoided structurally, and is thus even more difficult for color mixing caused by deposited materials infiltrating into adjacent subpixels 3 to arise than with the layered structure according to the eleventh embodiment. There is thus a reduced risk of color mixing.

Thirteenth Embodiment

Yet another embodiment of the disclosure will be described below with reference primarily to FIGS. 28, 29, and 35. The present embodiment will describe differences from the first to twelfth embodiments, and constituent elements having the same functions as the constituent elements described in the first to twelfth embodiments will be assigned the same reference signs, with descriptions thereof omitted. It goes without saying that the same modifications as those of the first to twelfth embodiments can be applied to the present embodiment as well.
Overall Configuration of Organic EL Display Device 1

The organic EL display device 1 according to the present embodiment has the same configuration as the organic EL display device 1 according to the tenth embodiment (i.e., the configuration illustrated in FIGS. 28 and 29), aside from the blue fluorescent light-emitting layer 34B being at least 15 nm thick.

Materials having the same carrier mobilities as the materials of the function layers in the light-emitting layer unit 33 of the organic EL display device 1 according to the tenth embodiment can be used as the materials of the function layers in the light-emitting layer unit 33 according to the present embodiment.
Manufacturing Method for Organic EL Display Device 1

Figure 35:
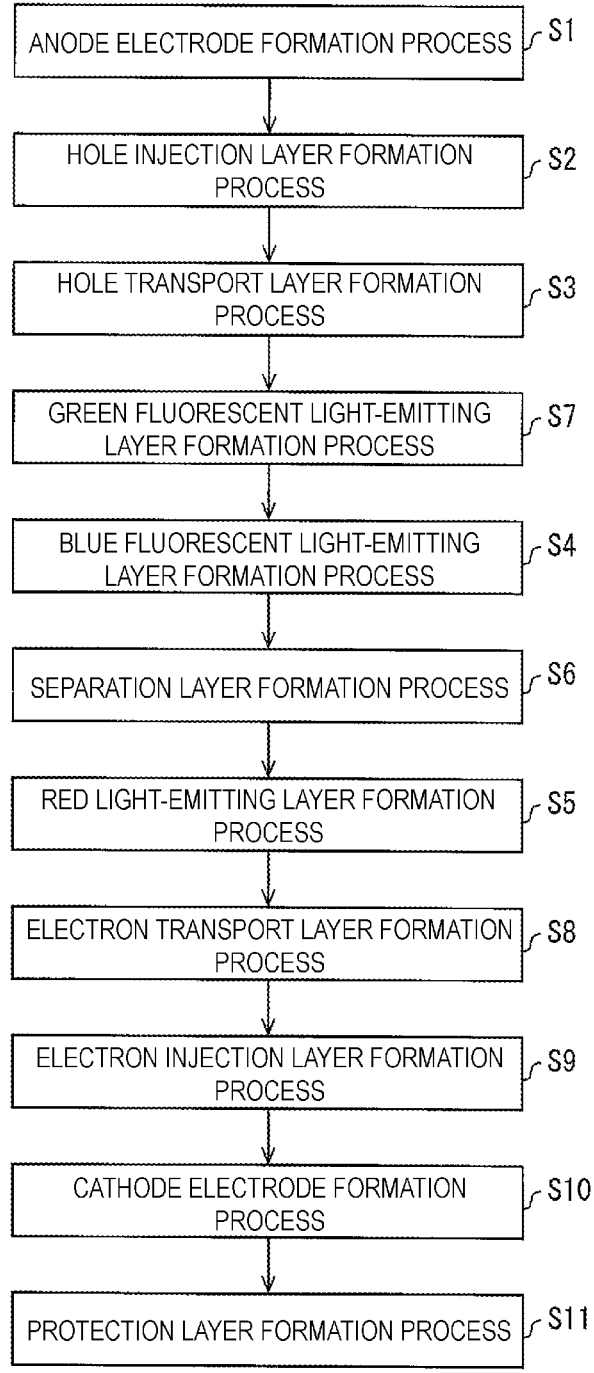
FIG. 35 is a flowchart illustrating the flow of processes for producing main portions of an organic EL display device according to a thirteenth embodiment of the disclosure.

FIG. 35 is a flowchart illustrating the flow of processes for producing main portions of the organic EL display device 1 according to the present embodiment.

The tenth embodiment describes, as an example, a case where the green fluorescent light-emitting layer 34G, the separation layer 35, the red light-emitting layer 34R, and the blue fluorescent light-emitting layer 34B are layered, in that order from the first electrode 21 (anode electrode) side, in the light-emitting layer unit 33 (i.e., step S4, step S7, step S6, and step S5 are carried out in that order after step S1), as illustrated in FIG. 30.

However, the order in which these function layers are formed in the light-emitting layer unit 33 (the layering order) is not limited thereto.

In the present embodiment, the green fluorescent light-emitting layer 34G, the blue fluorescent light-emitting layer 34B, the separation layer 35, and the red light-emitting layer 34R are formed in that order from the first electrode 21 (anode electrode) side.

Accordingly, in the present embodiment, the anode electrode formation process (S1), the hole injection layer formation process (S2), the hole transport layer formation process (S3), the green fluorescent light-emitting layer formation process (S7), the blue fluorescent light-emitting layer formation process (S4), the separation layer formation process (S6, the intermediate layer formation process), the red light-emitting layer formation process (S5), the electron transport layer formation process (S8), the electron injection layer formation process (S9), the cathode electrode formation process (S10), and the protection layer formation process (S11) are formed in that order, as illustrated in FIG. 35. Accordingly, the organic EL display device 1 having the above-described layered structure can be produced.

In the present embodiment, the reflective electrode 21a, the light-transmissive electrode 21b, the hole injection layer 31, the hole transport layer 32, the green fluorescent light-emitting layer 34G, the blue fluorescent light-emitting layer 34B, the separation layer 35, the red light-emitting layer 34R, the electron transport layer 36, the electron injection layer 37, the second electrode 23, and the protection layer 24 are layered on the TFT substrate 10, in that order from the TFT substrate 10 side, on the basis of the flowchart illustrated in FIG. 35.

Materials for the layers layered on the TFT substrate 10 and thicknesses thereof are as follows. However, the dimensions and materials denoted below are merely examples, and the present embodiment is not intended to be limited to these specific dimensions and materials. The following example, too, assumes that the thickness of the light-transmissive electrode 21b has been optically optimized through optical simulations to align the luminescent color of the subpixel 3G1 and the luminescent color of the subpixel 3G2.

Example 11

Reflective electrode 21a (first electrode 21; anode electrode): Ag (100 nm)

Light-transmissive electrode 21b (first electrode 21, anode electrode): ITO (subpixel 3B: 130 nm/subpixel 3G1: 155 nm/subpixel 3G2: 145 nm/subpixel 3R: 40 nm)

Hole injection layer 31: HAT-CN (10 nm)

Hole transport layer 32: TCTA (20 nm)

Green fluorescent light-emitting layer 34G: BCP (host material, 90%)/coumarin 6 (green fluorescent luminescent material, 10%) (10 nm)

Blue fluorescent light-emitting layer 34B: DPEPO (host material, 90%)/DMAC-DPS (blue fluorescent luminescent material, 10%) (20 nm)

Separation layer 35: CBP (20 nm)

Red light-emitting layer 34R: CBP (host material 90%)/Ir(piq)3 (red luminescent material, 10%) (10 nm)

Electron transport layer 36: DPEPO (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

According to the present embodiment, the same effects as in the tenth embodiment, for example, can be achieved by using the above-described layered structure.

Additionally, according to the present embodiment, color mixing in the subpixels 3 can of course be suppressed; furthermore, even in a case where the blue fluorescent light-emitting layer 34B has infiltrated into the subpixel 3G2, energy is transferred from the blue fluorescent luminescent material to the green fluorescent luminescent material, and thus blue color mixing will not arise in the subpixel 3G2.

Additionally, according to the present embodiment, the red light-emitting layer formation process (S5) is carried out after the blue fluorescent light-emitting layer formation process (S4), and thus even in a case where the red luminescent material has infiltrated into the subpixel 3B, the red light-emitting layer 34R that has infiltrated into the subpixel 3B is located further on the cathode electrode side than the blue fluorescent light-emitting layer 34B. Accordingly, when the material having the highest content percentage in the blue fluorescent light-emitting layer 34B is an electron transporting material, holes will not reach the red light-emitting layer 34R, and thus red color mixing will not arise in the subpixel 3B.

Furthermore, when the red light-emitting layer 34R has infiltrated into the subpixel 3G1, the red light-emitting layer 34R that has infiltrated into the subpixel 3G1 is located closer to the cathode electrode than the blue fluorescent light-emitting layer 34B, as with the subpixel 3B. Accordingly, in a case where the blue fluorescent light-emitting layer 34B is thick in the subpixel 3G1, holes will not flow on the side further toward the cathode electrode than the green fluorescent light-emitting layer 34G, and the thickness of the blue fluorescent light-emitting layer 34B will exceed the Förster radius. As a result, due to the distance, energy will not be transferred from the green fluorescent light-emitting layer 34G to the red light-emitting layer 34R through the blue fluorescent light-emitting layer 34B, and thus no red color mixing will arise.

Thus, according to the present embodiment, employing the above-described layered structure provides three patterns of cases where color mixing can be avoided structurally, in the same manner as the layered structure described in the twelfth embodiment. It is thus even more difficult for color mixing caused by deposited materials infiltrating into adjacent subpixels 3 to arise. There is thus a reduced risk of color mixing.

Additionally, the light-emitting layers 34, and particularly the blue fluorescent light-emitting layer 34B and the green fluorescent light-emitting layer 34G, contain electron transporting materials as the materials having the highest content percentage in those layers, as described in the tenth embodiment. As such, it is easy to reduce the voltages of the organic EL elements 20, which in turn names it possible to easily lower the voltage of the organic EL display device 1.

Fourteenth Embodiment

Yet another embodiment of the disclosure will be described below with reference primarily to FIGS. 3, 9B, 10, 12, 13B, 36, and 37. The present embodiment will describe differences from the first to thirteenth embodiments, and constituent elements having the same functions as the constituent elements described in the first to thirteenth embodiments will be assigned the same reference signs, with descriptions thereof omitted. It goes without saying that the same modifications as those of the first to thirteenth embodiments can be applied to the present embodiment as well.

Overall Configuration of Organic EL Display Device 1

Figure 36:
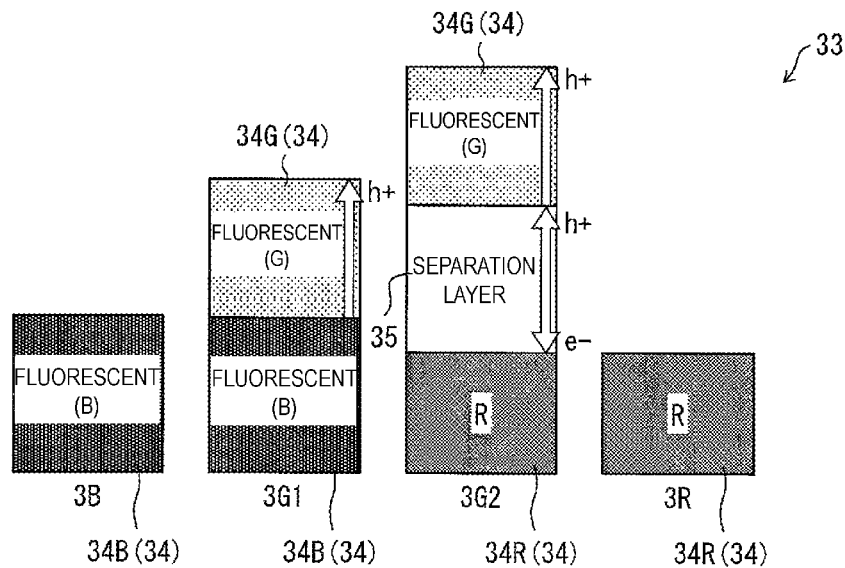
FIG. 36 is a diagram schematically illustrating a layered structure in a light-emitting layer unit of an organic EL display device according to a fourteenth embodiment of the disclosure.
Figure 37:
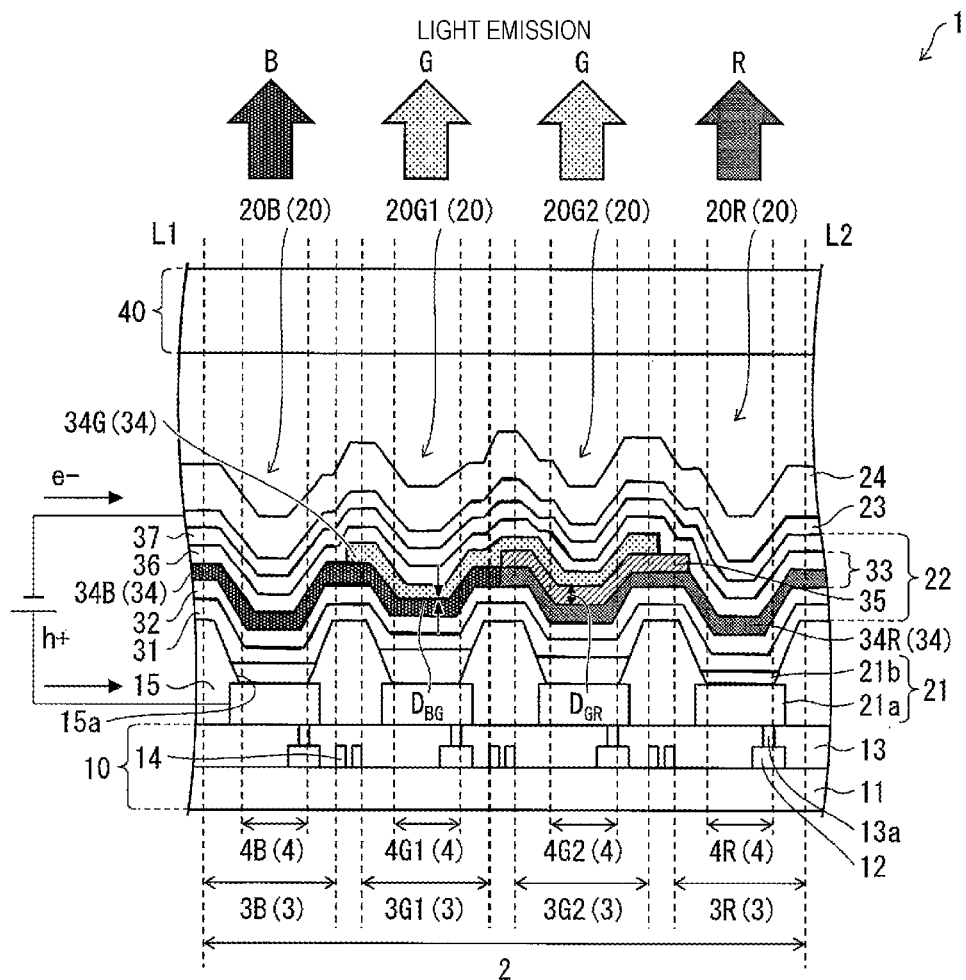
FIG. 37 is a cross-sectional view illustrating an example of the overall configuration of the organic EL display device according to the fourteenth embodiment of the disclosure.

FIG. 36 is a diagram schematically illustrating the layered structure of the light-emitting layer unit 33 of the organic EL display device 1 according to the present embodiment. FIG. 37 is a cross-sectional view illustrating an example of the overall configuration of the organic EL display device 1 according to the present embodiment. Note that FIG. 37 illustrates an example of the overall configuration of a single pixel area, corresponding to a cross-section taken along the line L1-L2 indicated in FIG. 3 or FIG. 12.

As illustrated in FIGS. 36 and 37, the organic EL display device 1 according to the present embodiment has the same configuration as the organic EL display device 1 described in the first embodiment or the third embodiment, for example, aside from the separation layer 35 being selectively formed on the subpixel 3G2 (i.e., the separation layer 35 being provided only between the red light-emitting layer 34R and the green fluorescent light-emitting layer 34G in the subpixel 3G2).

Manufacturing Method for Organic EL Display Device 1

The manufacturing method for the organic EL display device 1 according to the present embodiment is the same as the manufacturing method for the organic EL display device 1 described in the first embodiment and the third embodiment, aside from that after the red light-emitting layer 34R is linearly deposited using the vapor deposition mask 70R illustrated in FIG. 9B or FIG. 13B in the red light-emitting layer formation process (S5), the separation layer 35 is formed using a dedicated vapor deposition mask having openings corresponding only to the subpixel 3G2 in the separation layer formation process (S6).

However, layering the separation layer 35 only in the subpixel 3G2 in this manner as in the present embodiment changes the overall thickness of the function layers (organic layers) in the subpixel 3R from that in the first and third embodiments. As such, optical optimization is carried out, and the thickness of the light-transmissive electrode 21b in the subpixel 3R is changed from that in the first and third embodiments.

In the present embodiment, the reflective electrode 21a, the light-transmissive electrode 21b, the hole injection layer 31, the hole transport layer 32, the blue fluorescent light-emitting layer 34B, the red light-emitting layer 34R, the separation layer 35, the green fluorescent light-emitting layer 34G, the electron transport layer 36, the electron injection layer 37, the second electrode 23, and the protection layer 24 were layered, in that order from the TFT substrate 10 side, on the TFT substrate 10, on the basis of the flowchart illustrated in FIG. 10.

Materials for the layers layered on the TFT substrate 10 and thicknesses thereof are as follows. However, the dimensions and materials denoted below are merely examples, and the present embodiment is not intended to be limited to these specific dimensions and materials. As described above, the following example also assumes that the thickness of the light-transmissive electrode 21b has been optically optimized through optical simulations to align the luminescent color of the subpixel 3G1 and the luminescent color of the subpixel 3G2.

Example 12

Reflective electrode 21a (first electrode 21; anode electrode): Ag (100 nm)

Light-transmissive electrode 21b (first electrode 21, anode electrode): ITO (subpixel 3B: 135 nm/subpixel 3G1: 160 nm/subpixel 3G2: 145 nm/subpixel 3R: 60 nm)

Hole injection layer 31: HAT-CN (10 nm)

Hole transport layer 32: TCTA (20 nm)

Blue fluorescent light-emitting layer 34B: ADN (host material, 90%)/TBPe (blue fluorescent luminescent material, 10%) (10 nm)

Red light-emitting layer 34R: CBP (host material 90%)/Ir(piq)3 (red luminescent material, 10%) (10 nm)

Separation layer 35: CBP (20 nm) Green fluorescent light-emitting layer 34G: TPD (host material, 90%)/coumarin 6 (green fluorescent luminescent material, 10%) (10 nm)

Electron transport layer 36: BCP (30 nm)

Electron injection layer 37: LiF (1 nm)

Second electrode 23 (cathode electrode, semitransparent electrode): Ag—Mg alloy (Ag/Mg mixing ratio=0.9/0.1) (20 nm)

Protection layer 24: ITO (80 nm)

Advantageous Effects

The present embodiment has a disadvantage in that there is one additional instance of separate-pattern deposition than in the first embodiment. However, the optimal conditions for the carrier mobility of the material of the separation layer 35 can be changed, and organic EL elements 20 having good properties (and particularly, an organic EL element 20G2 having good properties) can be formed.

In particular, in the present embodiment, using a hole transporting material for the separation layer 35 makes it possible to further reduce the risk of red light emission in the subpixel 3G2.

Furthermore, because the separation layer 35 is not provided in the subpixel 3R, it is easy for carrier recombination to arise in the red light-emitting layer 34R, which makes it possible to increase the light emission efficiency.

Modified Example

The present embodiment describes, as an example, a case where the separation layer 35 is formed only in the subpixel 3G2 in the organic EL display devices 1 according to the first and third embodiments (i.e., the intermediate layer is formed only in the subpixel 3G2). However, it goes without saying that a configuration may also be employed in which the separation layer 35 is formed only in the subpixel 3G2 in the organic EL display devices 1 according to the second and fourth to thirteenth embodiments. Accordingly, in each embodiment, the above-described effects can be achieved along with the effects described in those individual embodiments.

Supplement

A display device (e.g., the organic EL display device 1) according Aspect 1 of the disclosure includes: a plurality of pixels (the pixels 2), each including a first subpixel (e.g., the subpixel 3B), a second subpixel (e.g., the subpixel 3G1), a third subpixel (e.g., the subpixel 3G2), and a fourth subpixel (e.g., the subpixel 3R), wherein a first light-emitting layer containing a first fluorescent luminescent material (e.g., the blue fluorescent light-emitting layer 34B) is provided in common for the first subpixel and the second subpixel; a second light-emitting layer containing a second fluorescent luminescent material (e.g., the green fluorescent light-emitting layer 34G) is provided in common for the second subpixel and the third subpixel; a third light-emitting layer containing a third luminescent material (e.g., the red light-emitting layer 34R) is provided in common for the third subpixel and the fourth subpixel; an energy level ($S_1$ level) of the second fluorescent luminescent material in a minimum excited singlet state is lower than an energy level of the first fluorescent luminescent material in a minimum excited singlet state and higher than an energy level of the third luminescent material in a minimum excited singlet state; in the second subpixel, a distance between opposing surfaces of the first light-emitting layer and the second light-emitting layer (e.g., the opposing surface distance $D_{BG}$) is less than or equal to a Förster radius; the third subpixel includes an intermediate layer (e.g., the separation layer 35, the blocking layer 38), the intermediate layer constituted by at least one function layer aside from the light-emitting layers (e.g., the separation layer 35, the blocking layer 38) and having a thickness exceeding the Förster radius, and in the third subpixel, the second light-emitting layer and the third light-emitting layer are layered with the intermediate layer interposed therebetween; in the first subpixel, the first fluorescent luminescent material emits light, and the light emitted from the first fluorescent luminescent material is emitted to the exterior; in the second subpixel and the third subpixel, the second fluorescent luminescent material emits light, and the light emitted from the second fluorescent luminescent material is emitted to the exterior; in the fourth subpixel, the third luminescent material emits light, and the light emitted from the third luminescent material is emitted to the exterior; the first fluorescent luminescent material emits light having a first peak wavelength; the second fluorescent luminescent material emits light having a second peak wavelength higher than the first peak wavelength; and the third luminescent material emits light having a third peak wavelength higher than the second peak wavelength.

As a display device according to Aspect 2 of the disclosure, in Aspect 1, the device may further include: an anode electrode (e.g., the first electrode 21) and a cathode electrode (e.g., the second electrode 23), wherein one of the anode electrode and the cathode electrode may include a reflective electrode (e.g., the reflective electrode 21a), and the other may be a light-transmissive electrode; in each pixel, a plurality of function layers including the first light-emitting layer, the second light-emitting layer, the third light-emitting layer, and the intermediate layer (e.g., the hole injection layer 31, the hole transport layer 32, the blue fluorescent light-emitting layer 34B, the green fluorescent light-emitting layer 34G, the red light-emitting layer 34R, the separation layer 35, the blocking layer 38, the electron transport layer 36, and the electron injection layer 37) may be provided between the anode electrode and the cathode electrode; in the first subpixel, the light emitted from the first fluorescent luminescent material may be emitted through the light-transmissive electrode to the exterior, directly or having been reflected in multiple between the reflective electrode and the light-transmissive electrode in the first subpixel; in the second subpixel, the light emitted from the second fluorescent luminescent material may be emitted through the light-transmissive electrode to the exterior, directly or having been reflected in multiple between the reflective electrode and the light-transmissive electrode in the second subpixel; in the third subpixel, the light emitted from the second fluorescent luminescent material may be emitted through the light-transmissive electrode to the exterior, directly or having been reflected in multiple between the reflective electrode and the light-transmissive electrode in the third subpixel; and in the fourth subpixel, the light emitted from the third luminescent material may be emitted through the light-transmissive electrode to the exterior, directly or having been reflected in multiple between the reflective electrode and the light-transmissive electrode in the fourth subpixel.

As a display device according to Aspect 3 of the disclosure, in Aspect 2, the light-emitting layers and the intermediate layer may, in each pixel, be layered in order of the first light-emitting layer and the third light-emitting layer, the intermediate layer, and the second light-emitting layer, from the anode electrode side; and a material having the highest content percentage in the second light-emitting layer may be a hole transporting material.

As a display device according to Aspect 4 of the disclosure, in Aspect 2, the light-emitting layers and the intermediate layer may, in each pixel, be layered in order of the third light-emitting layer, the intermediate layer, the second light-emitting layer, and the first light-emitting layer, from the anode electrode side; and a material having the highest content percentage in the second light-emitting layer may be a hole transporting material.

As a display device according to Aspect 5 of the disclosure, in Aspect 4, a material having the highest content percentage in the first light-emitting layer may be a hole transporting material.

As a display device according to Aspect 6 of the disclosure, in Aspect 2, the light-emitting layers and the intermediate layer may, in each pixel, be layered in order of the second light-emitting layer, the intermediate layer and the first light-emitting layer, and the third light-emitting layer, from the anode electrode side; and a material having the highest content percentage in the second light-emitting layer may be an electron transporting material.

As a display device according to Aspect 7 of the disclosure, in Aspect 2, the light-emitting layers and the intermediate layer may, in each pixel, be layered in order of the first light-emitting layer, the second light-emitting layer, the intermediate layer, and the third light-emitting layer, from the anode electrode side; and a material having the highest content percentage in the second light-emitting layer may be an electron transporting material.

As a display device according to Aspect 8 of the disclosure, in Aspect 7, a material having the highest content percentage in the first light-emitting layer may be an electron transporting material.

As a display device according to Aspect 9 of the disclosure, in Aspect 2, the light-emitting layers and the intermediate layer may, in each pixel, be layered in order of the third light-emitting layer and the first light-emitting layer, the intermediate layer, and the second light-emitting layer, from the anode electrode side; and a material having the highest content percentage in the second light-emitting layer may be a hole transporting material.

As a display device according to Aspect 10 of the disclosure, in Aspect 9, a material having the highest content percentage in the first light-emitting layer may be a hole transporting material.

As a display device according to Aspect 11 of the disclosure, in Aspect 2, the light-emitting layers and the intermediate layer may, in each pixel, be layered in order of the second light-emitting layer, the first light-emitting layer and the intermediate layer, and the third light-emitting layer, from the anode electrode side; and a material having the highest content percentage in the second light-emitting layer may be an electron transporting material.

As a display device according to Aspect 12 of the disclosure, in Aspect 11, a material having the highest content percentage in the first light-emitting layer may be an electron transporting material.

As a display device according to Aspect 13 of the disclosure, in any one of Aspects 9 to 12, the thickness of the first light-emitting layer may be at least 15 nm.

As a display device according to Aspect 14 of the disclosure, in any one of Aspects 1 to 13, the intermediate layer may include, as the function layer, a separation layer (the separation layer 35) having a thickness exceeding the Förster radius; and the separation layer may be provided in common for the third subpixel and the fourth subpixel.

As a display device according to Aspect 15 of the disclosure, in Aspect 14, the separation layer may contain a plurality of materials having different carrier transport properties.

As a display device according to Aspect 16 of the disclosure, in Aspect 14, the separation layer may be a layered body including a first separation layer (the first separation layer 35a) and a second separation layer (the second separation layer 35b); the first separation layer and the second separation layer may be bipolar transporting materials containing a hole transporting material and an electron transporting material at mutually-different combination ratios; and a total thickness of the first separation layer and the second separation layer may be greater than the Förster radius.

As a display device according to Aspect 17 of the disclosure, in any one of Aspects 1 to 13, the intermediate layer may include, as the function layer, a separation layer including a first separation layer provided in common for the third subpixel and the fourth subpixel and a second separation layer provided in common for the second subpixel and the third subpixel; and in the third subpixel, a total thickness of the first separation layer and the second separation layer may be greater than the Förster radius.

As a display device according to Aspect 18 of the disclosure, in any one of Aspects 1 to 13, the intermediate layer may include, as the function layer, a separation layer having a thickness exceeding the Förster radius; and the separation layer may be provided only in the third subpixel.

As a display device according to Aspect 19 of the disclosure, in any one of Aspects 1 to 13 and 18, the intermediate layer may be provided only in the third subpixel.

As a display device according to Aspect 20 of the disclosure, in any one of Aspects 1 to 18, the intermediate layer may include, as a function layer, a blocking layer (the blocking layer 38) having a thickness less than or equal to the Förster radius; and the blocking layer may be provided in common for at least the second subpixel and the third subpixel, and in the second subpixel, the first light-emitting layer and the second light-emitting layer may be layered with the blocking layer interposed therebetween.

As a display device according to Aspect 21 of the disclosure, in Aspect 20, the blocking layer may be provided in common for all of the subpixels.

As a display device according to Aspect 22 of the disclosure, in any one of Aspects 1 to 18, in the second subpixel, the first light-emitting layer and the second light-emitting layer may be layered with a blocking layer interposed therebetween, the blocking layer constituted by at least one function layer aside from the light-emitting layers and having a thickness less than or equal to the Förster radius; and the blocking layer may be provided in common for at least the first subpixel and the second subpixel.

As a display device according to Aspect 23 of the disclosure, in any one of Aspects 20 to 22, the thickness of the blocking layer may be less than or equal to 10 nm.

As a display device according to Aspect 24 of the disclosure, in any one of Aspects 1 to 23, part of a light emission spectrum of the first fluorescent luminescent material and part of an absorption spectrum of the second fluorescent luminescent material may overlap.

As a display device according to Aspect 25 of the disclosure, in any one of Aspects 1 to 24, there may be no overlapping between a light emission spectrum of the second fluorescent luminescent material, and an absorption spectrum of all materials included in the intermediate layer provided between the second light-emitting layer and the third light-emitting layer.

As a display device according to Aspect 26 of the disclosure, in any one of Aspects 1 to 25, the thickness of the intermediate layer provided between the second light-emitting layer and the third light-emitting layer may be at least 15 nm.

As a display device according to Aspect 27 of the disclosure, in any one of Aspects 1 to 26, the first fluorescent luminescent material may be a thermally activated delayed fluorescence material having an energy difference of less than or equal to 0.3 eV between a minimum excited singlet state and a minimum excited triplet state.

As a display device according to Aspect 28 of the disclosure, in any one of Aspects 1 to 27, the first subpixel may be a blue subpixel (the subpixel 3B); the second subpixel may be a first green subpixel (the subpixel 3G1); the third subpixel may be a second green subpixel (the subpixel 3G2); and the fourth subpixel may be a red subpixel (the subpixel 3R).

As a display device according to Aspect 29 of the disclosure, in Aspect 28, the display device may have a S-Stripe pixel arrangement, in which the blue subpixel is adjacent to the first green subpixel and the red subpixel is adjacent to the second green subpixel in a row direction, and the blue subpixel is adjacent to the red subpixel and the first green subpixel is adjacent to the second green subpixel in a column direction orthogonal to the row direction.

As a display device according to Aspect 30 of the disclosure, in Aspect 28, the display device may have a PenTile type pixel arrangement, in which first green subpixel is adjacent to the blue subpixel in a row direction and is adjacent to the red subpixel in the column direction orthogonal to the row direction, the second green subpixel is adjacent to the red subpixel in the row direction and is adjacent to the blue subpixel in the column direction, and the blue subpixel is adjacent to the red subpixel and the first green subpixel is adjacent to the second green subpixel in an oblique direction intersecting with the row direction and the column direction.

As a display device according to Aspect 31 of the disclosure, in any one of Aspects 1 to 30, the display device may be a top-emitting EL display device.

As a display device according to Aspect 32 of the disclosure, in any one of Aspects 1 to 30, the display device may be a bottom-emitting EL display device.

As a display device according to Aspect 33 of the disclosure, in any one of Aspects 1 to 32, the display device may be an organic EL display device.

A manufacturing method for a display device (e.g., the organic EL display device 1) according Aspect 34 of the disclosure is a manufacturing method for a display device, the display device including: a plurality of pixels (the pixels 2), each including a first subpixel (e.g., the subpixel 3B), a second subpixel (e.g., the subpixel 3G1), a third subpixel (e.g., the subpixel 3G2), and a fourth subpixel (e.g., the subpixel 3R), wherein in the first subpixel, a first fluorescent luminescent material emits light, and the light emitted from the first fluorescent luminescent material is emitted to the exterior; in the second subpixel and the third subpixel, a second fluorescent luminescent material emits light, and the light emitted from the second fluorescent luminescent material is emitted to the exterior; in the fourth subpixel, a third luminescent material emits light, and the light emitted from the third luminescent material is emitted to the exterior; the first fluorescent luminescent material emits light having a first peak wavelength; the second fluorescent luminescent material emits light having a second peak wavelength higher than the first peak wavelength; and the third luminescent material emits light having a third peak wavelength higher than the second peak wavelength, the method including: a function layer formation step of forming a plurality of function layers (e.g., the hole injection layer 31, the hole transport layer 32, the blue fluorescent light-emitting layer 34B, the green fluorescent light-emitting layer 34G, the red light-emitting layer 34R, the separation layer 35, the blocking layer 38, the electron transport layer 36, and the electron injection layer 37) in each of the pixels, wherein the function layer formation step includes: a first light-emitting layer formation step of forming a first light-emitting layer containing the first fluorescent luminescent material (e.g., the blue fluorescent light-emitting layer 34B) in common for the first subpixel and the second subpixel; a second light-emitting layer formation step of forming a second light-emitting layer containing the second fluorescent luminescent material (e.g., the green fluorescent light-emitting layer 34G) in common for the second subpixel and the third subpixel; a third light-emitting layer formation step of forming a third light-emitting layer containing the third luminescent material (e.g., the red light-emitting layer 34R) in common for the third subpixel and the fourth subpixel; and an intermediate layer formation step of forming an intermediate layer in the third subpixel, such that in the third subpixel, the second light-emitting layer and the third light-emitting layer are layered with the intermediate layer (e.g., the separation layer 35, the blocking layer 38), constituted by at least one function layer (e.g., the separation layer 35, the blocking layer 38) aside from the light-emitting layers and having a thickness exceeding the Förster radius, being interposed therebetween, and in the function layer formation step: the first light-emitting layer and the second light-emitting layer are formed such that in the second subpixel, a distance between opposing surfaces of the first light-emitting layer and the second light-emitting layer is less than or equal to the Förster radius; and a fluorescent luminescent material having an energy level in a minimum excited singlet state that is lower than an energy level of the first fluorescent luminescent material in a minimum excited singlet state and higher than an energy level of the third luminescent material in a minimum excited singlet state is used for the second fluorescent luminescent material.

As a manufacturing method for a display device according to Aspect 35 of the disclosure, Aspect 34 may further include: an anode electrode formation step of forming an anode electrode (e.g., the first electrode 21); and a cathode electrode formation step of forming a cathode electrode (e.g., the second electrode 23), wherein one of the anode electrode and the cathode electrode may include a reflective electrode (e.g., the reflective electrode 21a), and the other may be a light-transmissive electrode.

As a manufacturing method for a display device according to Aspect 36 of the disclosure, in Aspect 35, the function layer formation step may be carried out after the anode electrode formation step and before the cathode electrode formation step; in the function layer formation step, the first light-emitting layer formation step, the third light-emitting layer formation step, the intermediate layer formation step, and the second light-emitting layer formation step may be carried out in that order; and in the second light-emitting layer formation step, a material having the highest content percentage in the second light-emitting layer may be a hole transporting material.

As a manufacturing method for a display device according to Aspect 37 of the disclosure, in Aspect 35, the function layer formation step may be carried out after the anode electrode formation step and before the cathode electrode formation step; in the function layer formation step, the third light-emitting layer formation step, the intermediate layer formation step, the second light-emitting layer formation step, and the first light-emitting layer formation step may be carried out in that order; and in the second light-emitting layer formation step, a material having the highest content percentage in the second light-emitting layer may be a hole transporting material.

As a manufacturing method for a display device according to Aspect 38 of the disclosure, in Aspect 37, in the first light-emitting layer formation step, a material having the highest content percentage in the first light-emitting layer may be a hole transporting material.

As a manufacturing method for a display device according to Aspect 39 of the disclosure, in Aspect 35, the function layer formation step may be carried out after the anode electrode formation step and before the cathode electrode formation step; in the function layer formation step, the second light-emitting layer formation step, the intermediate layer formation step, the third light-emitting layer formation step, and the first light-emitting layer formation step may be carried out in that order; and in the second light-emitting layer formation step, a material having the highest content percentage in the second light-emitting layer may be an electron transporting material.

As a manufacturing method for a display device according to Aspect 40 of the disclosure, in Aspect 35, the function layer formation step may be carried out after the anode electrode formation step and before the cathode electrode formation step; in the function layer formation step, the first light-emitting layer formation step, the second light-emitting layer formation step, the intermediate layer formation step, and the third light-emitting layer formation step may be carried out in that order; and in the second light-emitting layer formation step, a material having the highest content percentage in the second light-emitting layer may be an electron transporting material.

As a manufacturing method for a display device according to Aspect 41 of the disclosure, in Aspect 40, in the first light-emitting layer formation step, a material having the highest content percentage in the first light-emitting layer may be an electron transporting material.

As a manufacturing method for a display device according to Aspect 42 of the disclosure, in Aspect 35, the function layer formation step may be carried out after the anode electrode formation step and before the cathode electrode formation step; in the function layer formation step, the third light-emitting layer formation step, the intermediate layer formation step, the first light-emitting layer formation step, and the second light-emitting layer formation step may be carried out in that order; and in the second light-emitting layer formation step, a material having the highest content percentage in the second light-emitting layer may be a hole transporting material.

As a manufacturing method for a display device according to Aspect 43 of the disclosure, in Aspect 42, in the first light-emitting layer formation step, a material having the highest content percentage in the first light-emitting layer may be a hole transporting material.

As a manufacturing method for a display device according to Aspect 44 of the disclosure, in Aspect 35, the function layer formation step may be carried out after the anode electrode formation step and before the cathode electrode formation step; in the function layer formation step, the second light-emitting layer formation step, the first light-emitting layer formation step, the intermediate layer formation step, and the third light-emitting layer formation step may be carried out in that order; and in the second light-emitting layer formation step, a material having the highest content percentage in the second light-emitting layer may be an electron transporting material.

As a manufacturing method for a display device according to Aspect 45 of the disclosure, in Aspect 44, in the first light-emitting layer formation step, a material having the highest content percentage in the first light-emitting layer may be an electron transporting material.

As a manufacturing method for a display device according to Aspect 46 of the disclosure, in any one of Aspects 42 to 45, in the first light-emitting layer formation step, the first light-emitting layer may be formed such that the thickness of the first light-emitting layer is at least 15 nm.

As a manufacturing method for a display device according to Aspect 47 of the disclosure, in any one of Aspects 34 to 46, the intermediate layer formation step may include a separation layer formation step of forming a separation layer (the separation layer 35) having a thickness exceeding the Förster radius as the function layer; and in the separation layer formation step, the separation layer may be formed in common for the third subpixel and the fourth subpixel.

As a manufacturing method for a display device according to Aspect 48 of the disclosure, in Aspect 47, in the separation layer formation step, the separation layer may be formed from a plurality of materials having different carrier transport properties.

As a manufacturing method for a display device according to Aspect 49 of the disclosure, in Aspect 47, the separation layer may be a layered body including a first separation layer (the first separation layer 35a) and a second separation layer (the second separation layer 35b); the separation layer formation step may include: a first separation layer formation step of forming the first separation layer; and a second separation layer formation step of forming the second separation layer, and in the first separation layer formation step and the second separation layer formation step, the first separation layer and the second separation layer may be formed using bipolar transporting materials containing a hole transporting material and an electron transporting material at mutually-different combination ratios, and a total thickness of the first separation layer and the second separation layer may be greater than the Förster radius.

As a manufacturing method for a display device according to Aspect 50 of the disclosure, in any one of Aspects 34 to 46, the intermediate layer formation step may include a separation layer formation step of forming a separation layer, including a first separation layer and a second separation layer, as the function layer; the separation layer formation step may include: a first separation layer formation step of forming the first separation layer in common for the third subpixel and the fourth subpixel; and a second separation layer formation step of forming the second separation layer in common for the second subpixel and the third subpixel, and in the first separation layer formation step and the second separation layer formation step, the first separation layer and the second separation layer may be formed such that the total thickness of the first separation layer and the separation layer is greater than the Förster radius.

As a manufacturing method for a display device according to Aspect 51 of the disclosure, in any one of Aspects 34 to 46, the intermediate layer formation step may include a separation layer formation step of forming a separation layer having a thickness exceeding the Förster radius as the function layer; and in the separation layer formation step, the separation layer may be formed selectively in the third subpixel.

As a manufacturing method for a display device according to Aspect 52 of the disclosure, in any one of Aspects 34 to 46, in the intermediate layer formation step, the intermediate layer may be formed selectively in the third subpixel.

As a manufacturing method for a display device according to Aspect 53 of the disclosure, in any one of Aspects 34 to 52, the intermediate layer formation step may include a blocking layer formation step of forming, as the function layer, a blocking layer (the blocking layer 38) having a thickness less than or equal to the Förster radius; and in the blocking layer formation step, the blocking layer may be formed in common for at least the second subpixel and the third subpixel, and in the second subpixel, the first light-emitting layer and the second light-emitting layer may be layered with the blocking layer interposed therebetween.

As a manufacturing method for a display device according to Aspect 54 of the disclosure, in Aspect 53, in the blocking layer formation step, the blocking layer may be formed in common for all of the subpixels.

As a manufacturing method for a display device according to Aspect 55 of the disclosure, in any one of Aspects 34 to 52, the function layer formation step may further include a blocking layer formation step of forming a blocking layer in the second subpixel so that in the second subpixel, the first light-emitting layer and the second light-emitting layer are layered with the blocking layer interposed therebetween, the blocking layer constituted by at least one function layer aside from the light-emitting layers and having a thickness less than or equal to the Förster radius; and in the blocking layer formation step, the blocking layer may be formed in common for at least the first subpixel and the second subpixel.

As a manufacturing method for a display device according to Aspect 56 of the disclosure, in any one of Aspects 34 to 55, in the first light-emitting layer formation step, a thermally activated delayed fluorescence material having an energy difference of less than or equal to 0.3 eV between a minimum excited singlet state and a minimum excited triplet state may be used for the first fluorescent luminescent material.

As a manufacturing method for a display device according to Aspect 57 of the disclosure, in any one of Aspects 34 to 56, the first subpixel may be a blue subpixel; the second subpixel may be a first green subpixel; the third subpixel may be a second green subpixel; the fourth subpixel may be a red subpixel; a fluorescent luminescent material that emits blue light may be used for the first fluorescent luminescent material; a fluorescent luminescent material that emits green light may be used for the second fluorescent luminescent material; and a luminescent material that emits red light may be used for the third luminescent material.

The disclosure is not limited to the embodiments described above, and various modifications can be made within a scope not departing from the scope of the claims. Embodiments obtained by appropriately combining the technical approaches described in each of the different embodiments also fall within the technical scope of the disclosure. Moreover, novel technical features may be formed by combining the technical approaches disclosed in each of the embodiments.

REFERENCE SIGNS LIST

1 Organic EL display device (display device)
2 Pixel
3, 3B, 3G1, 3G2, 3R Subpixel
4, 4B, 4G1, 4G2, 4R Light emitting region
10 TFT substrate
11 Insulating substrate
12 TFT
13 Interlayer insulating film
13a Contact hole
14 Wiring line
15 Bank
15a Opening
20, 20B, 20G1, 20G2, 20R Organic EL element
21 First electrode (anode electrode)
21a Reflective electrode
21b Light-transmissive electrode
22 Organic EL layer
23 Second electrode (cathode electrode)
24 Protection layer
31 Hole injection layer (function layer)
32 Hole transport layer (function layer)
33 Light-emitting layer unit
34 Light-emitting layer (function layer)
34B Blue fluorescent light-emitting layer (function layer)
34G Green fluorescent light-emitting layer (function layer)
34R Red light-emitting layer (function layer)
35 Separation layer (function layer)
35a First separation layer (function layer)
35b Second separation layer (function layer)
36 Electron transport layer (function layer)
37 Electron injection layer (function layer)
38 Blocking layer (function layer)
40 Sealing substrate
70B, 70R, 70G Vapor deposition mask
71B, 71R, 71G Opening
$D_{BG}$, $D_{GR}$ Opposing surface distance

The invention claimed is:
1. A display device comprising:
a plurality of pixels, each pixel including a first subpixel, a second subpixel, a third subpixel, and a fourth subpixel, wherein
a first light-emitting layer containing a first fluorescent luminescent material is provided in common for the first subpixel and the second subpixel, a second light-emitting layer containing a second fluorescent luminescent material is provided in common for the second subpixel and the third subpixel, and a third light-emitting layer containing a third luminescent material is provided in common for the third subpixel and the fourth subpixel;
an energy level of the second fluorescent luminescent material in a minimum excited singlet state is lower than an energy level of the first fluorescent luminescent material in a minimum excited singlet state and higher than an energy level of the third luminescent material in a minimum excited singlet state;
in the second subpixel, a distance between opposing surfaces of the first light-emitting layer and the second light-emitting layer is less than or equal to a Förster radius;
the third subpixel includes an intermediate layer, the intermediate layer constituted by at least one function layer aside from the light-emitting layers and having a thickness exceeding the Förster radius, and in the third subpixel, the second light-emitting layer and the third light-emitting layer are layered with the intermediate layer interposed therebetween;
in the first subpixel, the first fluorescent luminescent material emits light, and the light emitted from the first fluorescent luminescent material is emitted to the exterior;
in the second subpixel and the third subpixel, the second fluorescent luminescent material emits light, and the light emitted from the second fluorescent luminescent material is emitted to the exterior;
in the fourth subpixel, the third luminescent material emits light, and the light emitted from the third luminescent material is emitted to the exterior;
the first fluorescent luminescent material emits light having a first peak wavelength;

the second fluorescent luminescent material emits light having a second peak wavelength higher than the first peak wavelength; and the third luminescent material emits light having a third peak wavelength higher than the second peak wavelength.

2. The display device according to claim 1, further comprising:

an anode electrode and a cathode electrode, wherein one of the anode electrode and the cathode electrode includes a reflective electrode, and the other is a light-transmissive electrode;

in each pixel, a plurality of function layers including the first light-emitting layer, the second light-emitting layer, the third light-emitting layer, and the intermediate layer are provided between the anode electrode and the cathode electrode;

in the first subpixel, the light emitted from the first fluorescent luminescent material is emitted through the light-transmissive electrode to the exterior, directly or having been reflected in multiple between the reflective electrode and the light-transmissive electrode in the first subpixel;

in the second subpixel, the light emitted from the second fluorescent luminescent material is emitted through the light-transmissive electrode to the exterior, directly or having been reflected in multiple between the reflective electrode and the light-transmissive electrode in the second subpixel;

in the third subpixel, the light emitted from the second fluorescent luminescent material is emitted through the light-transmissive electrode to the exterior, directly or having been reflected in multiple between the reflective electrode and the light-transmissive electrode in the third subpixel; and in the fourth subpixel, the light emitted from the third luminescent material is emitted through the light-transmissive electrode to the exterior, directly or having been reflected in multiple between the reflective electrode and the light-transmissive electrode in the fourth subpixel.

3. The display device according to claim 1, wherein the intermediate layer includes, as the function layer, a separation layer having a thickness exceeding the Förster radius; and the separation layer is provided in common for the third subpixel and the fourth subpixel.

4. The display device according to claim 3, wherein the separation layer contains a plurality of materials having different carrier transport properties.

5. The display device according to claim 3, wherein the separation layer is a layered body including a first separation layer and a second separation layer;

the first separation layer and the second separation layer are bipolar transporting materials containing a hole transporting material and an electron transporting material at mutually-different combination ratios; and a total thickness of the first separation layer and the second separation layer is greater than the Förster radius.

6. The display device according to claim 1, wherein the intermediate layer includes, as the function layer, a separation layer including a first separation layer provided in common for the third subpixel and the fourth subpixel and a second separation layer provided in common for the second subpixel and the third subpixel; and a total thickness of the first separation layer and the second separation layer in the third subpixel is greater than the Förster radius.

7. The display device according to claim 1, wherein the intermediate layer includes, as the function layer, a separation layer having a thickness exceeding the Förster radius; and the separation layer is provided only in the third subpixel.

8. The display device according to claim 1, wherein the intermediate layer includes, as a function layer, a blocking layer having a thickness less than or equal to the Förster radius; and the blocking layer is provided in common for at least the second subpixel and the third subpixel, and in the second subpixel, the first light-emitting layer and the second light-emitting layer are layered with the blocking layer interposed therebetween.

9. The display device according to claim 1, wherein in the second subpixel, the first light-emitting layer and the second light-emitting layer are layered with a blocking layer interposed therebetween, the blocking layer constituted by at least one function layer aside from the light-emitting layers and having a thickness less than or equal to the Förster radius; and the blocking layer is provided in common for at least the first subpixel and the second subpixel.

10. The display device according to claim 1, wherein part of a light emission spectrum of the first fluorescent luminescent material and part of an absorption spectrum of the second fluorescent luminescent material overlap.

11. The display device according to claim 1, wherein there is no overlapping between a light emission spectrum of the second fluorescent luminescent material, and an absorption spectrum of all materials included in the intermediate layer provided between the second light-emitting layer and the third light-emitting layer.

12. The display device according to claim 1, wherein the first fluorescent luminescent material is a thermally activated delayed fluorescence material having an energy difference of less than or equal to 0.3 eV between a minimum excited singlet state and a minimum excited triplet state.

13. The display device according to claim 1, wherein the first subpixel is a blue subpixel, the second subpixel is a first green subpixel, the third subpixel is a second green subpixel, and the fourth subpixel is a red subpixel.

14. The display device according to claim 13, wherein the display device has a S-Stripe pixel arrangement, in which the blue subpixel is adjacent to the first green subpixel and the red subpixel is adjacent to the second green subpixel in a row direction, and the blue subpixel is adjacent to the red subpixel and the first green subpixel is adjacent to the second green subpixel in a column direction orthogonal to the row direction.

15. The display device according to claim 13, wherein the display device has a PenTile type pixel arrangement, in which first green subpixel is adjacent to the blue subpixel in a row direction and is adjacent to the red subpixel in the column direction orthogonal to the row direction, the second green subpixel is adjacent to the red subpixel in the row direction and is adjacent to the blue subpixel in the column direction, and the blue subpixel is adjacent to the red subpixel and the first green subpixel is adjacent to the second green subpixel in an oblique direction intersecting with the row direction and the column direction.

16. A manufacturing method for the display device according to claim 1, the method comprising:

a function layer formation step of forming a plurality of function layers in each of the pixels, wherein the function layer formation step includes:

a first light-emitting layer formation step of forming the first light-emitting layer containing the first fluorescent luminescent material in common for the first subpixel and the second subpixel;

a second light-emitting layer formation step of forming the second light-emitting layer containing the second fluorescent luminescent material in common for the second subpixel and the third subpixel;

a third light-emitting layer formation step of forming the third light-emitting layer containing the third luminescent material in common for the third subpixel and the fourth subpixel; and an intermediate layer formation step of forming the intermediate layer in the third subpixel, so that in the third subpixel, the second light-emitting layer and the third light-emitting layer are layered with the intermediate layer, constituted by at least one function layer aside from the light-emitting layers and having a thickness exceeding the Förster radius, being interposed therebetween.

17. The manufacturing method for a display device according to claim 16, the method further comprising:

an anode electrode formation step of forming an anode electrode; and a cathode electrode formation step of forming a cathode electrode, wherein one of the anode electrode and the cathode electrode includes a reflective electrode, and the other includes a light-transmissive electrode.

18. The manufacturing method for a display device according to claim 16, wherein the intermediate layer formation step includes a separation layer formation step of forming a separation layer having a thickness exceeding the Förster radius as the function layer; and in the separation layer formation step, the separation layer is formed in common for the third subpixel and the fourth subpixel.

19. The manufacturing method for a display device according to claim 16, wherein in the first light-emitting layer formation step, a thermally activated delayed fluorescence material having an energy difference of less than or equal to 0.3 eV between a minimum excited singlet state and a minimum excited triplet state is used for the first fluorescent luminescent material.

20. The manufacturing method for a display device according to claim 16, wherein the first subpixel is a blue subpixel, the second subpixel is a first green subpixel, the third subpixel is a second green subpixel, and the fourth subpixel is a red subpixel;

a fluorescent luminescent material that emits blue light is used for the first fluorescent luminescent material;

a fluorescent luminescent material that emits green light is used for the second fluorescent luminescent material; and a luminescent material that emits red light is used for the third luminescent material.

* * * * *